(12) United States Patent
Fukuzumi et al.

(10) Patent No.: US 11,678,482 B2
(45) Date of Patent: *Jun. 13, 2023

(54) MEMORY ARRAY STRUCTURES FOR CAPACITIVE SENSE NAND MEMORY

(71) Applicant: MICRON TECHNOLOGY, INC., Boise, ID (US)

(72) Inventors: Yoshiaki Fukuzumi, Yokohama (JP); Jun Fujiki, Tokyo (JP); Shuji Tanaka, Kanagawa (JP); Masashi Yoshida, Yokohama (JP); Masanobu Saito, Chiba (JP); Yoshihiko Kamata, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/557,389

(22) Filed: Dec. 21, 2021

(65) Prior Publication Data

US 2022/0181346 A1 Jun. 9, 2022

Related U.S. Application Data

(63) Continuation of application No. 17/111,746, filed on Dec. 4, 2020, now Pat. No. 11,227,869.

(51) Int. Cl.
*H01L 27/11556* (2017.01)
*G11C 5/02* (2006.01)
*G11C 5/06* (2006.01)
*G11C 16/34* (2006.01)
*H01L 27/11582* (2017.01)

(52) U.S. Cl.
CPC ........ *H01L 27/11556* (2013.01); *G11C 5/025* (2013.01); *G11C 5/06* (2013.01); *G11C 16/3427* (2013.01); *H01L 27/11582* (2013.01)

(58) Field of Classification Search
CPC ......... H01L 27/11556; H01L 27/11582; G11C 16/3427; G11C 5/025; G11C 5/06
See application file for complete search history.

(56) References Cited

U.S. PATENT DOCUMENTS

| | | | |
|---|---|---|---|
| 7,450,422 | B2 | 11/2008 | Roohparvar |
| 7,489,546 | B2 | 2/2009 | Roohparvar |
| 9,025,382 | B2 | 5/2015 | Rhie |
| 9,355,727 | B1 | 5/2016 | Zhang et al. |
| 9,378,832 | B1 | 6/2016 | Lu et al. |
| 9,564,213 | B2 | 2/2017 | Sun et al. |
| 9,576,971 | B2 | 2/2017 | Zhang et al. |

(Continued)

*Primary Examiner* — Tri M Hoang

(74) *Attorney, Agent, or Firm* — Dicke, Billig & Czaja, PLLC

(57) ABSTRACT

Arrays of memory cells might include a first upper data line, a second upper data line, a lower data line, a first pass gate selectively connected to the lower data line, a second pass gate connected to the first pass gate and selectively connected to the lower data line, a third pass gate selectively connected to the lower data line, a fourth pass gate connected to the third pass gate and selectively connected to the lower data line, unit column structures selectively connected to a respective one of the upper data lines and capacitively coupled to a first channel of a respective one of the pass gates, and control lines capacitively coupled to a second channel of a respective one of the pass gates.

20 Claims, 44 Drawing Sheets

(56) References Cited

U.S. PATENT DOCUMENTS

| | | |
|---|---|---|
| 10,665,313 B1 | 5/2020 | Lu et al. |
| 10,762,973 B1 * | 9/2020 | Lu et al. |
| 11,227,869 B1 * | 1/2022 | Fukuzumi ......... H01L 27/11582 |
| 2006/0146608 A1 | 7/2006 | Fasoli et al. |
| 2012/0069653 A1 | 3/2012 | Morikado |
| 2012/0072648 A1 | 3/2012 | Shiino et al. |
| 2019/0229126 A1 | 7/2019 | Zhu et al. |
| 2020/0161332 A1 | 5/2020 | Greenlee et al. |
| 2020/0168624 A1 | 5/2020 | Howder et al. |
| 2022/0181346 A1 * | 6/2022 | Fukuzumi ......... H01L 27/11582 |

\* cited by examiner

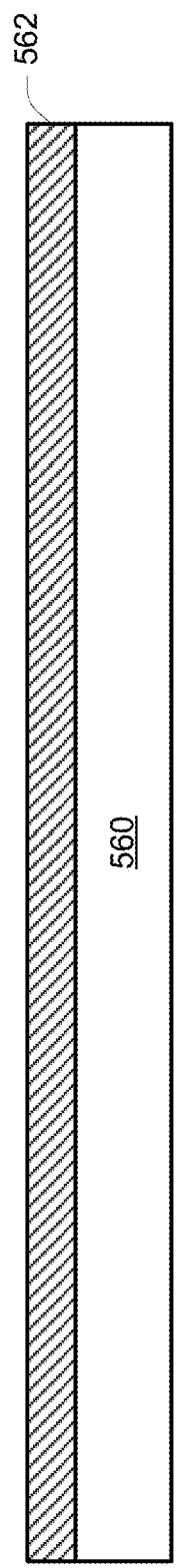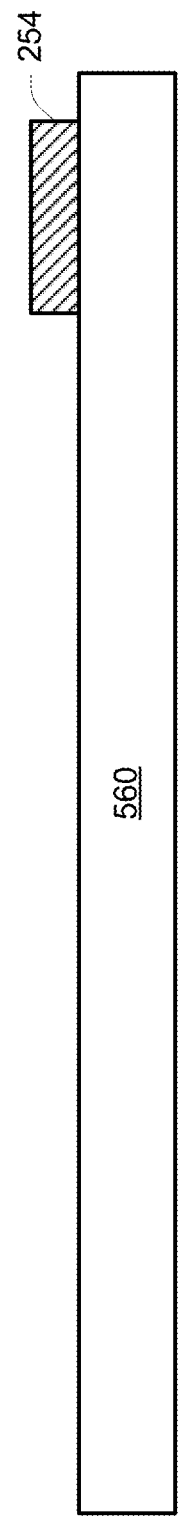

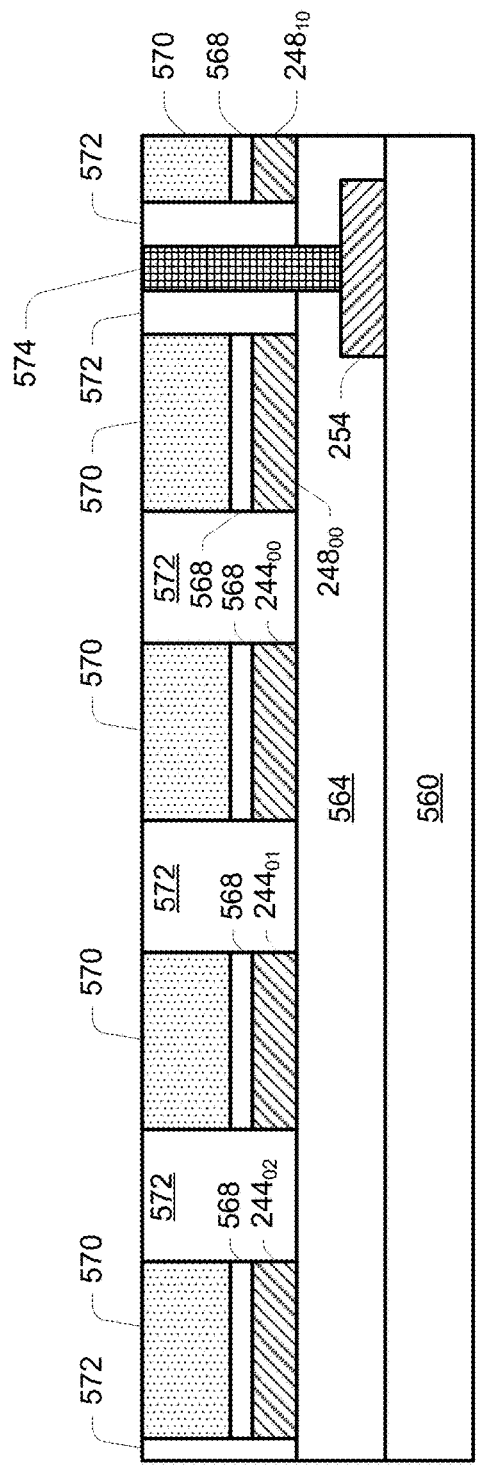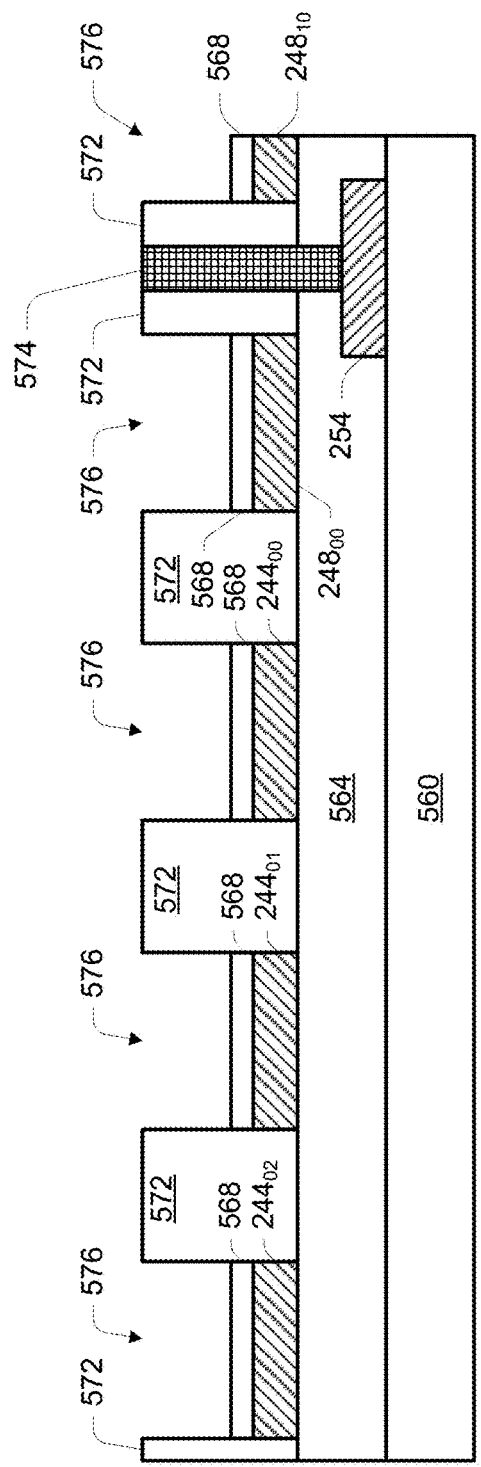

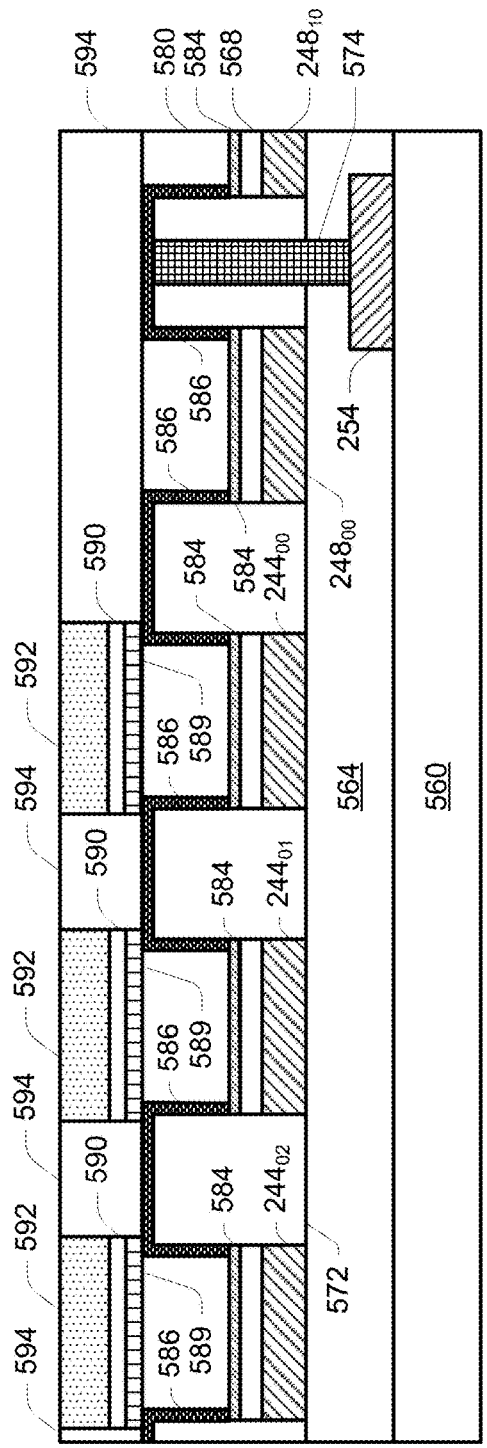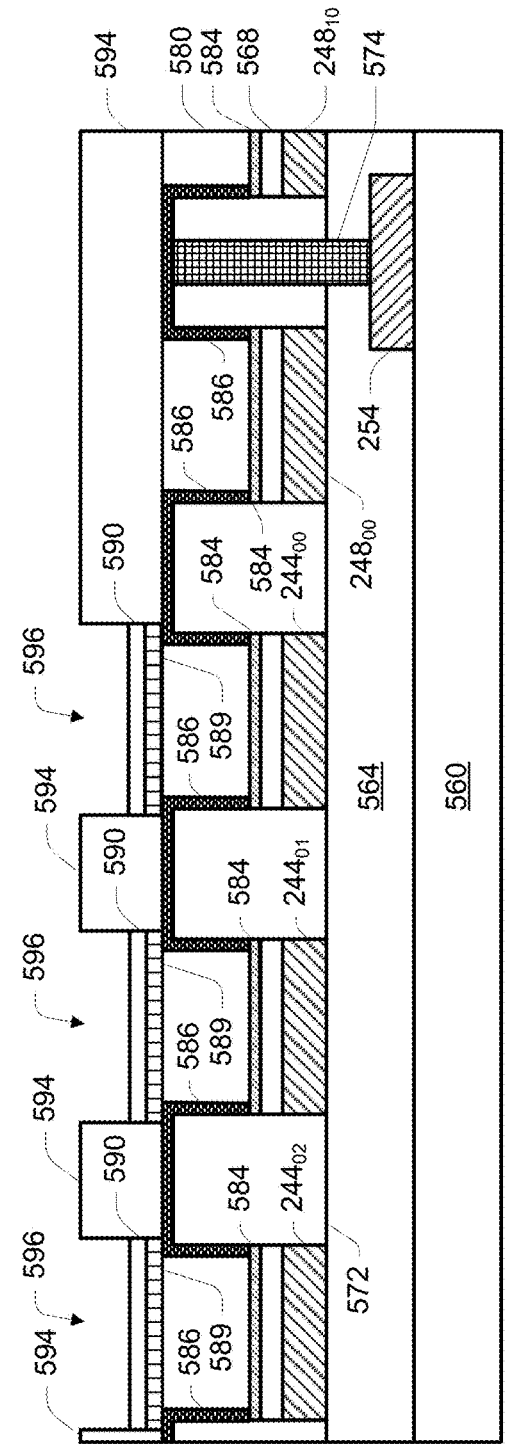
FIG. 5K
FIG. 5L

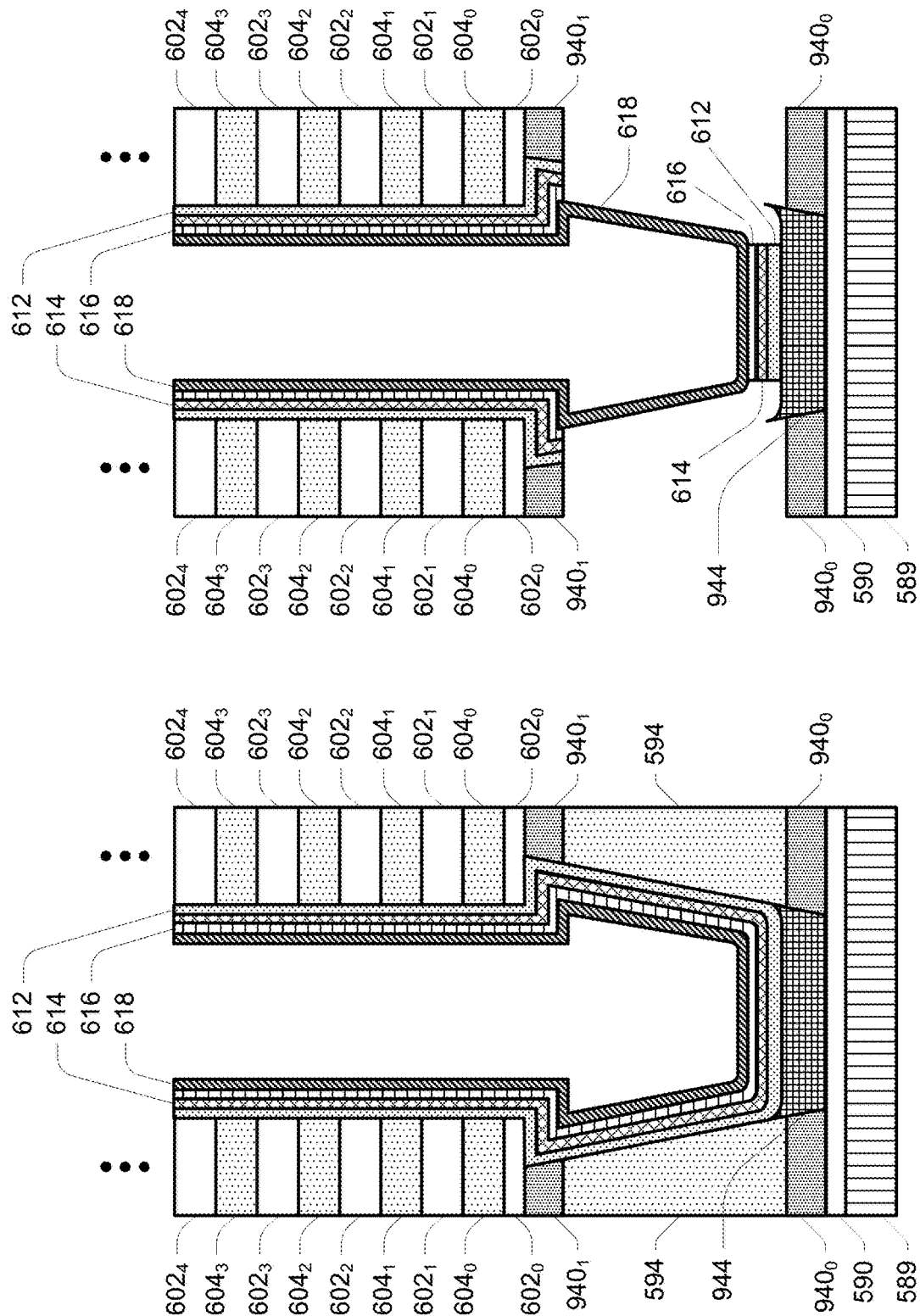

MEMORY ARRAY STRUCTURES FOR CAPACITIVE SENSE NAND MEMORY

RELATED APPLICATIONS

This application is a Continuation of U.S. patent application Ser. No. 17/111,746, titled "Memory Array Structures for Capacitive Sense NAND Memory," filed Dec. 4, 2020, issued as U.S. Pat. No. 11,227,869 on Jan. 18, 2022, which is related to U.S. patent application Ser. No. 17/111,729, titled "Capacitive Sense NAND Memory" and filed Dec. 4, 2020, U.S. patent application Ser. No. 17/111,751, titled "Sense Line Structures in Capacitive Sense NAND Memory" and filed Dec. 4, 2020, and U.S. patent application Ser. No. 17/111,770, titled "Access Operations in Capacitive Sense NAND Memory" and filed Dec. 4, 2020, each such application being commonly assigned and incorporated by reference in its entirety, and each such application sharing common disclosure.

TECHNICAL FIELD

The present disclosure relates generally to integrated circuits, and, in particular, in one or more embodiments, the present disclosure relates to apparatus including strings of series-connected memory cells, and to methods of their formation and operation.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

The desire for higher levels of memory storage density has led to longer strings of series-connected memory cells in NAND memory. However, common industrial techniques may present challenges in the successful fabrication of such strings of series-connected memory cells, e.g., placing a practical limit on the number of memory cells contained therein.

BRIEF DESCRIPTION OF THE DRAWINGS

FIGS. 9A-9E depict an integrated circuit structure during various stages of fabrication in accordance with another embodiment.

DETAILED DESCRIPTION

Figure 1:
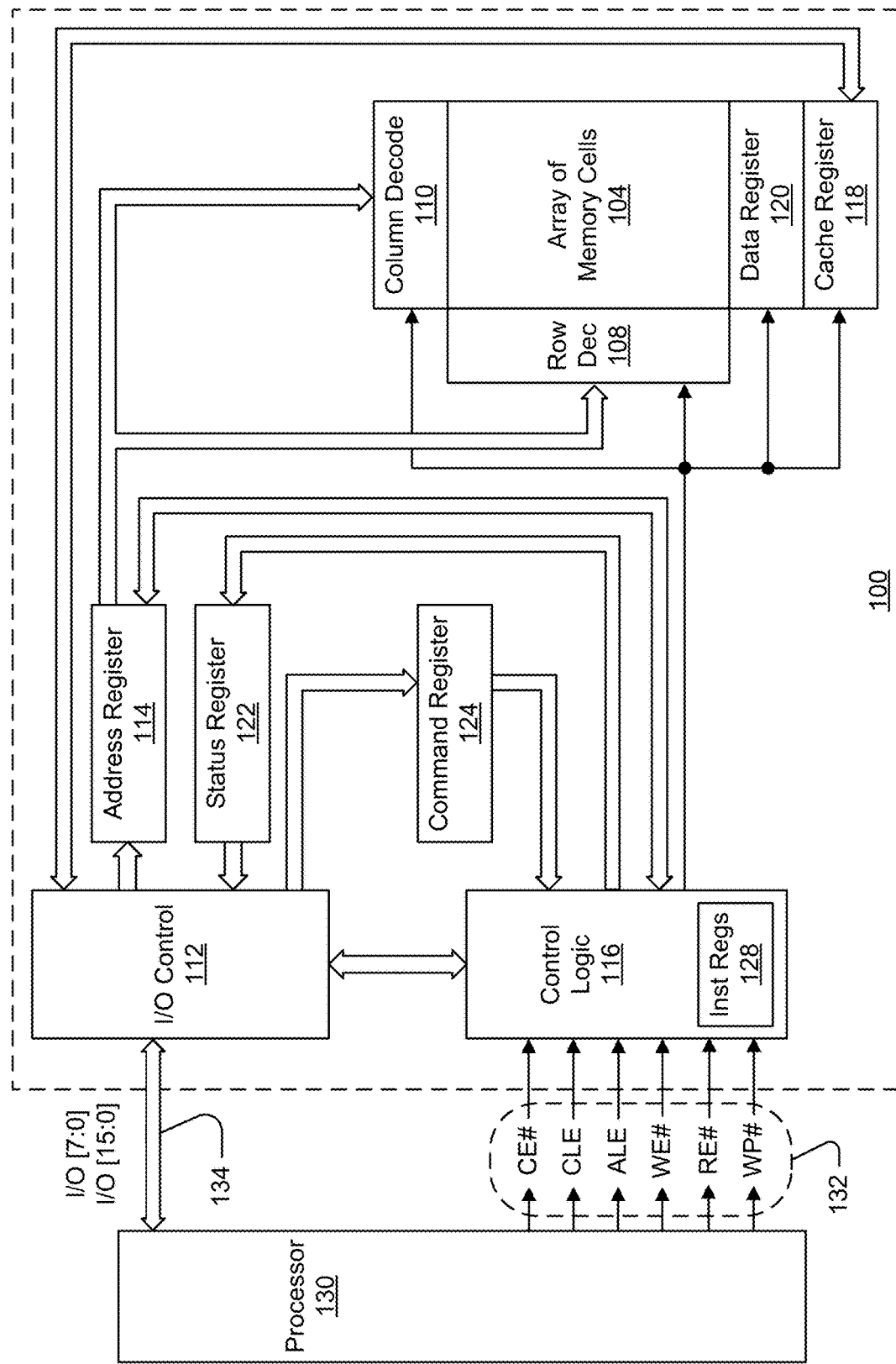
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states. The array of memory cells 104 includes an array structure in accordance with one or more embodiments described herein.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 is depicted to receive control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1. Additionally, while specific I/O pins are described in accordance with popular conventions for receipt and output of the various signals, it is noted that other combinations or numbers of I/O pins (or other I/O node structures) might be used in the various embodiments.

Figure 2A:
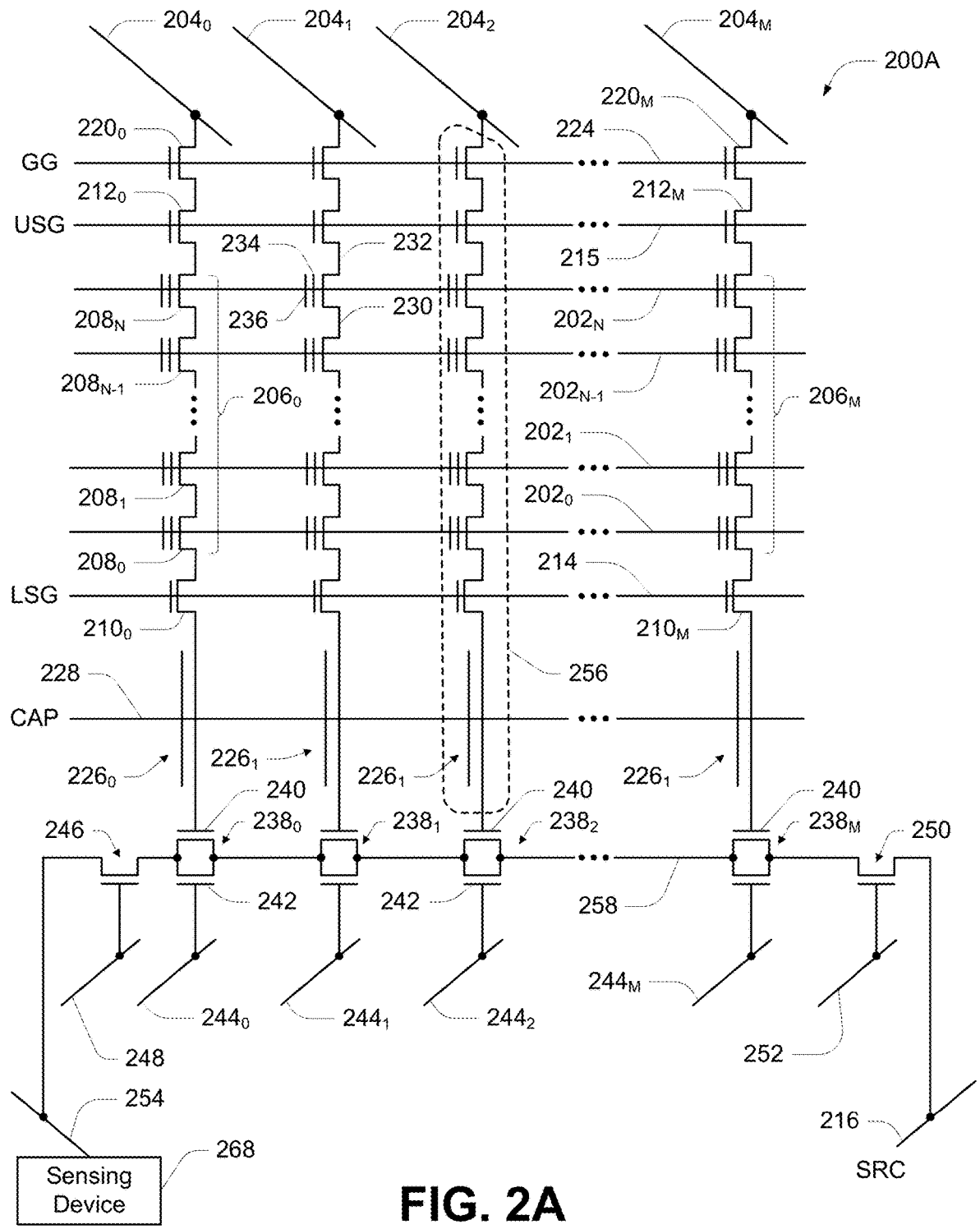
FIGS. 2A-2B are schematics of portions of an array of memory cells as could be used in a memory of the type described with reference to FIG. 1, according to embodiments.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as first, or upper, data lines (e.g., upper bit lines) $204_0$ to $204_M$ and second, or lower, data line (e.g., lower bit line) 254. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well. In addition, the memory array 200A might be formed over other circuitry, e.g., peripheral circuitry under the memory array 200A and used for controlling access to the memory cells of the memory array 200A. It is noted that directional descriptors used herein, e.g., lower, upper, over, under, etc., are relative and do not require any particular orientation in physical space.

Memory array 200A might be arranged in rows (each corresponding to a word line 202 and a lower data line 254) and columns (each corresponding to a upper data line 204). Each column might include a string of series-connected memory cells (e.g., non-volatile memory cells), such as one of NAND strings $206_0$ to $206_M$. The memory cells 208 might represent non-volatile memory cells for storage of data. The memory cells 208 of each NAND string 206 might be connected in series between a select gate 210 (e.g., a field-effect transistor), such as one of the select gates $210_0$ to $210_M$ (e.g., lower select gates), and a select gate 212 (e.g., a field-effect transistor), such as one of the select gates $212_0$ to $212_M$ (e.g., upper select gates). Lower select gates $210_0$ to $210_M$ might be commonly connected to a select line 214, such as a lower select line LSG, and upper select gates $212_0$ to $212_M$ might be commonly connected to a select line 215, such as an upper select line USG. Although depicted as traditional field-effect transistors, the lower select gates 210 and upper select gates 212 might utilize a structure similar to (e.g., the same as) the memory cells 208. The lower select gates 210 and upper select gates 212 might each represent a plurality of select gates connected in series, with each select gate in series configured to receive a same or independent control signal.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

The lower select gates 210 of each NAND string 206 might be connected in series between its memory cells 208 and a respective capacitance 226, e.g., one of capacitances $226_0$ to $226_M$. Each lower select gate 210 might be connected (e.g., directly connected) to its respective capacitance 226. Each lower select gate 210 might further be connected (e.g., directly connected) to the memory cell $208_0$ of its corresponding NAND string 206. For example, the lower select gate $210_0$ might be connected to the capacitance $226_0$, and the lower select gate $210_0$ might be connected to memory cell $208_0$ of the corresponding NAND string $206_0$. Therefore, each lower select gate 210 might be configured to selectively connect a corresponding NAND string 206 to a respective capacitance 226. A control gate of each lower select gate 210 might be connected to select line 214.

The upper select gates 212 of each NAND string 206 might be connected in series between its memory cells 208 and a GIDL (gate-induced drain leakage) generator gate 220 (e.g., a field-effect transistor), such as one of the GIDL generator (GG) gates $220_0$ to $220_M$. The GG gates $220_0$ to $220_M$ might be connected (e.g., directly connected) to their respective upper data lines $204_0$ to $204_M$, and selectively connected to their respective NAND strings $206_0$ to $206_M$, e.g., through respective upper select gates $212_0$ to $212_M$.

GG gates $220_0$ to $220_M$ might be commonly connected to a control line 224, such as a GG control line. Although depicted as traditional field-effect transistors, the GG gates 220 may utilize a structure similar to (e.g., the same as) the memory cells 208. The GG gates 220 might represent a plurality of GG gates connected in series, with each GG gate in series configured to receive a same or independent control signal. In general, the GG gates 220 may have threshold voltages different than (e.g., lower than) the threshold voltages of the upper select gates 212. Threshold voltages of the GG gates 220 may be of an opposite polarity than, and/or may be lower than, threshold voltages of the upper select gates 212. For example, the upper select gates 212 might have positive threshold voltages (e.g., 2V to 4V), while the GG gates 220 might have negative threshold voltages (e.g., −1V to −4V). The GG gates 220 might be provided to assist in the generation of GIDL current into a channel region of their corresponding NAND string 206 during a read operation or an erase operation, for example.

Each GG gate 220 might be connected (e.g., directly connected) to the upper data line 204 for the corresponding NAND string 206. For example, the GG gate $220_0$ might be connected to the upper data line $204_0$ for its corresponding NAND string $206_0$. Each GG gate 220 might be connected (e.g., directly connected) to the upper select gate 212 of its corresponding NAND string 206. For example, GG gate $220_0$ might be connected to the upper select gate $212_0$ of the corresponding NAND string $206_0$. Each upper select gate 212 might further be connected (e.g., directly connected) to the memory cell $208_N$ of its corresponding NAND string 206. For example, the upper select gate $212_0$ might be connected to memory cell $208_N$ of the corresponding NAND string $206_0$. Therefore, in cooperation, each upper select gate 212 and GG gate 220 for a corresponding NAND string 206 might be configured to selectively connect that NAND string 206 to the corresponding upper data line 204. A control gate of each GG gate 220 might be connected to control line 224. A control gate of each upper select gate 212 might be connected to select line 215.

One electrode of each capacitance 226 might be connected to control line 228, e.g., control line CAP. A different electrode of each capacitance 226 might be capacitively coupled to a respective pass gate 238, e.g., pass gates $238_0$ to $238_M$. For example, the capacitance $226_0$ might be capacitively coupled to, or electrically connected to, a first control gate 240 of the pass gate $238_0$, and thus capacitively coupled to a channel of the pass gate $238_0$. A second control gate 242 of each pass gate 238 might be connected (e.g., directly connected) to a respective backside gate line 244, e.g., backside gate lines $244_0$ to $244_M$. For example, the second control gate 242 of pass gate $238_0$ might be connected to the backside gate line $244_0$. The pass gates 238 might be connected in series between the a source 216 (e.g., common source SRC) as one voltage node, and the lower data line 254 as another voltage node, and their resulting current path might be referred to as a sense line 258. One pass gate 238, e.g., pass gate $238_0$, might be selectively connected to the lower data line 254 through a first sense select gate (e.g., field-effect transistor) 246. A control gate of the first sense select gate 246 might be connected to a first sense select line 248. Another pass gate 238, e.g., pass gate $238_M$, might be selectively connected to the common source 216 through a second sense select gate (e.g., field-effect transistor) 250. A control gate of the second sense select gate 250 might be connected to a second sense select line 252.

Pass gates 238 might be deemed to be two field-effect transistors connected in parallel that are responsive to two control gates, e.g., the first control gate 240 and the second control gate 242. The two field-effect transistors of a pass gate 238 might have discrete channels, e.g., one channel capacitively coupled to the first control gate 240 and another channel capacitively coupled to the second control gate 242. Alternatively, a first channel of a pass gate 238 capacitively coupled to the first control gate 240 and a second channel of the pass gate 238 capacitively coupled to the second control gate 242 might be a same channel of that pass gate 238.

A sensing device 268 might be connected to the lower data line 254 for use in sensing a data state of a memory cell 208, e.g., by sensing a state of the lower data line 254. For example, the sensing device 268 might be used to detect whether the lower data line 254 is experiencing current flow, or experiencing a change in voltage level, to determine whether a unit column structure 256 containing a memory cell 208 selected for sensing stores a sufficient level of electrical charge to activate the first control gate 240 of its corresponding pass gate 238 while the second control gate 242 of that pass gate 238 is deactivated. During such sensing, the remaining pass gates in the sense line 258 might have their second control gates 242 activated. In this manner, electrically connecting the lower data line to the common source 216 through the sense line 258 could indicate that the selected memory cell has one data state, while electrically isolating the lower data line from the common source 216 could indicate that the selected memory cell has a different data state.

Although each capacitance 226 is depicted as a single capacitance for each NAND string 206, each capacitance 226 might represent a number of field-effect transistors connected in series, and each such transistor might utilize a structure similar to (e.g., the same as) the memory cells 208. An example of this configuration is depicted in further detail in FIG. 2B. Collectively, for a given NAND string 206, a unit column structure 256 refers to the elements between its memory cells 208 and an upper data line 204, its memory cells 208, and the elements between its memory cells 208 and a pass gate 238, that are connected (e.g., selectively connected) to one another. For example, with reference to FIG. 2A, a unit column structure 256 for a given NAND string 206 might include its GG gate 220, upper select gate 212, memory cells 208, lower select gate 210 and capacitance 226, connected in series between an upper data line 204 and a pass gate 238.

The memory array in FIG. 2A might be a quasi-two-dimensional memory array and might have a generally planar structure, e.g., where the common source 216, NAND strings 206 and upper data lines 204 extend in substantially parallel planes. Alternatively, the memory array in FIG. 2A might be a three-dimensional memory array, e.g., where upper data lines 204 are selectively connected to more than one NAND string 206 and where backside gate lines 244 are connected to more than one pass gate 238.

A column of the memory cells 208 might be a NAND string 206 or a plurality of NAND strings 206 selectively connected to a given upper data line 204. A row of the memory cells 208 might be memory cells 208 commonly connected to a given word line 202. A row of memory cells 208 can, but need not, include all memory cells 208 commonly connected to a given word line 202.

The memory cells 208 might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Memory might achieve higher levels of storage capacity by including multi-level cells (MLC), triple-level cells (TLC), quad-level cells (QLC), etc., or combinations thereof in which the memory cell might have multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on. While a number of binary digits of data stored in a memory cell is typically an integer value to represent a binary number of data states per memory cell, a memory cell may be operated to store non-integer digits of data. For example, where the memory cell is operated using three Vt ranges, each memory cell might store 1.5 digits of data, with two memory cells collectively capable of representing one of eight data states.

The memory cells 208 of a given NAND string 206 might be configured to store data at a variety of storage densities. For example, a NAND string 206 might contain some memory cells (e.g., dummy memory cells) 208 configured to store data at a first storage density, e.g., 0 bits per memory cell. Dummy memory cells 208 are typically incorporated into a NAND string 206 for operational advantages, are generally inaccessible to a user of the memory, and are generally not intended to store user data. For example, memory cells 208 formed in certain locations of a NAND string 206 might have different operating characteristics than memory cells formed in other locations. By operating these memory cells as dummy memory cells, such differences in operating characteristics might generally be mitigated. In addition, dummy memory cells can be used to buffer select gates from high voltage levels that might be applied to principal memory cells (e.g., those memory cells intended to store user data) during certain operations. A NAND string 206 might further contain other memory cells 208 configured to store data at one or more additional (e.g., higher) storage densities.

Figure 2B:
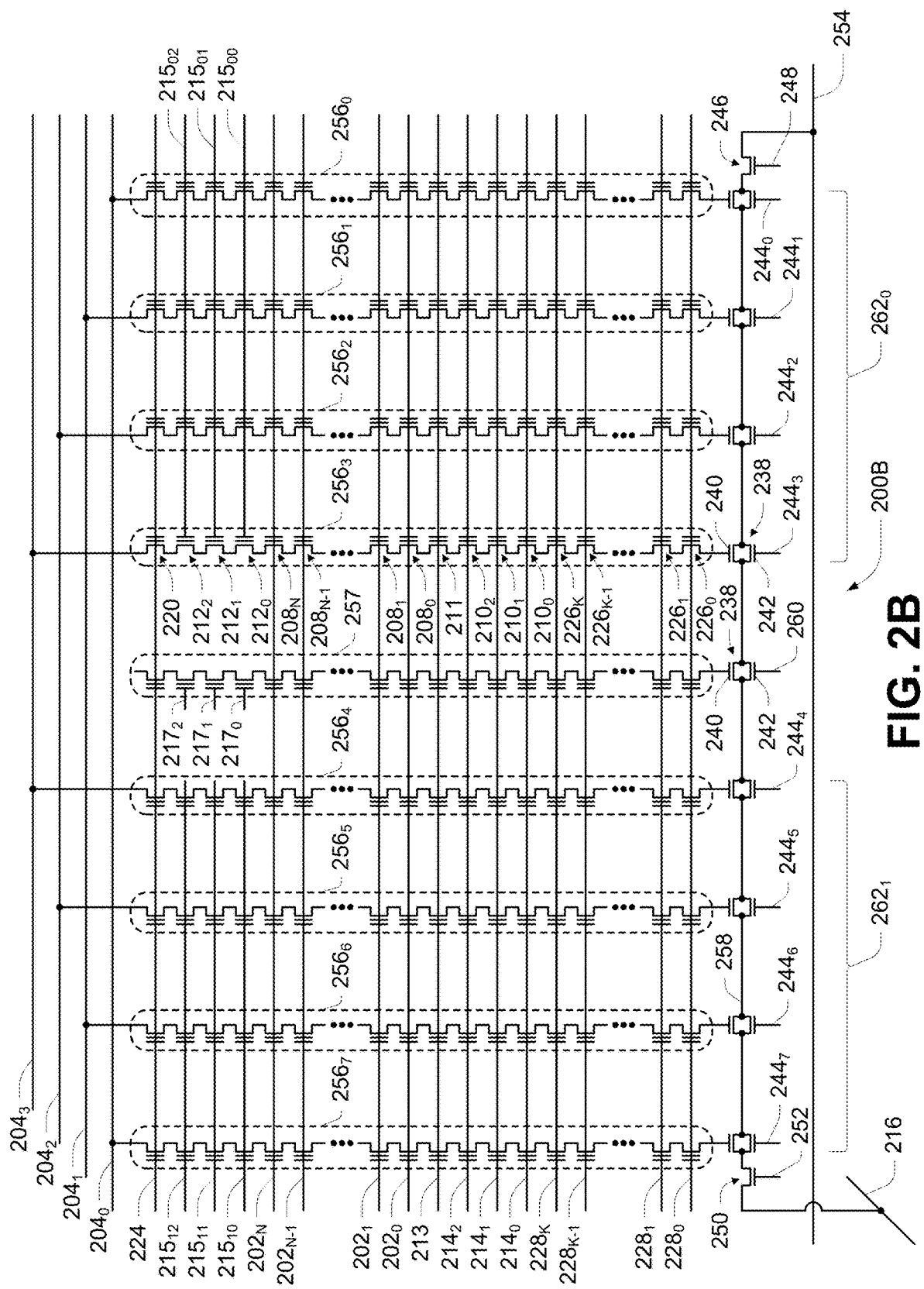

FIG. 2B is another schematic of a portion of an array of memory cells 200B as could be used in a memory of the type described with reference to FIG. 1, e.g., as a portion of array of memory cells 104, according to another embodiment. Like numbered elements in FIG. 2B correspond to the description as provided with respect to FIG. 2A. For clarity, certain elements are not numbered, although their identity would be apparent with reference to depictions in FIG. 2A. FIG. 2B provides additional detail of one example of the structure of the capacitances 226 as well as the incorporation of a dummy unit column structure 257 in addition to unit column structures, e.g., principal unit column structures, 256.

The unit column structures $256_0$ to $256_7$, along with the dummy unit column structure 257, might be part of a block of memory cells sharing the same word lines 202. The unit column structures $256_0$ to $256_3$ might be part of a first sub-block of memory cells $262_0$ of the block of memory cells corresponding to backside gate lines $244_0$ to $244_3$. The unit column structures $256_4$ to $256_7$ might be part of a second sub-block of memory cells $262_1$ of the block of memory cells corresponding to backside gate lines $244_4$ to $244_7$. The dummy unit column structure 257 might have the same association to a pass gate 238 as the unit column structures $256_0$ to $256_7$, and might have a second control gate 242 of its associated pass gate 238 connected to a dummy backside gate line 260. Where the dummy unit column structure 257 lack a connection to an upper data line 204, the first control gate 240 of its associated pass gate 238 might be electrically floating, e.g., permanently electrically floating.

The unit column structures $256_0$ to $256_7$ and the dummy unit column structure 257 might each include memory cells $208_0$ to $208_N$ connected to (e.g., having control gates connected to) the access lines $202_0$ to $202_N$, respectively. The unit column structures $256_0$ to $256_7$ and the dummy unit column structure 257 might each include select gates (e.g., lower select gates) $210_0$ to $210_2$, which might have the same structure as the memory cells 208. The select gates $210_0$ to $210_2$ might be connected to (e.g., have control gates connected to) the select lines $214_0$ to $214_2$, respectively.

The unit column structures $256_0$ to $256_7$ and the dummy unit column structure 257 might each include an optional compensation gate 211 between the select gates 210 and the memory cells 208, and might have the same structure as the memory cells 208. The compensation gate 211 might be connected to (e.g., have its control gate connected to) the control line 213.

The unit column structures $256_0$ to $256_7$ and the dummy unit column structure 257 might each include capacitances $226_0$ to $226_K$, which might have the same structure as the memory cells 208. The capacitances $226_0$ to $226_K$ might be connected to (e.g., have control gates connected to) the control lines $228_0$ to $228_K$, respectively. The control gate of the field-effect transistor forming a capacitance 226 of FIG. 2B might correspond to a first electrode of that capacitance 226, and the channel, e.g., body, of the field-effect transistor forming that capacitance 226 might correspond to a second electrode of that capacitance 226. In functioning as a capacitance (e.g., a common capacitance), the field-effect transistors of the capacitances 226 might be operated to apply a same voltage level to each control line $228_0$ to $228_K$ of each unit column structure $256_0$ to $256_7$, which might be 2-3V, for example.

The unit column structures $256_0$ to $256_7$ and the dummy unit column structure 257 might each include a GIDL generator gate 220, which might have the same structure as the memory cells 208. The GIDL generator gates 220 might be connected to (e.g., have control gates connected to) the control line 224. The GIDL generator gates 220 of the unit column structures $256_0$ to $256_3$ might be connected to (e.g., have source/drain regions connected to) the upper data lines $204_0$ to $204_3$, respectively. The GIDL generator gates 220 of the unit column structures $256_4$ to $256_7$ might be connected to (e.g., have source/drain regions connected to) the upper data lines $204_3$ to $204_0$, respectively. Although depicted and described, the GIDL generator gates 220 might be eliminated. Because the dummy unit column structure 257 is not intended to store data, it may have no connection to an upper data line 204, although connection is not prohibited.

The unit column structures $256_0$ to $256_7$ and the dummy unit column structure 257 might each include select gates (e.g., upper select gates) $212_0$ to $212_2$, which might have the same structure as the memory cells 208. The select gates $212_0$ to $212_2$ of the unit column structures $256_0$ to $256_3$ might be connected to (e.g., have control gates connected to) the select lines $215_{00}$ to $215_{02}$, respectively. The select gates $212_0$ to $212_2$ of the unit column structures $256_4$ to $256_7$ might be connected to (e.g., have control gates connected to) the select lines $215_{10}$ to $215_{12}$, respectively. The select gates $212_0$ to $212_2$ of the dummy unit column structure 257 might be connected to (e.g., have control gates connected to) the dummy select lines $217_0$ to $217_2$, respectively. Because the dummy unit column structure 257 is not intended to store data, the dummy select lines $217_0$ to $217_2$ may each be electrically floating. For example, a contiguous conductive structure could be formed, from which a first select line 215 (e.g., select line $215_{00}$), a second select line 215 (e.g., select line $215_{10}$), and a dummy select line 217 (e.g., dummy select line $217_0$) subsequently might be formed. As one example, isolation regions could be formed in such a contiguous conductive structure to define the first select line 215, the second select line 215 and the dummy select line 217, with each select line electrically isolated from one another. Alternatively, a single isolation region could be formed in the contiguous conductive structure such that the dummy select line 217 would remain connected to either the first select line 215 or the second select line 215, but the first select line 215 would be isolated from the second select line 215.

Figure 2C:
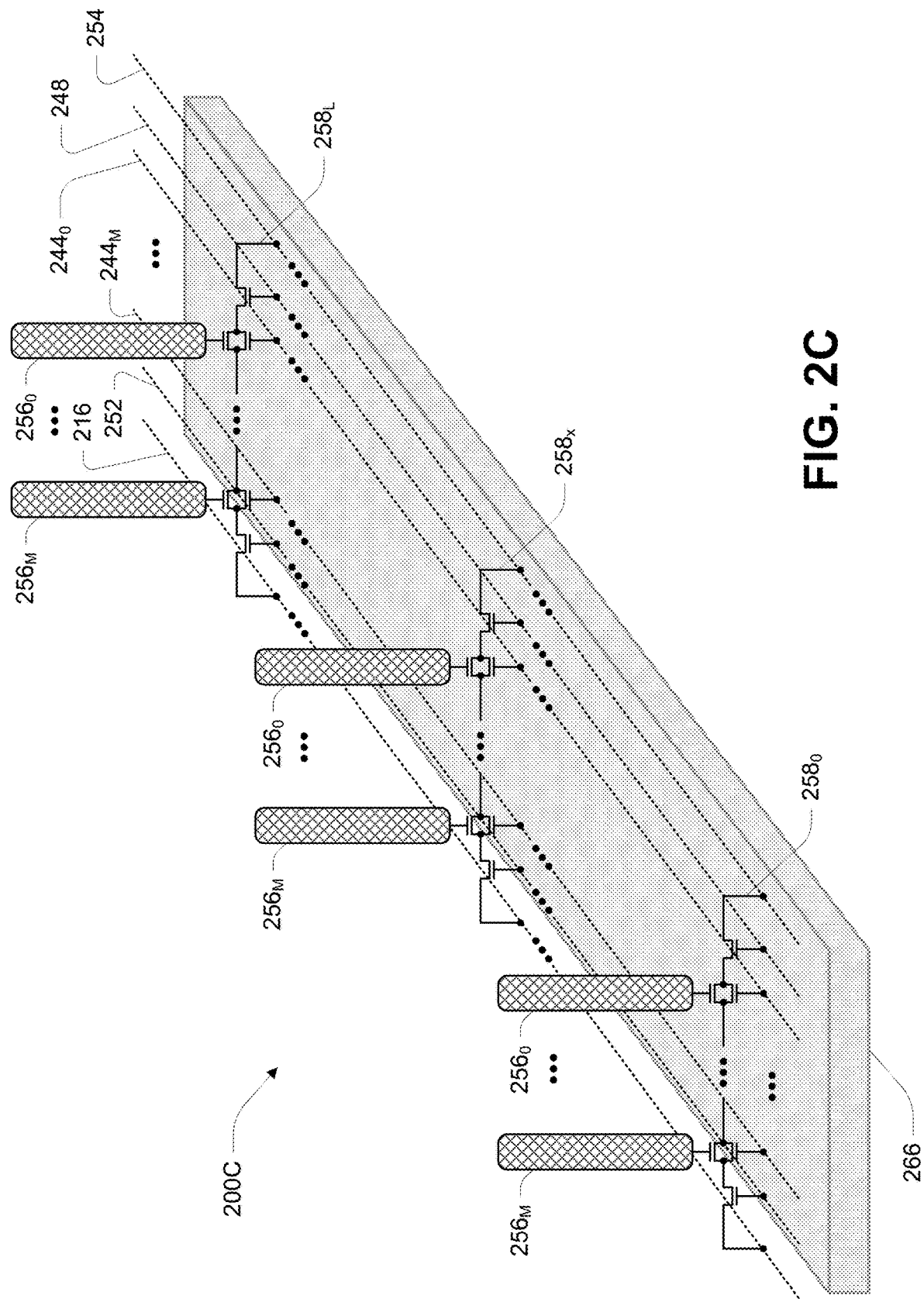
FIG. 2C is a perspective conceptualization of a portion of an array of memory cells over peripheral circuitry as could be used in a memory of the type described with reference to FIG. 1, according to a further embodiment.

As noted, while the array portions of FIGS. 2A and 2B depicted what might be formed in a single plane, three-dimensional structures might be used. FIG. 2C is a perspective conceptualization of a portion of an array of memory cells 200C over peripheral circuitry 266 as could be used in a memory of the type described with reference to FIG. 1, according to a further embodiment. The structures of FIG. 2A or FIG. 2B might represent the unit column structures $256_0$ to $256_M$ (e.g., where M=7 for FIG. 2B) for each sense line 258, e.g., sense lines $258_0$ to $258_L$. For simplicity, the connections of the unit column structures 256 to upper data lines 204 is not depicted in FIG. 2C.

The peripheral circuitry 266 might represent a variety of circuitry for accessing the memory array 200C. The peripheral circuitry 266 might include complementary circuit elements. For example, the peripheral circuitry 266 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

FIGS. 3A-3E are conceptual depictions of portions of a block of memory cells using array structures such as depicted in FIG. 2A and demonstrating layouts of backside gate lines 244, sense select lines 248 and 252, sense lines 258, common source 216 and lower data lines 254, according to embodiments.

Figure 3A:
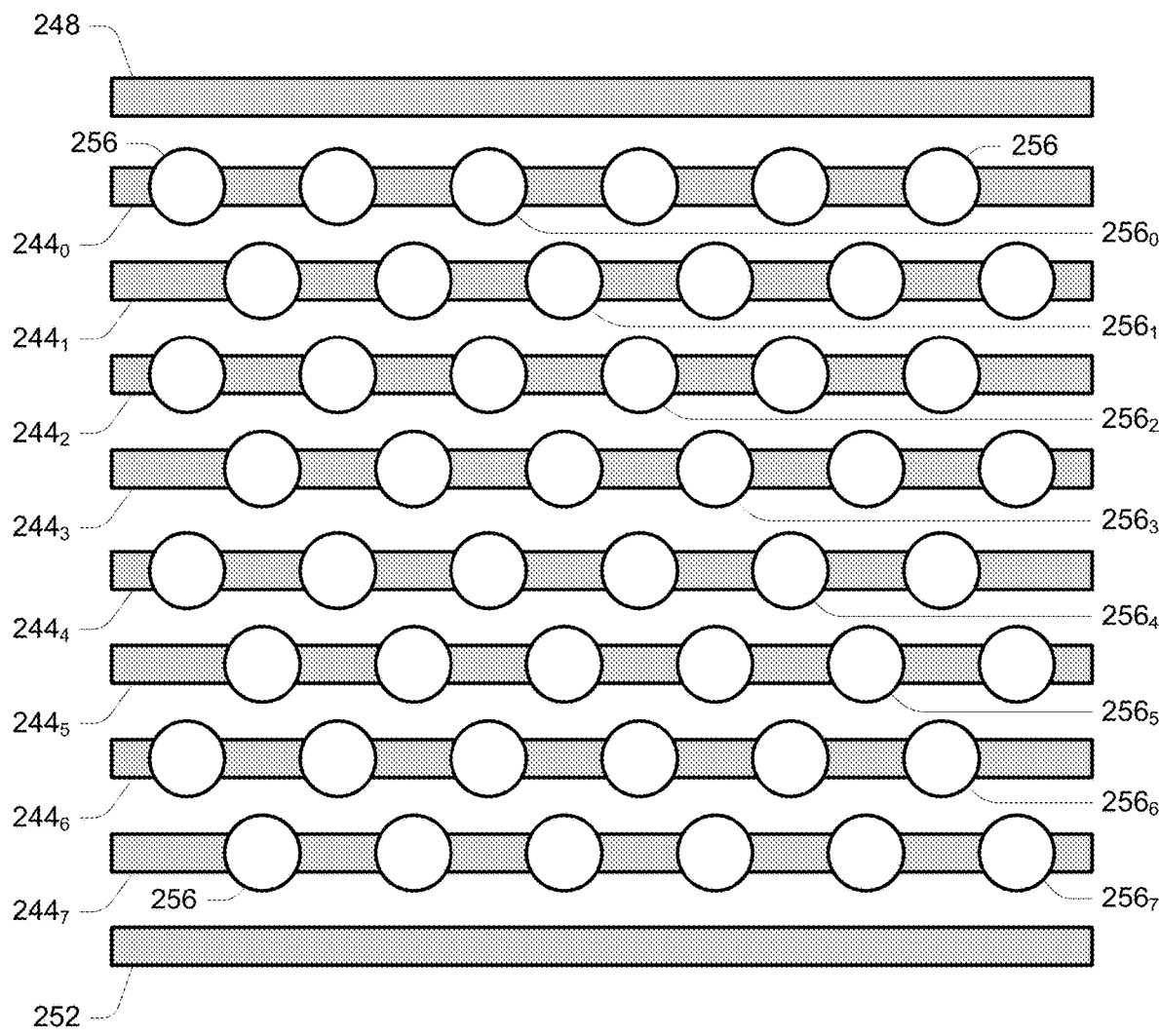
FIGS. 3A-3E are conceptual depictions of portions of a block of memory cells using array structures such as depicted in FIG. 2A and demonstrating layouts of backside gate lines, sense select lines, sense lines, common source, and lower data lines, according to embodiments.

FIG. 3A depicts a top-down view of a memory array 300A having a number of unit column structures 256, including unit column structures $256_0$ to $256_7$, which might correspond to the unit column structures 256 corresponding to the backside gate lines $244_0$ to $244_M$ of FIG. 2A, respectively, where M=7. The memory array 300A further depicts a first sense select line 248, backside gate lines $244_0$ to $244_7$, and a second sense select line 252 in horizontal orientations, which might correspond to the first sense select line 248, the backside gate lines $244_0$ to $244_M$, and the second sense select line 252 of FIG. 2A, respectively, where M=7. It is recognized that fewer or more backside gate lines 244 could be utilized between the sense select lines 248 and 252, and that fewer or more unit column structures could be associated with each backside gate line 244.

Figure 3B:
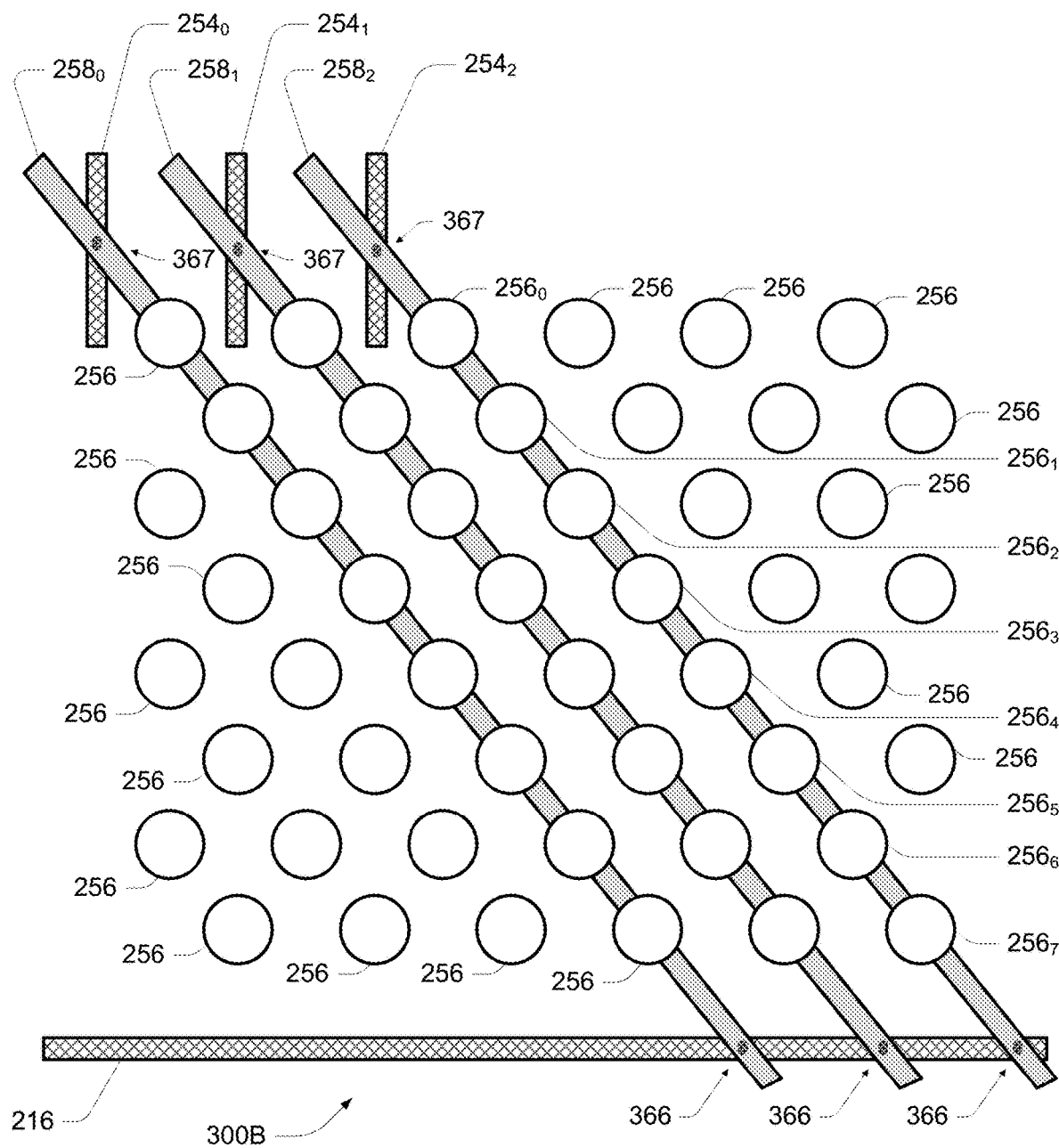

FIG. 3B depicts a top-down view of a memory array 300B, which might include the same memory array structure as the memory array 300A. The memory array 300B has a number of unit column structures 256, including unit column structures $256_0$ to $256_7$, which might correspond to the unit column structures 256 corresponding to the backside gate lines $244_0$ to $244_M$ of FIG. 2A, respectively, where M=7. The memory array 300B further depicts sense lines $258_0$ to $258_2$ in diagonal orientations, which each might individually correspond to the sense line 258 of FIG. 2A. It is recognized that fewer or more sense lines 258 could be utilized, and that fewer or more unit column structures could be associated with each sense line 258. The memory array 300B further depicts a common source 216 in a horizontal orientation connected to each of the sense lines 258 through a respective contact 366, and lower data lines $254_0$ to $254_2$ in vertical orientations each connected to a respective sense line $258_0$ to $258_2$, respectively, through a respective contact 367. It is noted that the lower data lines 254 and the common source 216 might be connected to sense lines 258 of additional blocks of memory cells (not depicted in FIG. 3B).

Figure 3C:
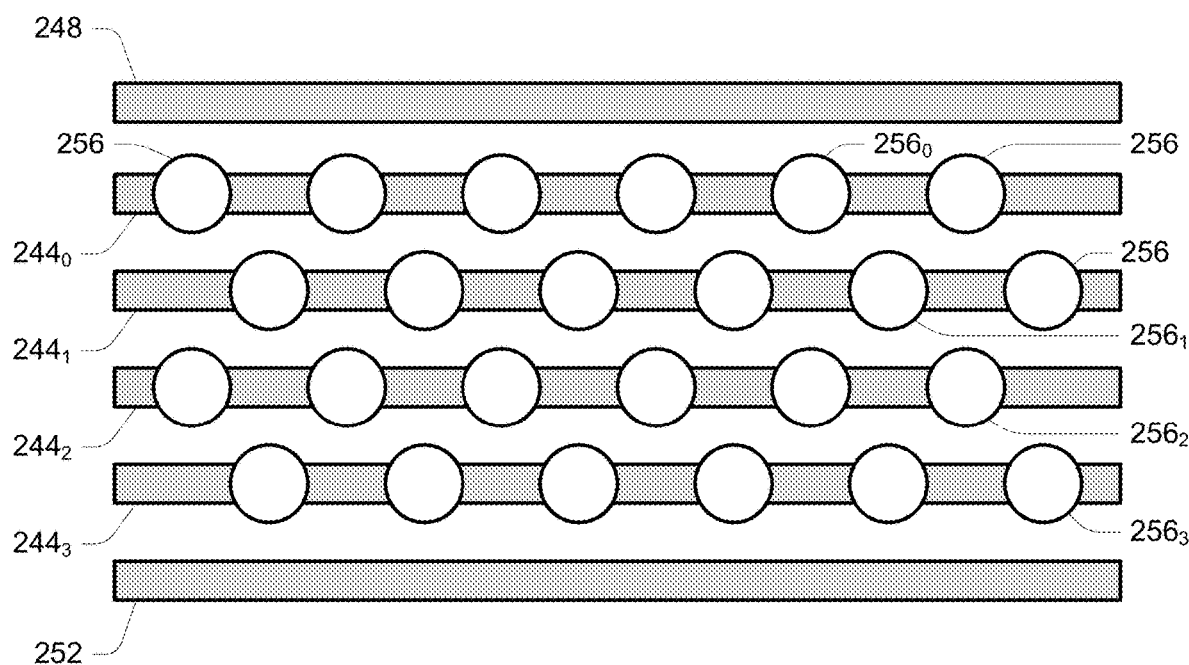

FIG. 3C depicts a top-down view of a memory array 300C having a number of unit column structures 256, including unit column structures $256_0$ to $256_3$, which might correspond to the unit column structures 256 corresponding to the backside gate lines $244_0$ to $244_M$ of FIG. 2A, respectively, where M=3. The memory array 300C further depicts a first sense select line 248, backside gate lines $244_0$ to $244_3$, and a second sense select line 252 in horizontal orientations, which might correspond to the first sense select line 248, the backside gate lines $244_0$ to $244_M$, and the second sense select line 252 of FIG. 2A, respectively, where M=3. It is recognized that fewer or more backside gate lines 244 could be utilized between the sense select lines 248 and 252, and that fewer or more unit column structures could be associated with each backside gate line 244.

Figure 3D:
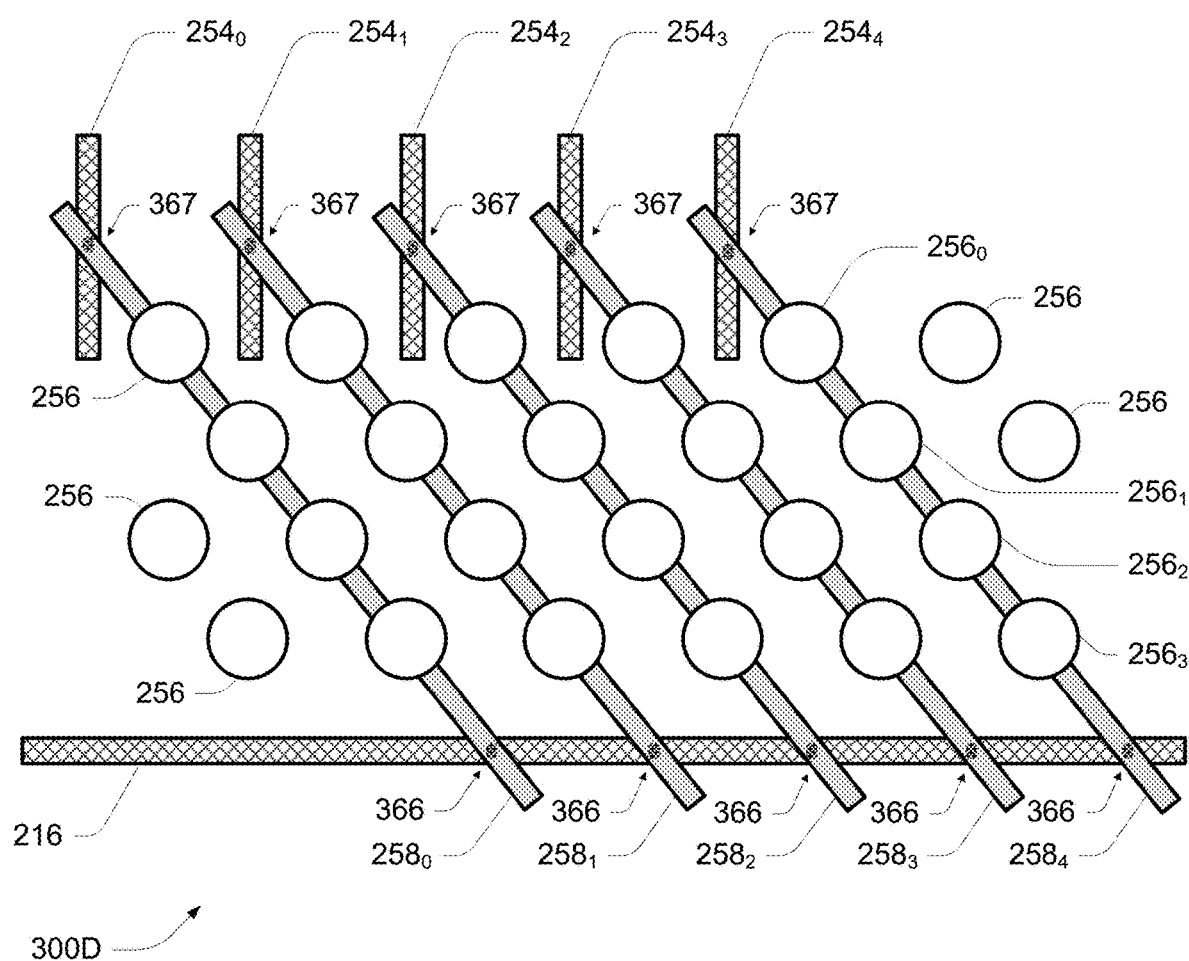

FIG. 3D depicts a top-down view of a memory array 300D, which might include the same memory array structure as the memory array 300C. The memory array 300D has a number of unit column structures 256, including unit column structures $256_0$ to $256_3$, which might correspond to the unit column structures 256 corresponding to the backside gate lines $244_0$ to $244_M$ of FIG. 2A, respectively, where M=3. The memory array 300D further depicts sense lines $258_0$ to $258_4$ in diagonal orientations, which each might individually correspond to the sense line 258 of FIG. 2A. It is recognized that fewer or more sense lines 258 could be utilized, and that fewer or more unit column structures could be associated with each sense line 258. The memory array 300D further depicts a common source 216 in a horizontal orientation connected to each of the sense lines 258 through a respective contact 366, and lower data lines $254_0$ to $254_4$ in vertical orientations each connected to a respective sense line $258_0$ to $258_4$, respectively, through a respective contact 367. It is noted that the lower data lines 254 and the common source 216 might be connected to sense lines 258 of additional blocks of memory cells (not depicted in FIG. 3D).

Figure 3E:
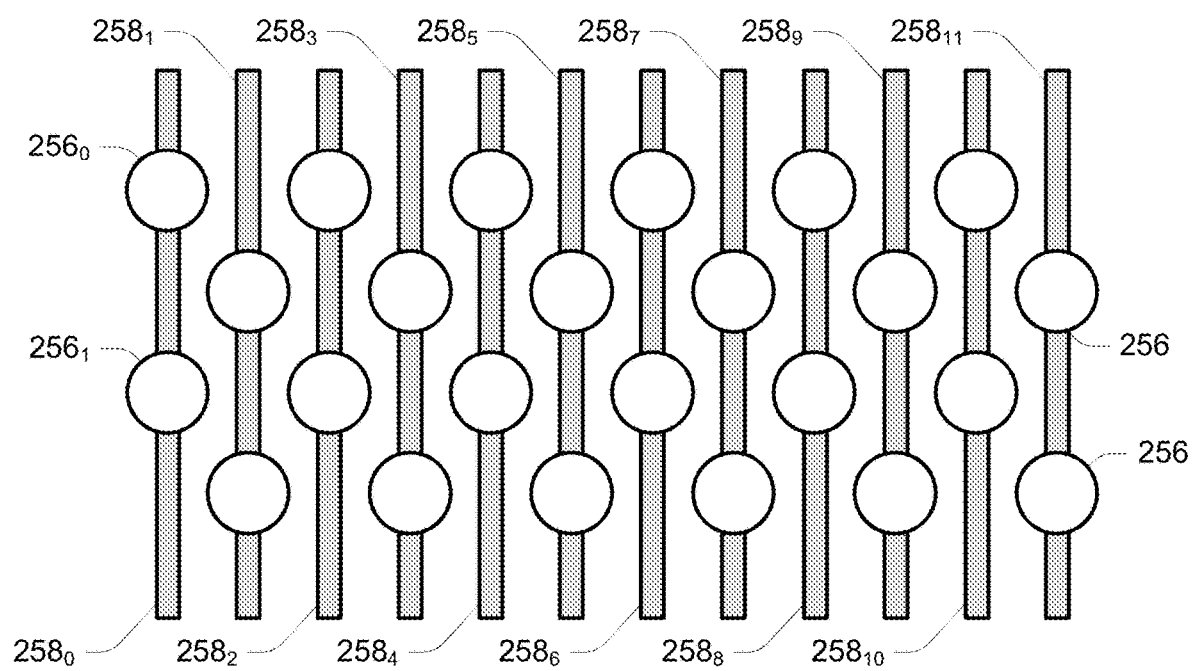

FIG. 3E depicts a top-down view of a memory array 300E, which might include the same memory array structure as the memory array 300C. The memory array 300E has a number of unit column structures 256, including unit column structures $256_0$ and $256_1$, which might correspond to the unit column structures 256 corresponding to the backside gate lines $244_0$ to $244_M$ of FIG. 2A, respectively, where M=1. The memory array 300E further depicts sense lines $258_0$ to $258_{11}$ in vertical orientations, which each might individually correspond to the sense line 258 of FIG. 2A. It is recognized that fewer or more sense lines 258 could be utilized, and that fewer or more unit column structures could be associated with each sense line 258. The memory array 300E might further include a common source 216 (not depicted in FIG. 3E) in a horizontal orientation connected to each of the sense lines 258 through a respective contact 366 such as depicted in FIG. 3D, and lower data lines 254 (not depicted in FIG. 3E) in vertical orientations each connected to a respective sense line 258 through a respective contact 367 such as depicted in FIG. 3D.

Figure 3F:
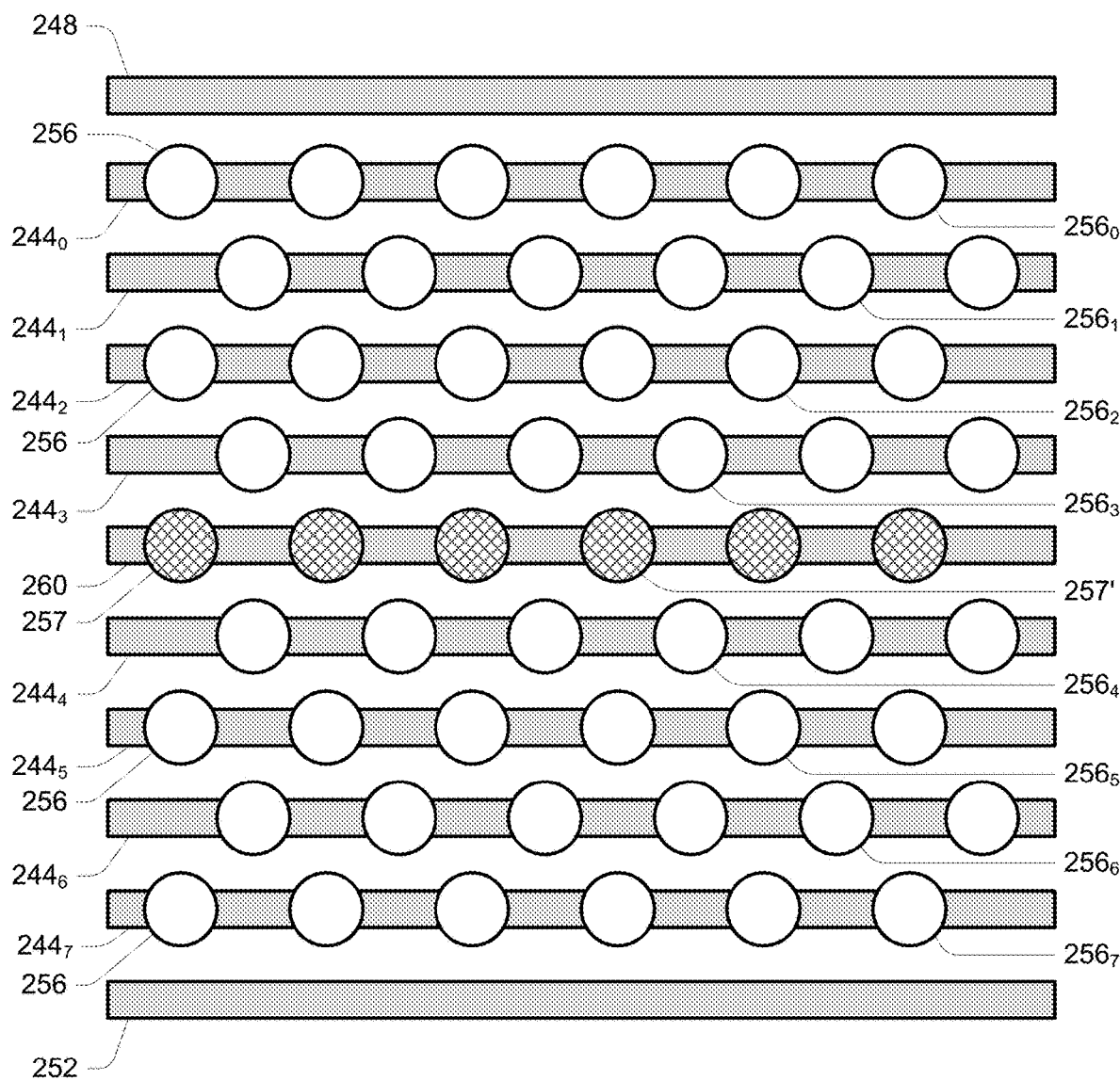
FIGS. 3F-3G are conceptual depictions of a portion of a block of memory cells using an array structure such as depicted in FIG. 2B and demonstrating a layout of backside gate lines, sense select lines, sense lines, common source, and lower data lines, according to additional embodiments.
Figure 3G:
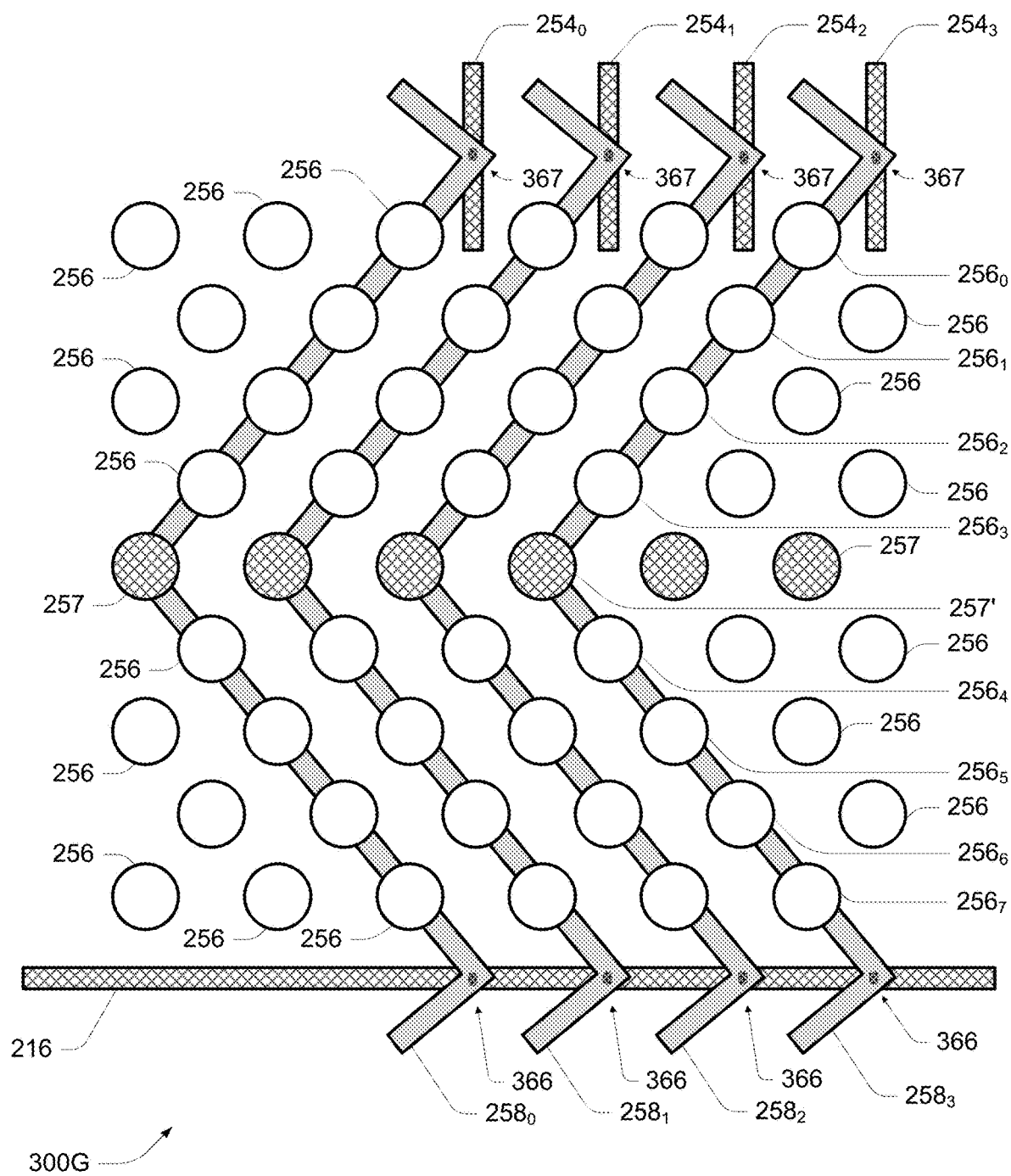

FIGS. 3F-3G are conceptual depictions of a portion of a block of memory cells using an array structure such as depicted in FIG. 2B and demonstrating a layout of backside gate lines 244, dummy backside gate line 260, sense select lines 248 and 252, common source 216 and lower data lines 254, according to an additional embodiment.

FIG. 3F depicts a top-down view of a memory array 300F having a number of unit column structures 256, including unit column structures $256_0$ to $256_7$, which might correspond to the unit column structures $256_0$ to $256_7$ of FIG. 2B, respectively. The memory array 300F further has a number of dummy unit column structures 257, including the dummy unit column structure 257', which might correspond to the dummy unit column structure 257 of FIG. 2B. The memory array 300F further depicts a first sense select line 248, backside gate lines $244_0$ to $244_3$, dummy backside gate line 260, backside gate lines $244_4$ to $244_7$, and a second sense select line 252 in horizontal orientations, which might correspond to the first sense select line 248, the backside gate lines $244_0$ to $244_3$, the dummy backside gate line 260, the backside gate lines $244_4$ to $244_7$, and the second sense select line 252 of FIG. 2B, respectively. It is recognized that fewer or more backside gate lines 244 and dummy backside gate lines 260 could be utilized between the sense select lines 248 and 252, and that fewer or more unit column structures 256 could be associated with each backside gate line 244 and fewer or more dummy unit column structures 257 could be associated with each dummy backside gate line 260.

FIG. 3G depicts a top-down view of a memory array 300G, which might include the same memory array structure as the memory array 300F. The memory array 300G has a number of unit column structures 256, including unit column structures $256_0$ to $256_7$, which might correspond to the unit column structures 256 corresponding to the backside gate lines $244_0$ to $244_M$ of FIG. 2A, respectively, where M=7. The memory array 300G further has a number of dummy unit column structures 257, including the dummy unit column structure 257', which might correspond to the dummy unit column structure 257 of FIG. 2B. The memory array 300G further depicts sense lines $258_0$ to $258_3$ in folded orientations, which each might individually correspond to the sense line 258 of FIG. 2B. It is recognized that fewer or more sense lines 258 could be utilized, and that fewer or more unit column structures could be associated with each sense line 258. The memory array 300G further depicts a common source 216 in a horizontal orientation connected to each of the sense lines 258 through a respective contact 366, and lower data lines $254_0$ to $254_3$ in vertical orientations each connected to a respective sense line $258_0$ to $258_3$, respectively, through a respective contact 367. It is noted that the lower data lines 254 and the common source 216 might be connected to sense lines 258 of additional blocks of memory cells (not depicted in FIG. 3D).

Figure 4A:
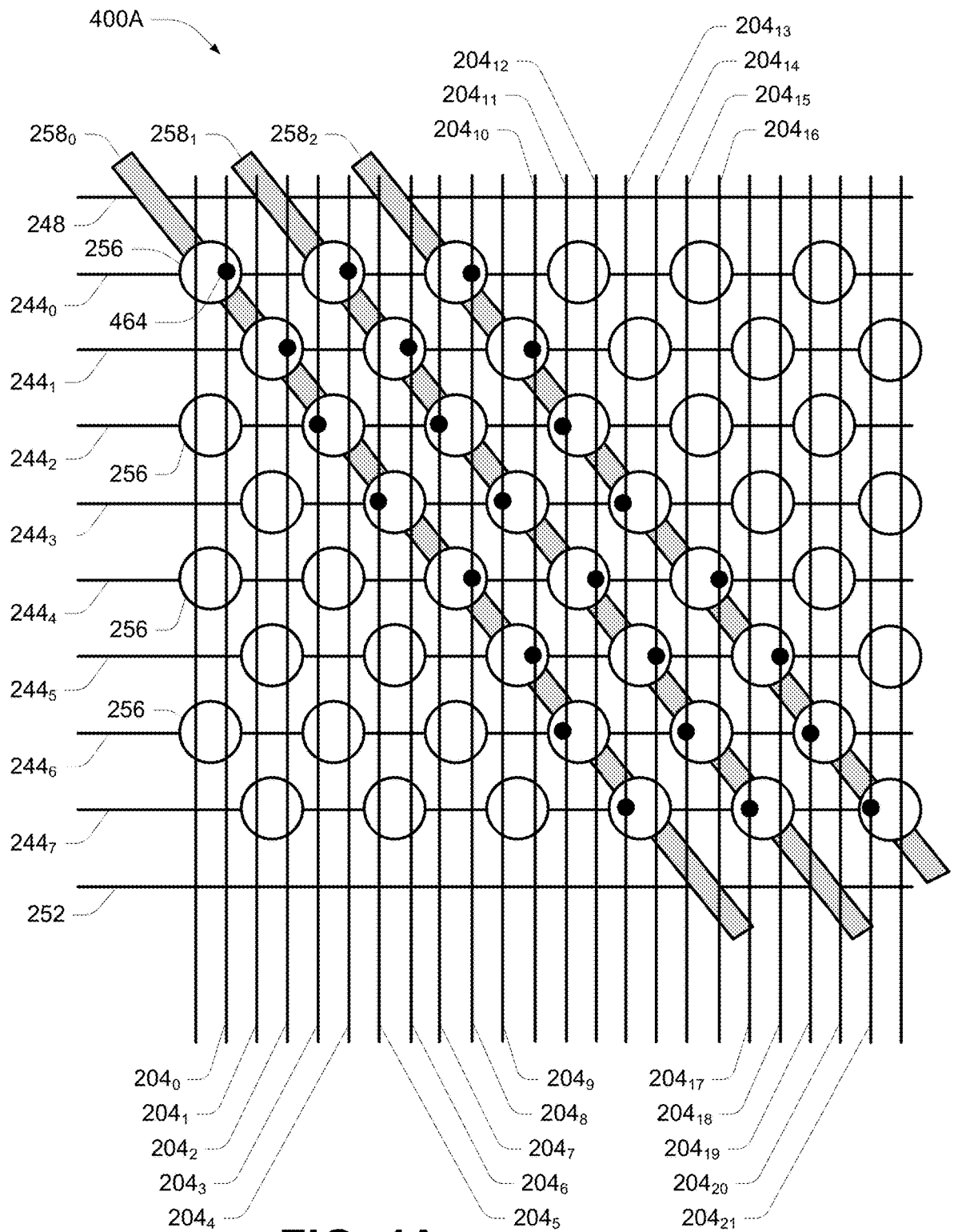
FIG. 4A is a conceptual depiction of a portion of a block of memory cells using an array structure such as depicted in FIGS. 3A and 3B, and demonstrating a layout of upper data line connectivity, according to an embodiment.

FIG. 4A is a conceptual depiction of a portion of a block of memory cells using an array structure such as depicted in FIGS. 3A and 3B, and demonstrating a layout of upper data line 204 connectivity, according to an embodiment.

FIG. 4A depicts a top-down view of a memory array 400A having a number of unit column structures 256, which might correspond to the unit column structures 256 of FIGS. 3A and 3B. The memory array 400A further depicts a first sense select line 248, backside gate lines $244_0$ to $244_7$, and a second sense select line 252 in horizontal orientations, which might correspond to the first sense select line 248, the backside gate lines $244_0$ to $244_M$, and the second sense select line 252 of FIG. 2A, respectively, where M=7. It is recognized that fewer or more backside gate lines 244 could be utilized between the sense select lines 248 and 252, and that fewer or more unit column structures could be associated with each backside gate line 244. The memory array 400A further depicts sense lines $258_0$ to $258_2$ in diagonal orientations, which each might individually correspond to the sense line 258 of FIG. 2A. It is recognized that fewer or more sense lines 258 could be utilized, and that fewer or more unit column structures could be associated with each sense line 258. The sense lines 258 might be non-orthogonal to, e.g., angled in relation to, the backside gate lines 244. The memory array 400A further depicts a number of upper data lines 204 in vertical orientations, including upper data lines $204_0$ to $204_{21}$. The upper data lines 204 might be orthogonal to the backside gate lines 244.

With reference to the sense line $258_2$ of FIG. 4A as corresponding to the sense line 258 of FIG. 2A, the upper data line $204_8$ of FIG. 4A might correspond to the upper data line $204_0$ of FIG. 2A, the upper data line $204_{10}$ of FIG. 4A might correspond to the upper data line $204_1$ of FIG. 2A, the upper data line $204_{11}$ of FIG. 4A might correspond to the upper data line $204_2$ of FIG. 2A, the upper data line $204_{13}$ of FIG. 4A might correspond to the upper data line $204_3$ of FIG. 2A, the upper data line $204_{16}$ of FIG. 4A might correspond to the upper data line $204_4$ of FIG. 2A, the upper data line $204_{18}$ of FIG. 4A might correspond to the upper data line $204_5$ of FIG. 2A, the upper data line $204_{19}$ of FIG. 4A might correspond to the upper data line $204_6$ of FIG. 2A, and the upper data line $204_{21}$ of FIG. 4A might correspond to the upper data line $204_7$ of FIG. 2A, where M=7. Although upper data lines $204_3$ to $204_6$ are not explicitly depicted in FIG. 2A, it is apparent from the figure that the upper data lines 204 of the array of memory cells 200A may be numbered consecutively from upper data line $204_0$ to upper data line $204_M$. Each of the upper data lines 204 might be connected to one or more respective unit column structures 256 through respective contacts 464. It is noted that the upper data lines 204 might be connected to unit column structures 256 of additional blocks of memory cells (not depicted in FIG. 4A).

It is noted that a set of upper data lines 204, e.g., upper data lines $204_4$, $204_6$, $204_7$, $204_9$, $204_{12}$, $204_{14}$, $204_{15}$, and $204_{17}$, connected to unit column structures 256 that are capacitively coupled to one sense line 258, e.g., sense line $258_1$, may be mutually exclusive from a set of upper data lines 204, e.g., upper data lines $204_8$, $204_{10}$, $204_{11}$, $204_{13}$, $204_{16}$, $204_{18}$, $204_{19}$, and $204_{21}$, connected to unit column structures 256 that are capacitively coupled to a different sense line 258, e.g., adjacent (e.g., immediately adjacent) sense line $258_2$. In this scenario, one or more of the upper data lines 204 connected to unit column structures 256 that are capacitively coupled to sense line $258_1$ may be interleaved with one or more upper data lines 204 connected to unit column structures 256 that are capacitively coupled to sense line $258_2$. In addition, a set of upper data lines 204, e.g., upper data lines $204_0$, $204_2$, $204_3$, $204_5$, $204_8$, $204_{10}$, $204_{11}$, and $204_{13}$, connected to unit column structures 256 that are capacitively coupled to one sense line 258, e.g., sense line $258_0$, may not be completely mutually exclusive from a set of upper data lines 204, e.g., upper data lines $204_8$, $204_{10}$, $204_{11}$, $204_{13}$, $204_{16}$, $204_{18}$, $204_{19}$, and $204_{21}$, connected to unit column structures 256 that are capacitively coupled to a different sense line 258, e.g., sense line $258_2$. In this scenario, there may be no interleaving of upper data lines 204 in this case.

Figure 4B:
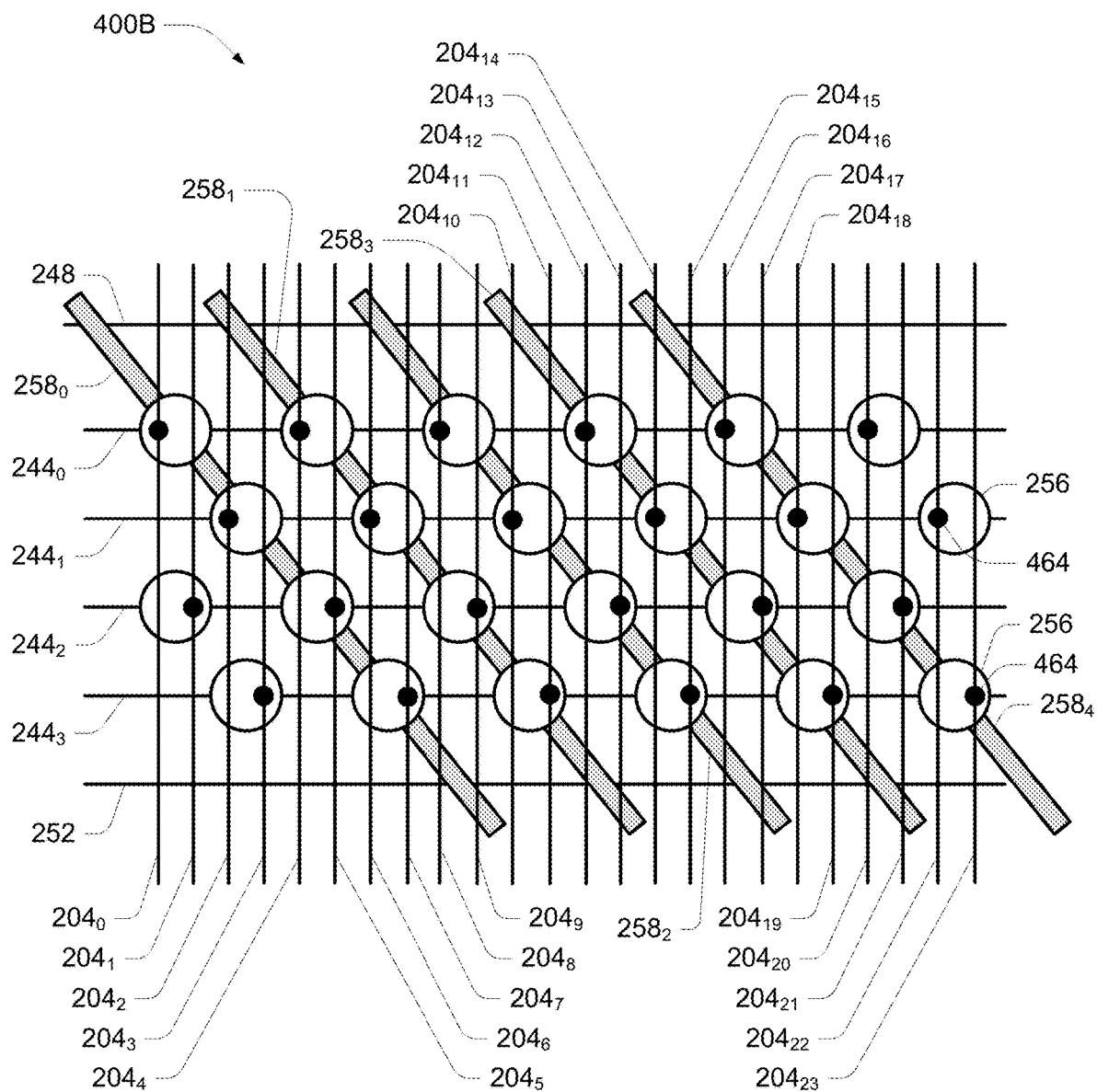
FIG. 4B is a conceptual depiction of a portion of a block of memory cells using an array structure such as depicted in FIGS. 3C and 3D, and demonstrating a layout of upper data line connectivity, according to another embodiment.

FIG. 4B is a conceptual depiction of a portion of a block of memory cells using an array structure such as depicted in FIGS. 3C and 3D, and demonstrating a layout of upper data line 204 connectivity, according to another embodiment.

FIG. 4B depicts a top-down view of a memory array 400B having a number of unit column structures 256, which might correspond to the unit column structures 256 of FIGS. 3C and 3D. The memory array 400B further depicts a first sense select line 248, backside gate lines $244_0$ to $244_3$, and a second sense select line 252 in horizontal orientations, which might correspond to the first sense select line 248, the backside gate lines $244_0$ to $244_M$, and the second sense select line 252 of FIG. 2A, respectively, where M=3. It is recognized that fewer or more backside gate lines 244 could be utilized between the sense select lines 248 and 252, and that fewer or more unit column structures could be associated with each backside gate line 244. The memory array 400B further depicts sense lines $258_0$ to $258_4$ in diagonal orientations, which each might individually correspond to the sense line 258 of FIG. 2A. It is recognized that fewer or more sense lines 258 could be utilized, and that fewer or more unit column structures could be associated with each sense line 258. The sense lines 258 might be non-orthogonal to, e.g., angled in relation to, the backside gate lines 244. The memory array 400B further depicts a number of upper data lines 204 in vertical orientations, including upper data lines $204_0$ to $204_{23}$. The upper data lines 204 might be orthogonal to the backside gate lines 244.

With reference to the sense line $258_4$ of FIG. 4B as corresponding to the sense line 258 of FIG. 2A, the upper data line $204_{16}$ of FIG. 4B might correspond to the upper data line $204_0$ of FIG. 2A, the upper data line $204_{18}$ of FIG. 4B might correspond to the upper data line $204_1$ of FIG. 2A, the upper data line $204_{21}$ of FIG. 4B might correspond to the upper data line $204_2$ of FIG. 2A, and the upper data line $204_{23}$ of FIG. 4B might correspond to the upper data line $204_3$ of FIG. 2A, where M=3. It is noted that the upper data lines 204 might be connected to unit column structures 256 of additional blocks of memory cells (not depicted in FIG. 4B).

It is noted that a set of upper data lines 204, e.g., upper data lines $204_0$, $204_2$, $204_5$, and $204_7$, connected to unit column structures 256 that are capacitively coupled to one sense line 258, e.g., sense line $258_0$, may be mutually exclusive from a set of upper data lines 204, e.g., upper data lines $204_4$, $204_6$, $204_9$, and $204_{11}$, connected to unit column structures 256 that are capacitively coupled to a different sense line 258, e.g., adjacent sense line $258_1$. In this scenario, one or more of the upper data lines 204 connected to unit column structures 256 that are capacitively coupled to sense line $258_0$ may be interleaved with one or more upper data lines 204 connected to unit column structures 256 that are capacitively coupled to sense line $258_1$. This relationship may be true for sets of upper data lines 204 connected to unit column structures 256 that are capacitively coupled to each remaining sense line 258.

Figure 4C:
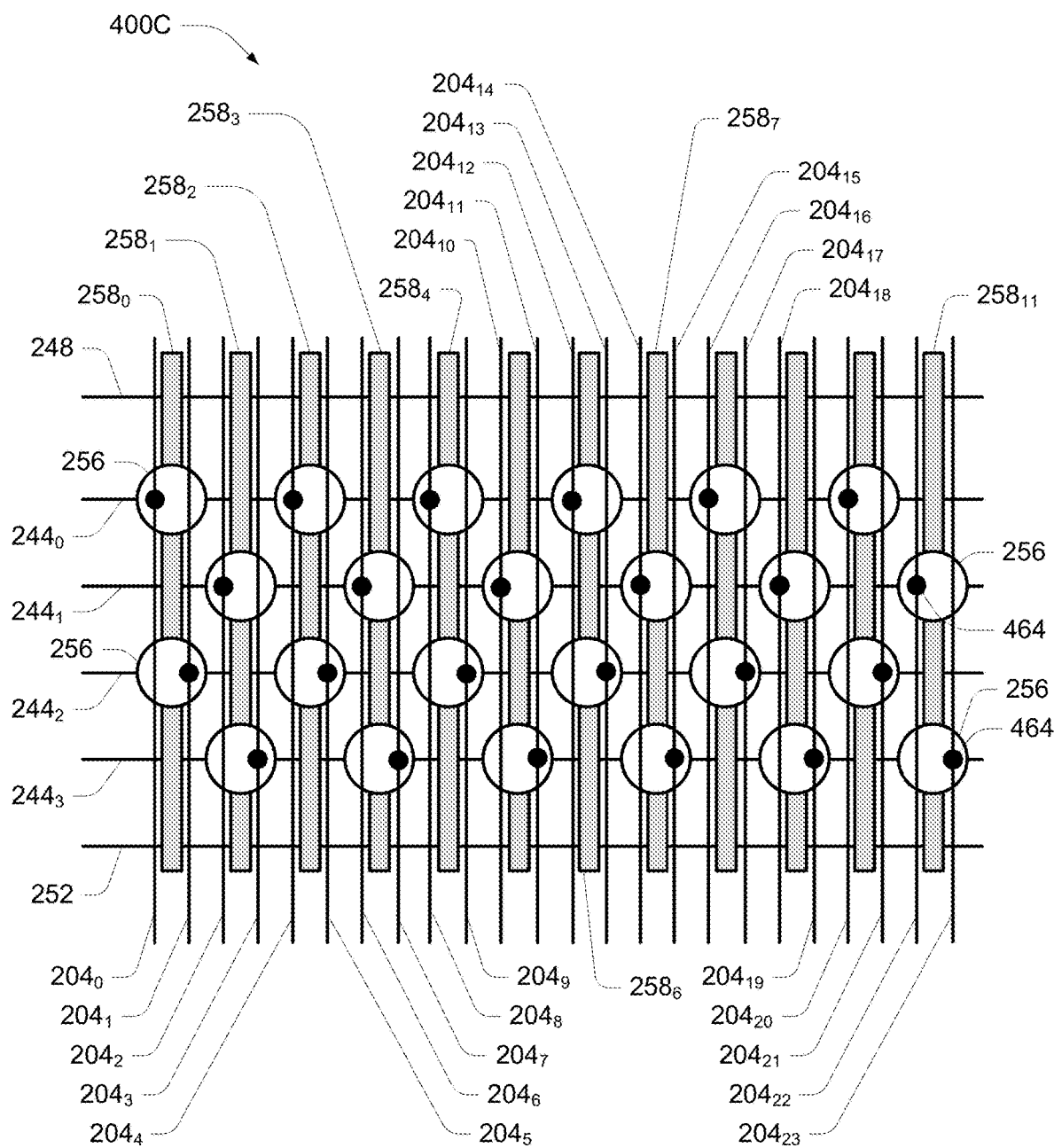
FIG. 4C is a conceptual depiction of a portion of a block of memory cells using an array structure such as depicted in FIGS. 3C and 3E, and demonstrating a layout of upper data line connectivity, according to a further embodiment.

FIG. 4C is a conceptual depiction of a portion of a block of memory cells using an array structure such as depicted in FIGS. 3C and 3E, and demonstrating a layout of upper data line 204 connectivity, according to a further embodiment.

FIG. 4C depicts a top-down view of a memory array 400C having a number of unit column structures 256, which might correspond to the unit column structures 256 of FIGS. 3C and 3E. The memory array 400C further depicts a first sense select line 248, backside gate lines $244_0$ to $244_3$, and a second sense select line 252 in horizontal orientations, which might correspond to the first sense select line 248, the backside gate lines $244_0$ to $244_M$, and the second sense select line 252 of FIG. 2A, respectively, where M=3. It is recognized that fewer or more backside gate lines 244 could be utilized between the sense select lines 248 and 252, and that fewer or more unit column structures could be associated with each backside gate line 244. The memory array 400C further depicts sense lines $258_0$ to $258_{11}$ in vertical orientations, which each might individually correspond to the sense line 258 of FIG. 2A. It is recognized that fewer or more sense lines 258 could be utilized, and that fewer or more unit column structures could be associated with each sense line 258. The sense lines 258 might be orthogonal to the backside gate lines 244. The memory array 400C further depicts a number of upper data lines 204 in vertical orientations, including upper data lines $204_0$ to $204_{23}$. The upper data lines 204 might be orthogonal to the backside gate lines 244.

With reference to the sense line $258_0$ of FIG. 4C as corresponding to the sense line 258 of FIG. 2A, the upper data line $204_0$ of FIG. 4C might correspond to the upper data line $204_0$ of FIG. 2A, and the upper data line $204_1$ of FIG. 4C might correspond to the upper data line $204_1$ of FIG. 2A, where M=1. It is noted that the upper data lines 204 might be connected to unit column structures 256 of additional blocks of memory cells (not depicted in FIG. 4C).

It is noted that a set of upper data lines 204, e.g., upper data lines $204_0$ and $204_1$, connected to unit column structures 256 that are capacitively coupled to one sense line 258, e.g., sense line $258_0$, may be mutually exclusive from a set of upper data lines 204, e.g., upper data lines $204_2$ and $204_3$, connected to unit column structures 256 that are capacitively coupled to a different sense line 258, e.g., adjacent (e.g., immediately adjacent) sense line $258_1$. In this scenario, there may be no interleaving of sets of upper data lines 204. This relationship may be true for sets of upper data lines 204 connected to unit column structures 256 that are capacitively coupled to each remaining sense line 258.

Figure 4D:
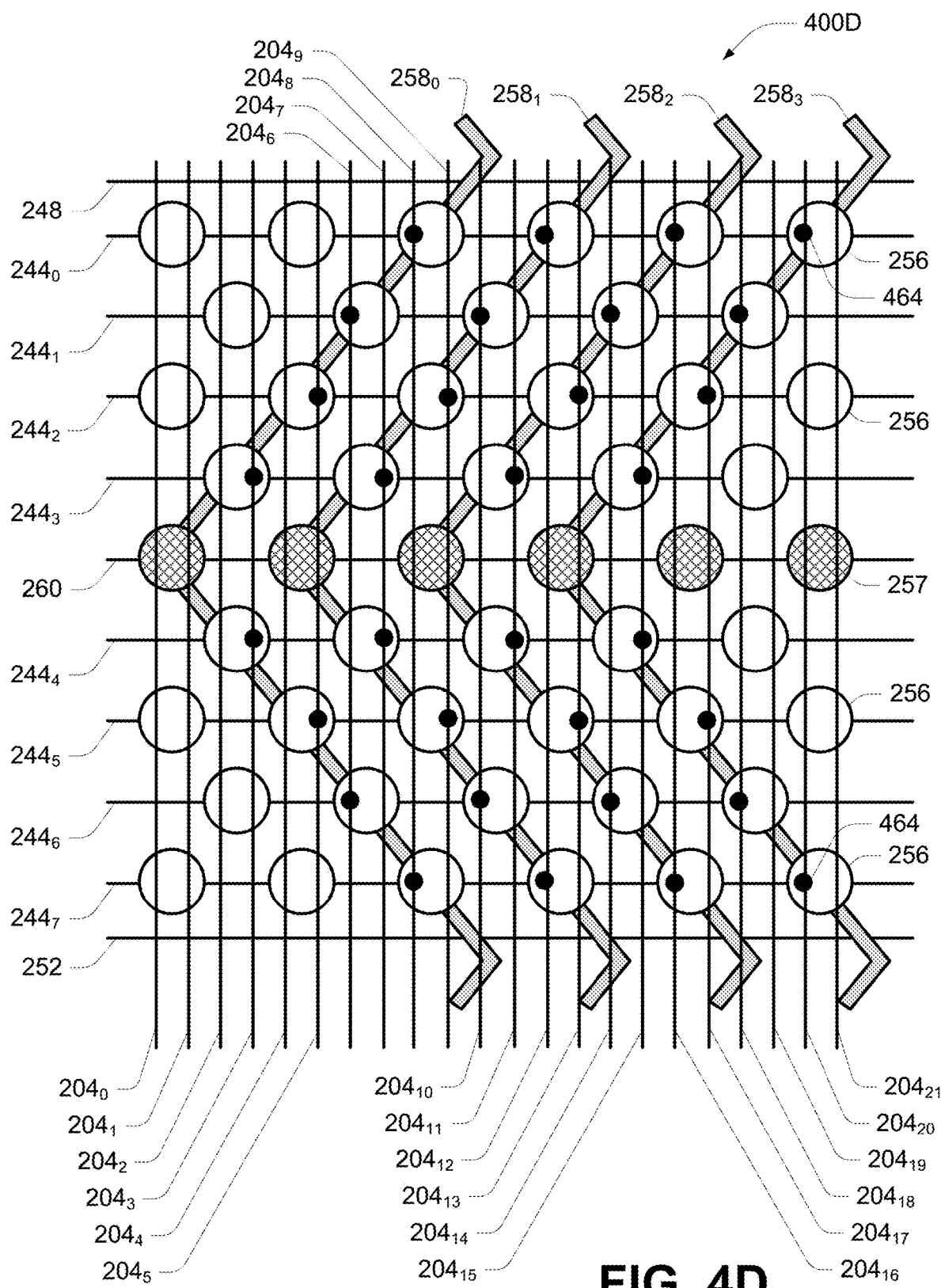
FIG. 4D is a conceptual depiction of a portion of a block of memory cells using an array structure such as depicted in FIGS. 3F and 3G, and demonstrating a layout of upper data line connectivity, according to a still further embodiment.

FIG. 4D is a conceptual depiction of a portion of a block of memory cells using an array structure such as depicted in FIGS. 3F and 3G, and demonstrating a layout of upper data line 204 connectivity, according to a further embodiment.

FIG. 4D depicts a top-down view of a memory array 400D having a number of unit column structures 256 and dummy unit column structures 257, which might correspond to the unit column structures 256 and dummy unit column structures 257, respectively, of FIGS. 3F and 3G. The memory array 400D further depicts a first sense select line 248, backside gate lines $244_0$ to $244_3$, dummy backside gate line 260, backside gate lines $244_4$ to $244_7$, and a second sense select line 252 in horizontal orientations, which might correspond to the first sense select line 248, the backside gate lines $244_0$ to $244_3$, the dummy backside gate line 260, the backside gate lines $244_4$ to $244_7$, and the second sense select line 252 of FIG. 2B, respectively. It is recognized that fewer or more backside gate lines 244 and dummy backside gate lines 260 could be utilized between the sense select lines 248 and 252, and that fewer or more unit column structures 256 could be associated with each backside gate line 244 and fewer or more dummy unit column structures 257 could be associated with each dummy backside gate line 260. The memory array 400D further depicts sense lines $258_0$ to $258_3$ in folded orientations, which each might individually correspond to the sense line 258 of FIG. 2B. It is recognized that fewer or more sense lines 258 could be utilized, and that fewer or more unit column structures 256 and dummy unit column structures 257 could be associated with each sense line 258. The sense lines 258 might be non-orthogonal to, e.g., angled in relation to, the backside gate lines 244. The memory array 400D further depicts a number of upper data lines 204 in vertical orientations, including upper data lines $204_0$ to $204_9$. The upper data lines 204 might be orthogonal to the backside gate lines 244.

With reference to the sense line $258_3$ of FIG. 4D as corresponding to the sense line 258 of FIG. 2B, the upper data line $204_{20}$ of FIG. 4D might correspond to the upper data line $204_0$ of FIG. 2B, the upper data line $204_{18}$ of FIG. 4D might correspond to the upper data line $204_1$ of FIG. 2B, the upper data line $204_{17}$ of FIG. 4D might correspond to the upper data line $204_2$ of FIG. 2B, and the upper data line $204_{15}$ of FIG. 4D might correspond to the upper data line $204_3$ of FIG. 2B. Each of the upper data lines 204 might be connected to one or more respective unit column structures 256 through respective contacts 464.

It is noted that a set of upper data lines 204, e.g., upper data lines $204_3$, $204_5$, $204_6$, and $204_8$, connected to unit column structures 256 that are capacitively coupled to one sense line 258, e.g., sense line $258_0$, may be mutually exclusive from a set of upper data lines 204, e.g., upper data lines $204_7$, $204_9$, $204_{10}$, and $204_{12}$, connected to unit column structures 256 that are capacitively coupled to a different sense line 258, e.g., adjacent (e.g., immediately adjacent) sense line $258_1$. In this scenario, one or more of the upper data lines 204 connected to unit column structures 256 that are capacitively coupled to sense line $258_0$ may be interleaved with one or more upper data lines 204 connected to unit column structures 256 that are capacitively coupled to sense line $258_1$. This relationship may be true for each pair of adjacent sense lines 258.

Figure 5C:
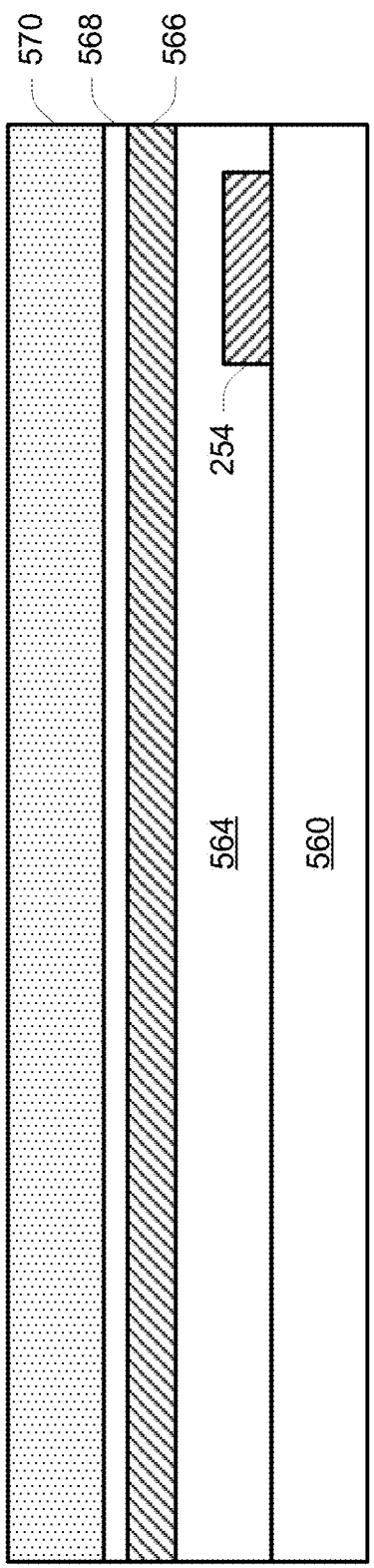
FIGS. 5A-5N depict an integrated circuit structure during various stages of fabrication in accordance with embodiments.
Figure 5D:
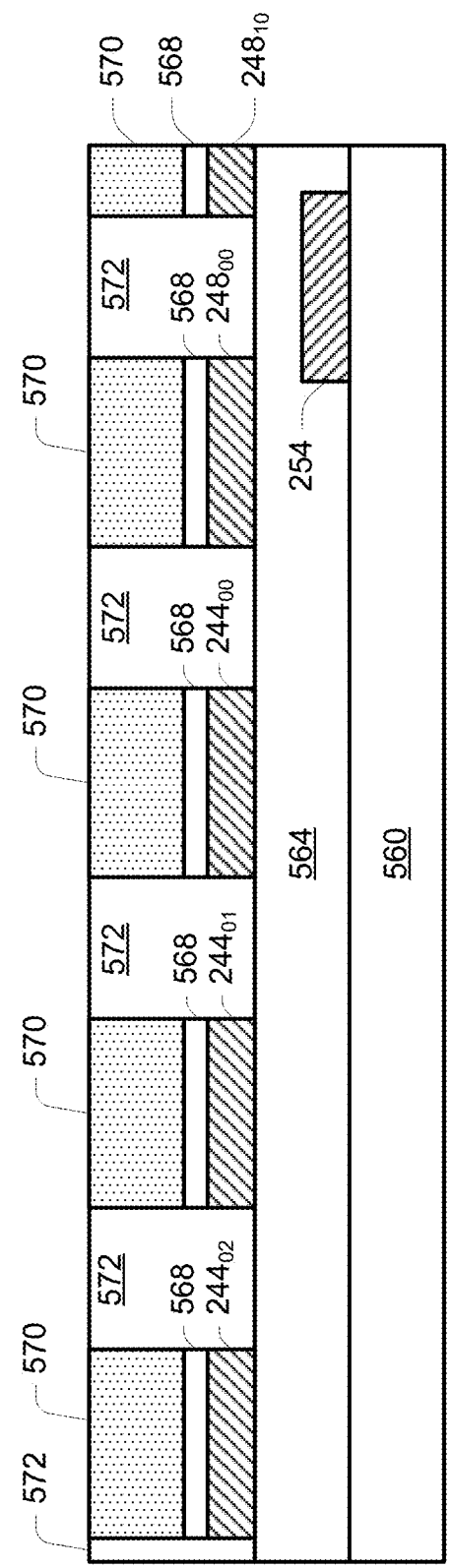
Figure 5G:
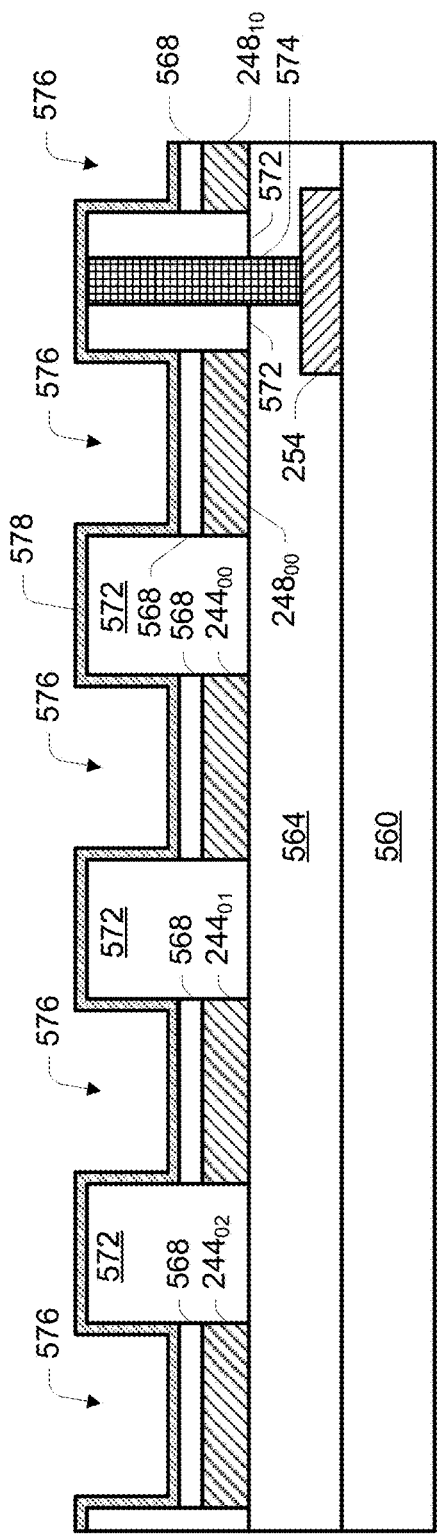
Figure 5H:
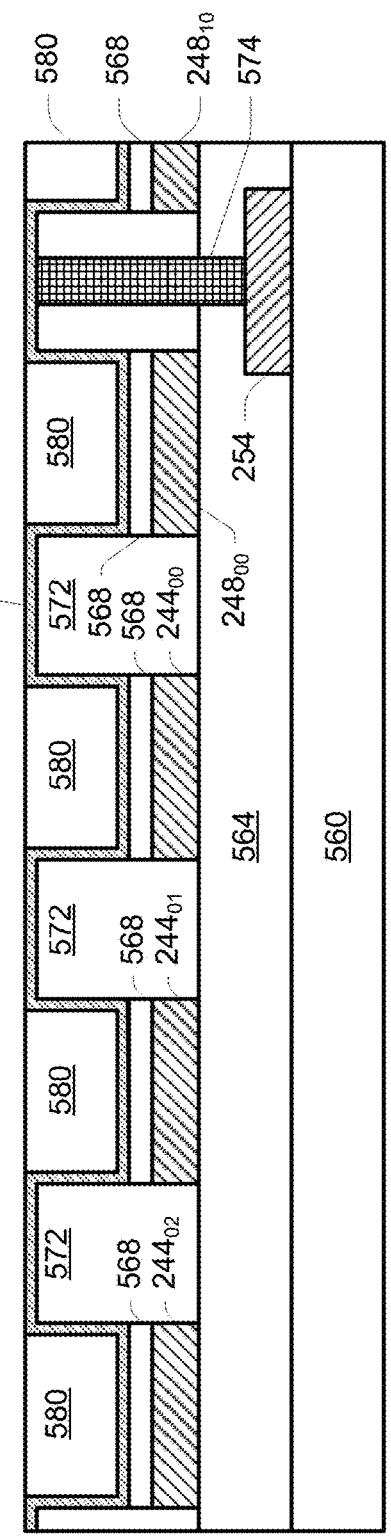
Figure 5I:
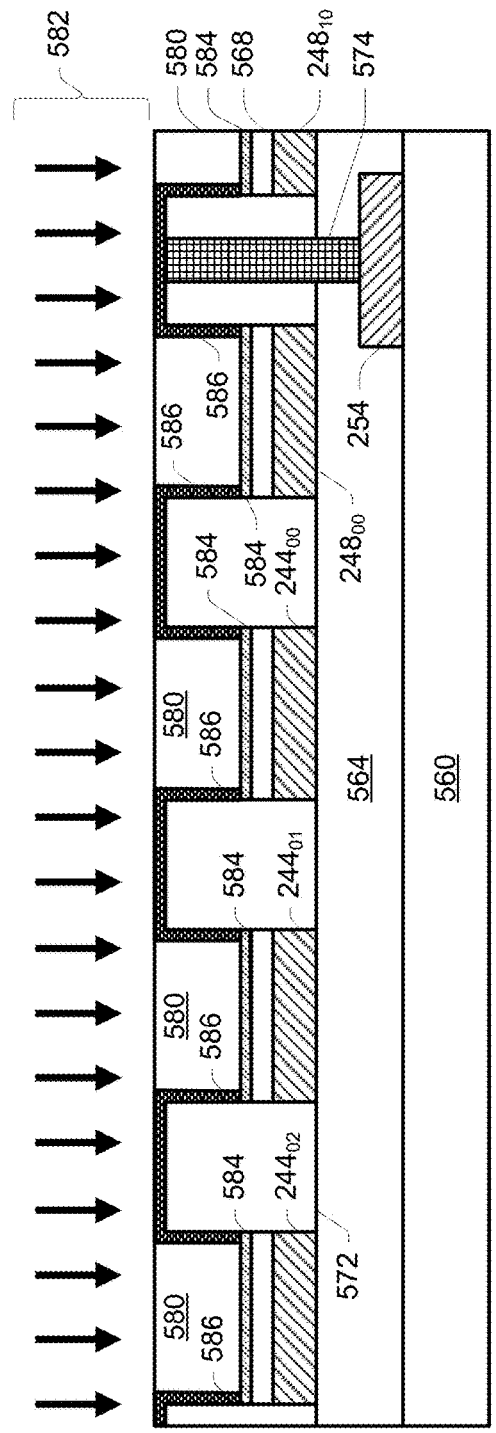
Figure 5J:
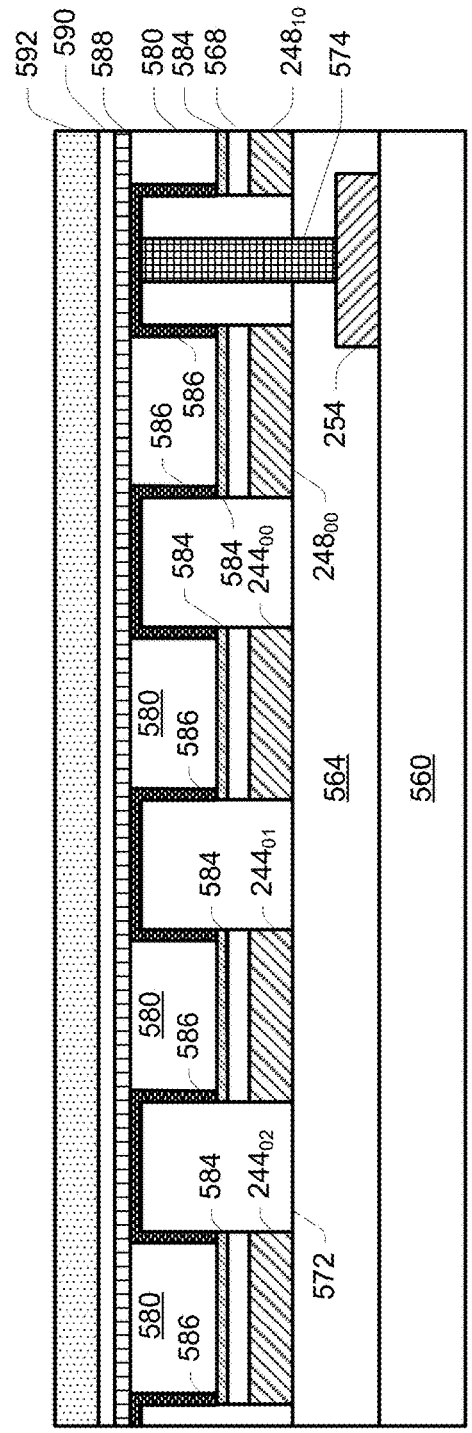
Figure 5M:
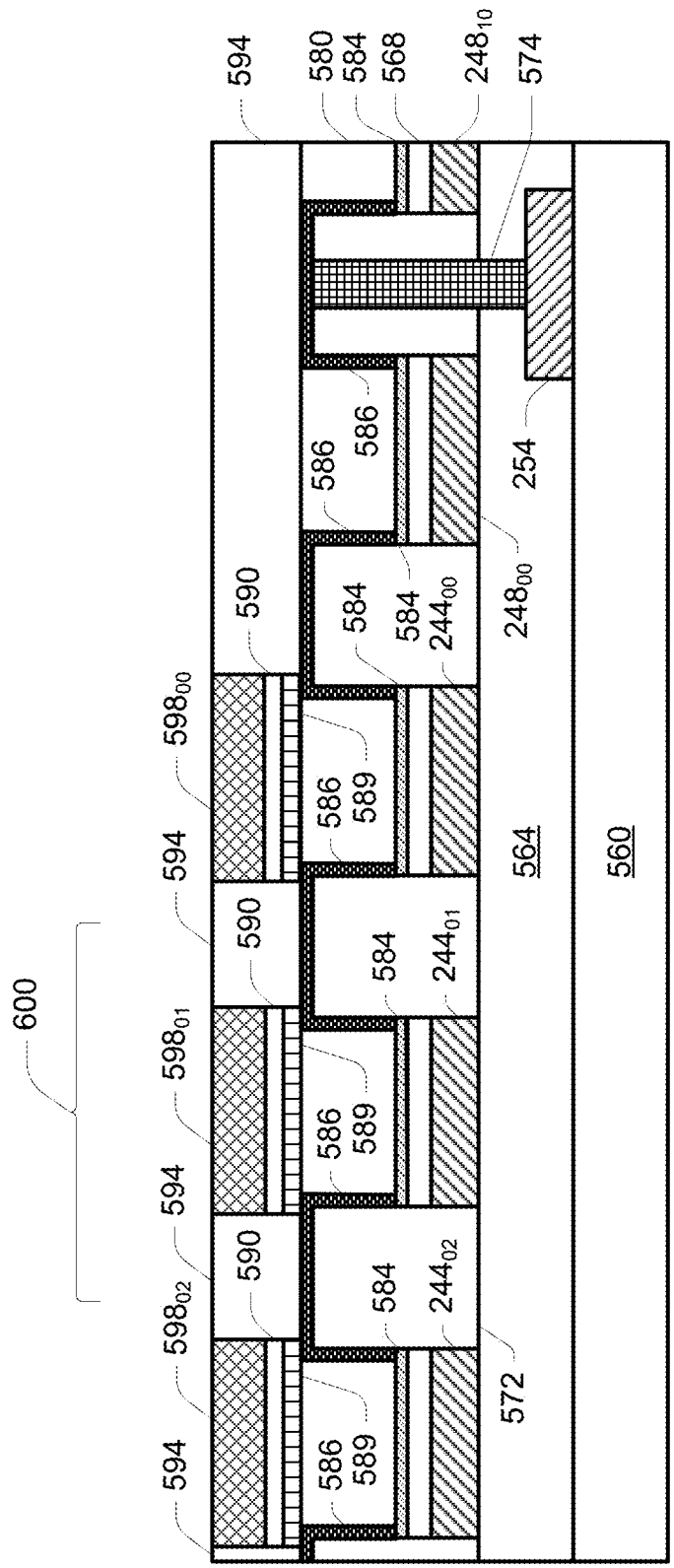
Figure 5N:
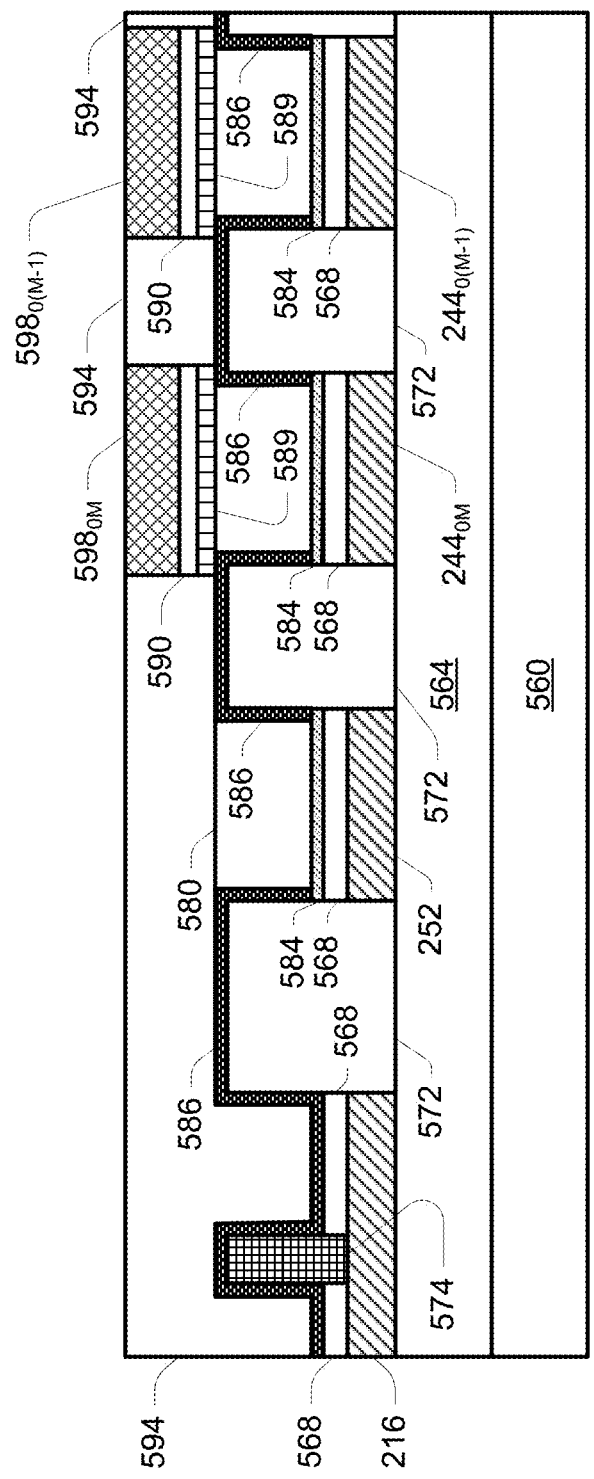

FIGS. 5A-5N depict an integrated circuit structure, such as a portion of a sense line (e.g., sense line 258 of FIG. 2A or 2B) and associated elements, during various stages of fabrication in accordance with embodiments. In FIG. 5A, a conductor 562 might be formed overlying (e.g., on) a dielectric 560. The conductor 562 might be formed of one or more conductive materials. The conductor 562 might comprise, consist of, or consist essentially of conductively doped polysilicon and/or might comprise, consist of, or consist essentially of metal, such as a refractory metal, or a metal-containing material, such as a refractory metal silicide or a metal nitride, e.g., a refractory metal nitride, as well as any other conductive material. As one example, the conductor 562 might include tungsten (W) formed overlying the dielectric 560 and titanium nitride (TiN) formed overlying the tungsten. The dielectric 560 might comprise, consist of, or consist essentially of an oxide, e.g., silicon dioxide ($SiO_2$), and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. High-K dielectrics as used herein means a material having a dielectric constant greater than that of silicon dioxide. The dielectric 560 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. As one example, the dielectric 560 might contain silicon dioxide. The dielectric 560 might be formed overlying other circuitry, such as the peripheral circuitry 266 of FIG. 2C.

In FIG. 5B, the conductor 562 might be patterned to define a lower data line 254. Patterning might include forming a photolithographic mask (not depicted) overlying (e.g., on) the conductor 562 to define areas for removal, followed by a removal process, such as anisotropic etching, for example. The mask might subsequently be removed, such as by an ashing process, for example.

In FIG. 5C, a dielectric 564 might be formed overlying (e.g., on) the dielectric 560 and the lower data line 254. The dielectric 564 might contain one or more dielectric materials, e.g., dielectric materials such as described with reference to the dielectric 560. As one example, the dielectric 564 might contain silicon dioxide. A conductor 566 might be formed overlying (e.g., on) the dielectric 564. The conductor 566 might contain one or more conductive materials, e.g., conductive materials such as described with reference to the conductor 562. As one example, the conductor 566 might contain tungsten. A dielectric 568 might be formed overlying (e.g., on) the conductor 566. The dielectric 568 might contain one or more dielectric materials, e.g., dielectric materials such as described with reference to the dielectric 560. As one example, the dielectric 568 might contain silicon dioxide. As a further example, the dielectric 568 might include a structure of $SiO_2/SiN/SiO_2$, commonly referred to as ONO. A sacrificial material 570 might be formed overlying (e.g., on) the dielectric 568. The sacrificial material 570 might contain a material that can be subjected to removal without significantly affecting the material(s) of the dielectric 568. As one example, the sacrificial material 570 might contain silicon nitride (SiN).

In FIG. 5D, the conductor 566, dielectric 568 and sacrificial material 570 might be patterned to define backside gate lines $244_{00}$ to $244_{02}$, first sense select line $248_{00}$, and first select line $248_{10}$, along with instances of the dielectric 568 and sacrificial material 570 overlying each one. For example, a patterned mask might be formed overlying the sacrificial material 570 defining areas for removal, and an anisotropic removal process, e.g., reactive ion etching (RIE), might be used to define the various instances. Spaces or voids between these instances might be filled with a dielectric 572. The dielectric 572 might contain one or more dielectric materials, e.g., dielectric materials such as described with reference to the dielectric 560. As one example, silicon dioxide could be formed overlying the resulting structure after patterning, and chemical-mechanical polishing (CMP) could be used to remove any excess silicon dioxide overlying the instances of the sacrificial material 570 to produce the structure depicted in FIG. 5D.

The backside gate lines $244_{00}$ to $244_{02}$ of FIG. 5D might correspond to the backside gate lines $244_0$ to $244_2$ of FIG. 2A or 2B for a first block of memory cells. The first sense select line $248_{00}$ of FIG. 5D might correspond to the first sense select line 248 of FIG. 2A or 2B for the first block of memory cells. The first sense select line $248_{10}$ of FIG. 5D might correspond to the first sense select line 248 of FIG. 2A or 2B for a second block of memory cells sharing a connection to the same lower data line 254.

In FIG. 5E, a via might be formed, e.g., using RIE, in one of the instances of the dielectric 572 and filled with conductive material to form a contact 574 to the lower data line 254. The contact 574 might contain one or more conductive materials, e.g., conductive materials such as described with reference to the conductor 562. For one embodiment, the contact 574 might include conductively-doped polysilicon (e.g., an N+ type conductivity) formed overlying the lower data line 254 and titanium nitride (TiN) formed overlying the conductively-doped polysilicon. In FIG. 5F, the instances of the sacrificial material 570 might be removed, e.g., using an isotropic removal process, such as chemical or plasma etching, to define voids 576.

In FIG. 5G, a semiconductor 578 might be formed overlying (e.g., on), the instances of the dielectric 568, the instances of the dielectric 572, and the contact 574. The semiconductor 578 might comprise, consist of, or consist essentially of polysilicon, single-crystal silicon or amorphous silicon, as well as any other semiconductive material, such as germanium, silicon-germanium, or silicon-germanium-carbon semiconductors. The semiconductor 578 might be formed, for example, using chemical vapor deposition (CVD), low-pressure CVD (LPCVD), physical vapor deposition (PVD) or atomic layer deposition (ALD). The semiconductor might have a conductivity type, e.g., a first conductivity type. As one example, the semiconductor 578 might contain amorphous silicon. The semiconductor 578 might be doped during or following formation. As one example, the semiconductor 578 might be a p-type semiconductor. For example, diborane ($B_2H_6$) might be added to the reaction gases of a CVD process to form the amorphous silicon in order to incorporate sufficient boron into the semiconductor 578 to achieve a desired threshold voltage of a future pass gate 238, e.g., a dopant concentration of $1E18/cm^3$. As an alternate example, the semiconductor 578 might be an n-type semiconductor. For example, phosphine ($PH_3$) might be added to the reaction gases of a CVD process to form the amorphous silicon in order to incorporate sufficient phosphorus into the semiconductor 578 to achieve a desired threshold voltage of a future pass gate 238, e.g., a dopant concentration of $5E18/cm^3$. Although not depicted, the semiconductor 578 might be patterned to define a future sense line 258.

In FIG. 5H, instances of a dielectric 580 might be formed overlying (e.g., on) the semiconductor 578 and filling the voids 576. The dielectric 580 might contain one or more dielectric materials, e.g., dielectric materials such as described with reference to the dielectric 560. As one example, silicon dioxide could be formed overlying the semiconductor 578, and chemical-mechanical polishing (CMP) could be used to remove any excess silicon dioxide overlying the semiconductor 578 to produce the structure depicted in FIG. 5H.

In FIG. 5I, portions of the semiconductor 578 might be conductively doped using a dopant impurity of a second conductivity type, which might be the same or different than the first conductivity type, e.g., to form source/drain regions. For purposes herein, a dopant impurity is an ion, element or molecule, or some combination of ions, elements and/or molecules, added to the semiconductor 578 to impart bulk conductivity to affected portions. Such doping might involve the acceleration of the dopant impurity, as depicted conceptually by arrows 582. As one example, the dopant impurity might be an n-type impurity, such as ions of arsenic (As), antimony (Sb), phosphorus (P) or another n-type impurity. Examples of such doping processes might include plasma doping (PLAD) and/or beam-line implantation. An anneal process might be used to diffuse the implanted dopant impurity within portions of the semiconductor 578 not covered by the dielectric 580, thereby defining instances of semiconductor (e.g., channels) 584 having the first conductivity type and instances of conductively-doped semiconductor 586 having the second conductivity type. For example, an instance of semiconductor 584 overlying a backside gate line 244 or sense select line 248 might form one channel region for a future pass gate 238 or first sense select gate 246, respectively, having the backside gate line 244 or sense select line 248, respectively, as its control gate and a corresponding instance of the dielectric 568 as its gate dielectric. Continuing with the example, instances of the conductively-doped semiconductor 586 on either side of that backside gate line 244 or sense select line 248 might form source/drain regions for that pass gate 238 or first sense select gate 246, respectively. It is noted that the doping level of the instances of conductively-doped semiconductor 586 might be one or more orders of magnitude higher than the doping level of the instances of semiconductor 584. As one example having a semiconductor 578 having a p-type conductivity, the doping level of the instances of conductively-doped semiconductor 586 might be $3E19/cm^3$ compared to a doping level of the instances of semiconductor 584 of $1E18/cm^3$. For other embodiments, such as embodiments having a semiconductor 578 having an n-type conductivity, additional doping might be eliminated, such that the doping level of the instances of semiconductor 586 and the doping level of the instances of semiconductor 584 might each remain at $5E18/cm^3$ and of the same conductivity type. For such embodiments, a dielectric 568 having an ONO or similar charge trap structure might allow for programming to adjust a threshold voltage of the pass gate 238.

In FIG. 5J, a semiconductor 588 might be formed overlying (e.g., on) the instances of dielectric 580 and the exposed portions of the instances of conductively-doped semiconductor 586. The semiconductor 588 might comprise, consist of, or consist essentially of polysilicon, single-crystal silicon or amorphous silicon, as well as any other semiconductive material, such as germanium, silicon-germanium, or silicon-germanium-carbon semiconductors. The semiconductor 588 might be formed such as described with reference to the semiconductor 578, and might have the same conductivity type, e.g., the first conductivity type, or a different conductivity type, e.g., the second conductivity type. As one example, the semiconductor 588 might be an p-type amorphous silicon. For other embodiments, the semiconductor 588 might be an n-type amorphous silicon. For some embodiments, the semiconductor 588 might have a doping level of $5E18/cm^3$. Where the semiconductor 588 and the conductively-doped semiconductor 586 have the same conductivity type, the resulting transistor might be a depletion mode or normally-on transistor. Where the semiconductor 588 and the conductively-doped semiconductor 586 have different conductivity types, the resulting transistor might be an enhancement mode or normally-off transistor, or a depletion mode or normally-on transistor. For some embodiments, the semiconductor 588 might be formed prior to the doping described with reference to FIG. 5I, and may receive doping concurrently with the conductively-doped semiconductor 586. As used herein, a first act and a second act occur concurrently when the first act occurs simultaneously with the second act for at least a portion of a duration of the second act.

A dielectric 590 might be formed overlying (e.g., on) the semiconductor 588. The dielectric 590 might contain one or more dielectric materials, e.g., dielectric materials such as described with reference to the dielectric 560. As one example, the dielectric 590 might contain silicon dioxide. Alternatively, or in addition, the dielectric 590 might contain a high-K dielectric. A sacrificial material 592 might be formed overlying (e.g., on) the dielectric 590. The sacrificial material 592 might contain a material that can be subjected to removal without significantly affecting the material(s) of the dielectric 590. For one example, the sacrificial material 592 might contain silicon nitride (SiN).

In FIG. 5K, the semiconductor 588, dielectric 590 and sacrificial material 592 might be patterned to define instances of semiconductor (e.g., channels) 589, along with instances of the dielectric 590 and sacrificial material 592 overlying each one. For example, a patterned mask might be formed overlying the sacrificial material 592 defining areas for removal, and an anisotropic removal process, e.g., reactive ion etching (REI), might be used to define the various instances. Spaces or voids between these instances might be filled with a dielectric 594. The dielectric 594 might contain one or more dielectric materials, e.g., dielectric materials such as described with reference to the dielectric 560. As one example, silicon dioxide could be formed overlying the resulting structure, and chemical-mechanical polishing (CMP) could be used to remove any excess silicon dioxide overlying the instances of the sacrificial material 592 to produce the structure depicted in FIG. 5K. For some embodiments, exposed portions of the conductively-doped semiconductor 586 may receive additional doping of a same conductivity type prior to forming the dielectric 594.

In FIG. 5L, the instances of the sacrificial material 592 might be removed, e.g., using an isotropic removal process, such as chemical or plasma etching, to define voids 596. In FIG. 5M, plugs $598_{00}$ to $598_{02}$ might be formed in the voids 596. As one example, conductive material (e.g., titanium nitride over tungsten) could be formed overlying (e.g., on) the instances of the dielectric 590 and the instances of the dielectric 594 to fill the voids 596, and CMP could be used to remove any excess conductive material overlying the instances of the dielectric 594 to produce the structure depicted in FIG. 5M. The plugs 598 might be formed of a material selected to act as a stop layer during subsequent processing as described with reference to FIG. 6B, and may be sacrificial and removed during subsequent processing, such as described with reference to FIG. 6C. The bracket 600 identifies a portion of the integrated circuit structure of FIG. 5M that might be depicted in FIGS. 6A-6F.

While FIGS. 5A-5M depicted an integrated circuit structure that might correspond to a portion of a sense line (e.g., sense line 258 of FIG. 2A or 2B) and associated elements at an end adjacent a lower data line 254, FIG. 5N might depict another portion of that sense line (e.g., sense line 258 of FIG. 2A or 2B) and associated elements at an opposing end, e.g., an end adjacent a common source 216. The structure of FIG. 5N might be formed concurrently with the structure of FIG. 5M, and depicts backside gate lines $244_{0(M-1)}$ and $244_{0M}$ and corresponding plugs $598_{0(M-1)}$ and $598_{0M}$, respectively, a second select line 252, and a common source 216 and its connection to an instance of conductively-doped semiconductor 586 through a conductive contact 574. The common source 216 and second sense select line 252 might be formed from the conductor 566 (e.g., as in FIGS. 5C-5D) concurrently with the first sense select line 248 and the backside gate lines 244.

FIGS. 6A-6F depict an integrated circuit structure, which might correspond to a portion of a unit column structure 256 of FIG. 2A or 2B during various stages of fabrication in accordance with additional embodiments. FIGS. 6A-6F might be used to depict further processing following formation of the structure of FIG. 5M, for example. It will be understood that FIGS. 6A-6F could equally apply to the formation of a dummy unit column structure 257, where the backside gate line $244_X$ of FIGS. 6A-6F is instead a dummy backside gate line 260.

Figure 6A:
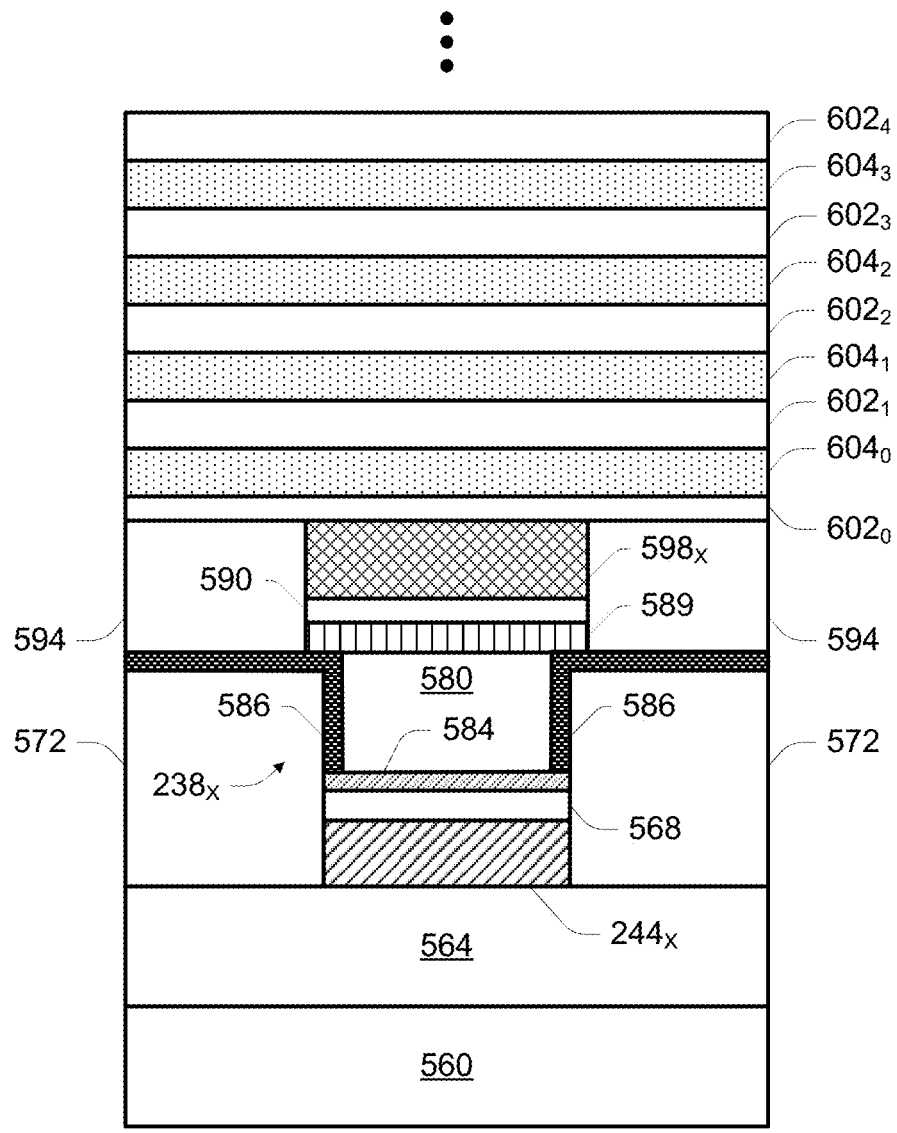
FIGS. 6A-6F depict an integrated circuit structure during various stages of fabrication in accordance with additional embodiments.

In FIG. 6A, the backside gate line $244_X$ might correspond to a second control gate 242 of a pass gate $238_X$, where X might be any integer value from zero to M, with a number of unit column structures 256 associated with a sense line 258 being equal to M+1. The pass gate $238_X$ might further include channels formed of the semiconductors 584 and 589, gate dielectrics formed of the dielectrics 568 and 590, and source/drain regions formed of the conductively-doped semiconductors 586. A first control gate 240 of the pass gate $238_X$ might not yet be formed, but its future location might correspond to the location of the plug $598_X$.

In FIG. 6A, instances of a dielectric 602 (e.g., $602_0$ to $602_4$) and instances of a sacrificial material 604 (e.g., $604_0$ to $604_3$) might be formed in an alternating manner overlying (e.g., on) the plug $598_X$ and the dielectric 594. The instances of the dielectric 602 might each contain one or more dielectric materials, e.g., dielectric materials such as described with reference to the dielectric 560. As one example, the instances of the dielectric 602 might contain silicon dioxide. The instances of the sacrificial material 604 might contain a material that can be subjected to removal without significantly affecting the material(s) of the dielectric 602. As one example, the instances of the sacrificial material 604 might contain silicon nitride. Additional instances of the dielectric 602 and instances of the sacrificial material 604 might be formed, depending upon the number of transistors intended to be formed, e.g., memory cells, GIDL generator gates, select gates and capacitances, for a future unit column structure. While all intended instances of the dielectric 602 and instances of the sacrificial material 604 might be formed before proceeding to the processing of FIG. 6B, typical processing of such stacked structures might be performed in stages as the aspect ratio of the via 606 might become too large to form the entire structure reliably as a contiguous entity.

Figure 6B:
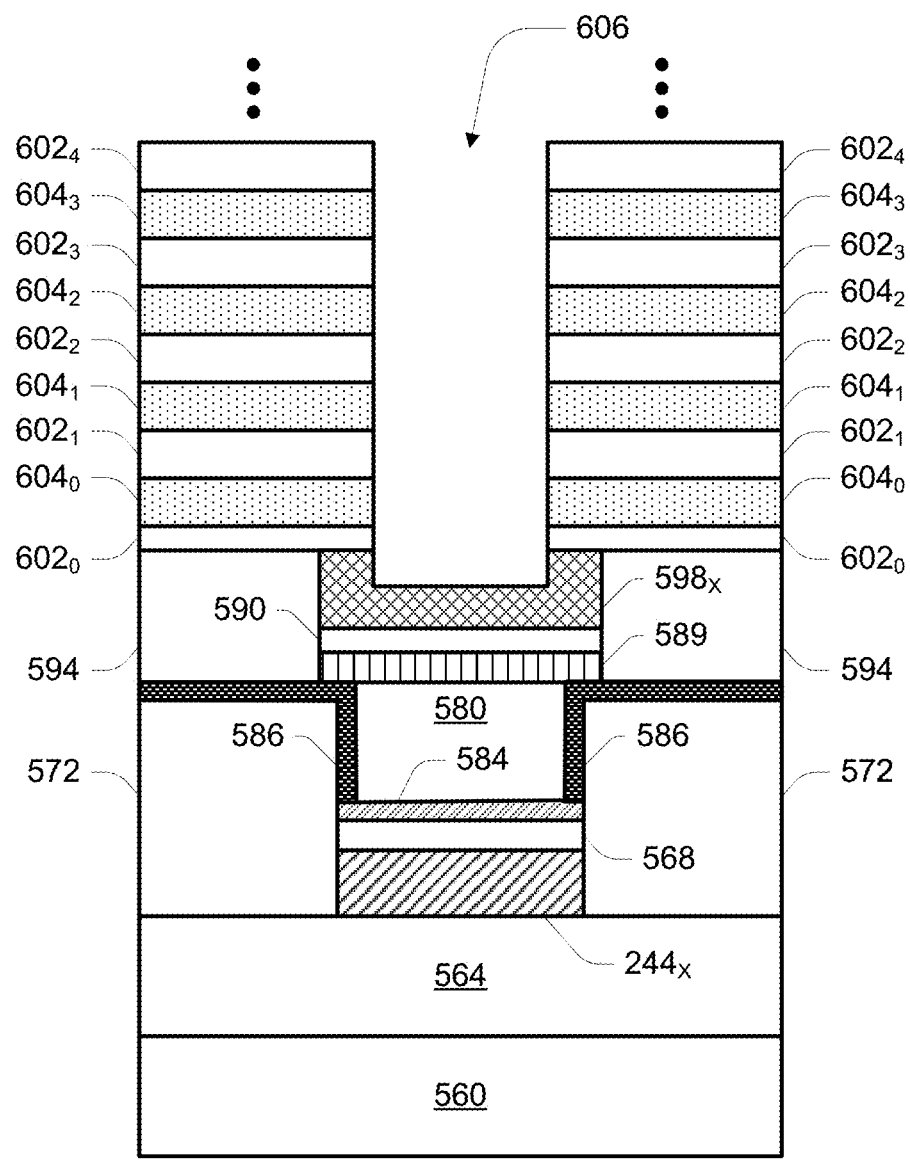

In FIG. 6B, a via 606 might be formed through the instances of the dielectric 602 and the instances of the sacrificial material 604, using the plug $598_X$ as a stop. For example, an anisotropic removal process, e.g., RIE, might be used with the plug $598_X$ acting as an etch stop. As such, the via 606 might extend to the surface of the plug $598_X$ or below.

Figure 6C:
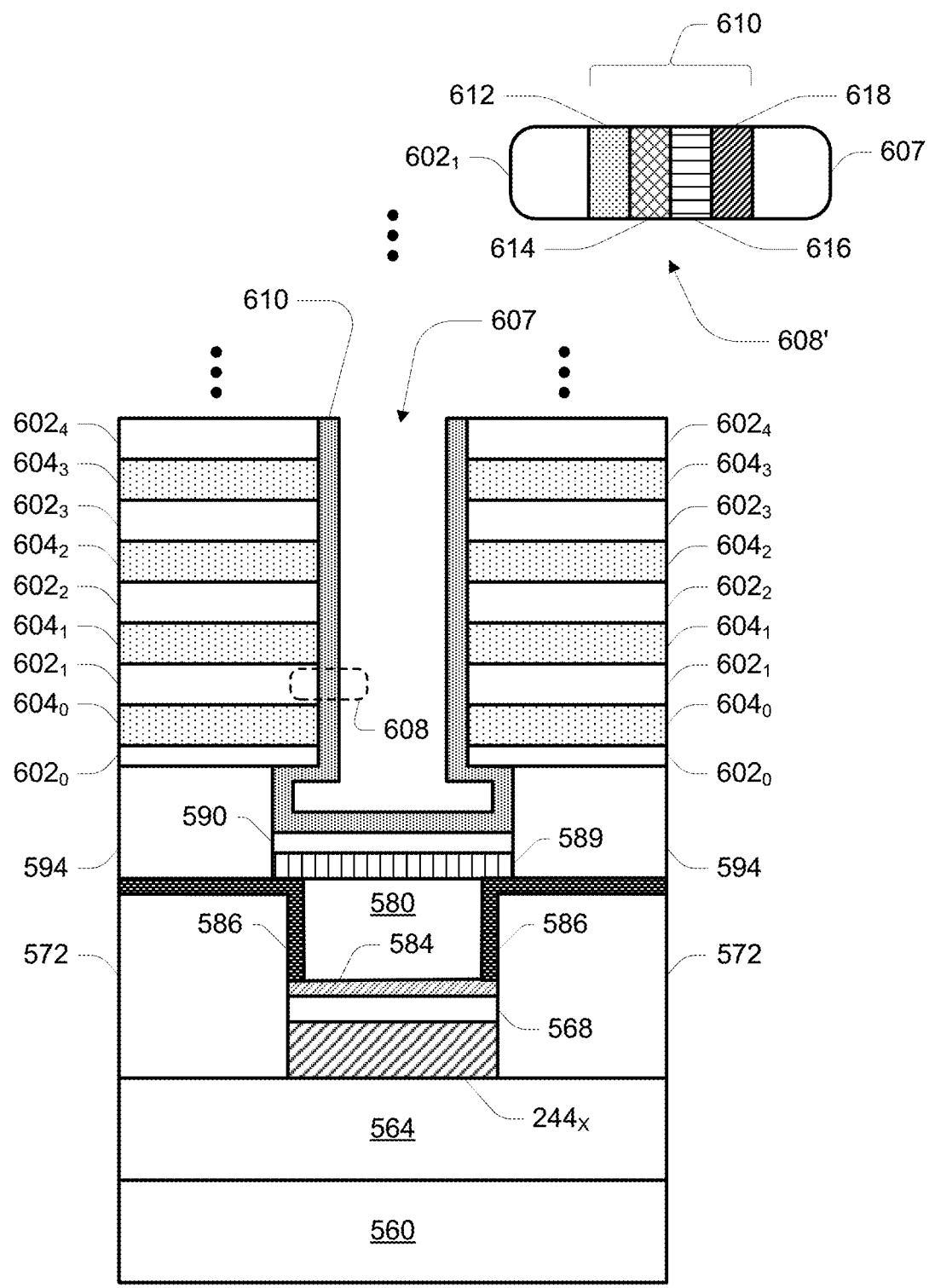

In FIG. 6C, the plug $598_X$ might be removed following formation of the via 606 to complete a void 607. A channel material structure 610 might be formed to line the sidewalls of the void 607, e.g., formed along the sidewalls of the instances of the dielectric 602 and the instances of the sacrificial material 604, as well as along sidewalls of the dielectric 594 and a surface (e.g., upper surface) of the dielectric 590. For some embodiments, the dielectric 590 might also be removed prior to forming the channel material structure 610, and portions of the channel material structure 610 could function as a gate dielectric to the resulting pass gate 238.

The portion 608 of the channel material structure 610 is depicted in further detail in the expanded portion 608'. As depicted, the channel material structure 610 might include a charge-blocking material 612 formed to line the void 607, a charge-storage material 614 might be formed on the charge-blocking material 612, a dielectric (e.g., gate dielectric) 616 might be formed on the charge-storage material 614, and a channel material (e.g., a semiconductor) 618 might be formed on the dielectric 616. The charge-storage material 614 might contain a dielectric or conductive charge-storage material. The charge-storage material 614 might further contain both dielectric and conductive materials, e.g., conductive nano-particles in a dielectric bulk material. For charge-storage material 614 containing a conductive material as its bulk, or contiguous, structure, resulting memory cells might typically be referred to as floating-gate memory cells. For charge-storage material 614 containing a dielectric material as its bulk, or contiguous, structure, resulting memory cells might typically be referred to as charge-trap memory cells. For one embodiment, the charge-blocking material 612, charge-storage material 614 and dielectric 616 might form an ONO structure. The channel material 618 might be a portion of a contiguous semiconductor structure for each transistor of the future unit column structure, or might otherwise be electrically connected, which might include selectively electrically connected, to channels of each transistor of the future unit column structure.

The charge-blocking material 612 might function as a charge-blocking node for future memory cells and other transistors of the unit column structure having a same structure, and might include one or more dielectric materials, such as described with reference to the dielectric 560. For example, the charge-blocking material 612 might include a high-K dielectric material. The charge-storage material 614 might function as a charge-storage node for future memory cells and other transistors of the unit column structure having a same structure, and might include one or more conductive or dielectric materials capable of storing a charge. For example, the charge-storage material 614 might include polysilicon, which might be conductively doped. The dielectric 616 might function as a gate dielectric for future memory cells and other transistors of the unit column structure having a same structure, and might include one or more dielectric materials such as described with reference to the dielectric 568. For example, the dielectric 568 might include silicon dioxide. The channel material 618 might function as a channel for future memory cells and other transistors of the unit column structure having a same structure, and might include one or more semiconductors such as described with reference to the semiconductor 578.

Figure 6D:
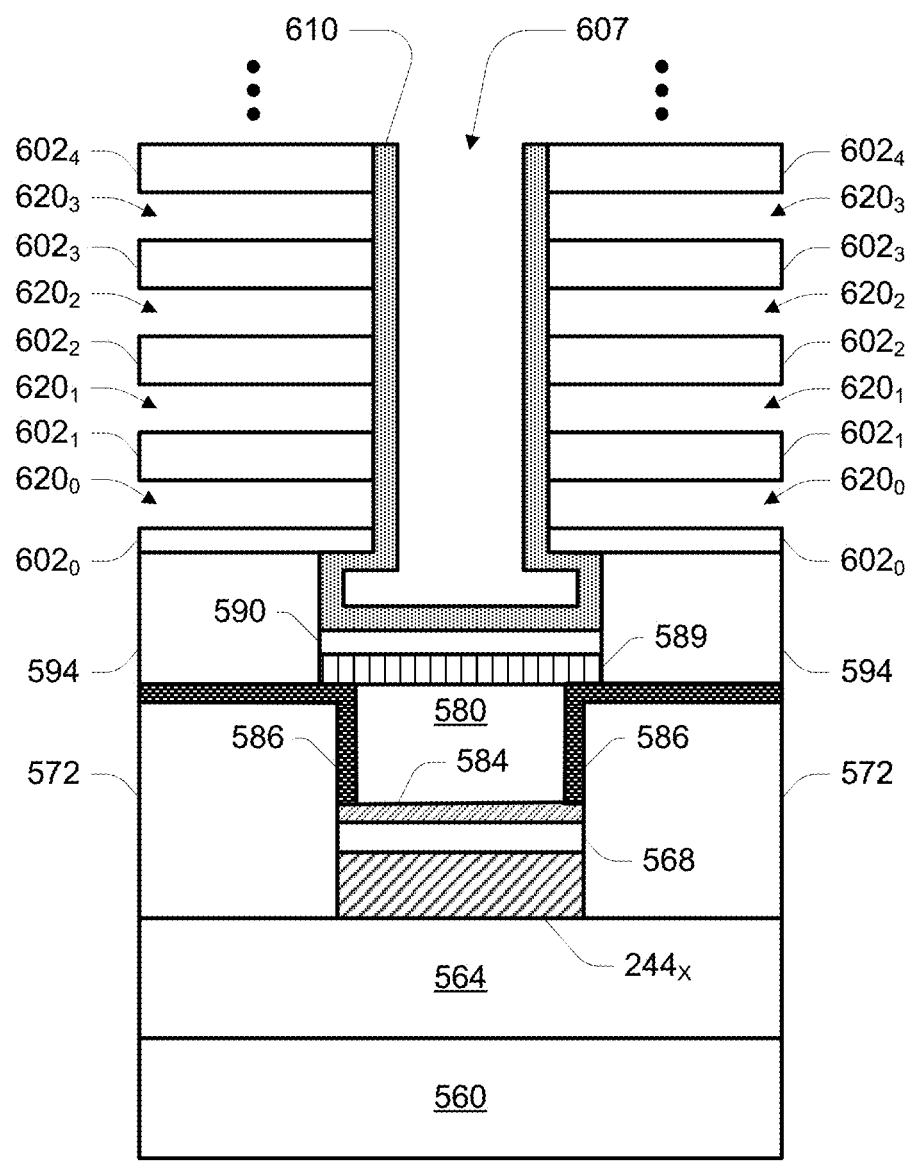
Figure 6E:
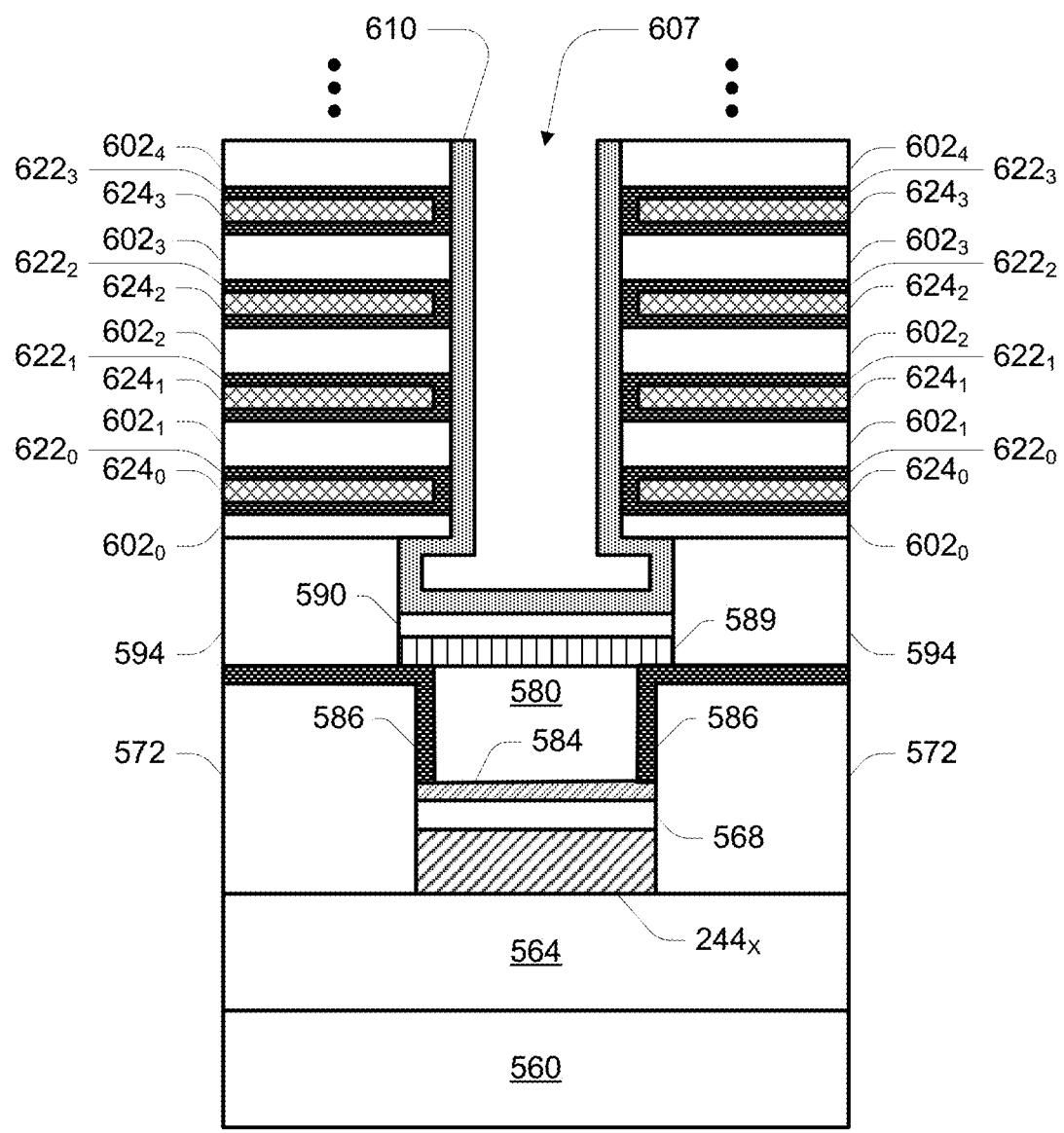

In FIG. 6D, the instances of sacrificial material 604 might be removed to define voids 620, e.g., voids $620_0$ to $620_3$. The removal might include an isotropic removal process, e.g., a plasma etching process. In FIG. 6E, instances of an optional charge-blocking material 622, e.g., instances of charge-blocking material $622_0$-$622_3$, might be formed to line the voids 620, e.g., voids $620_0$ to $620_3$, respectively. The instances of charge-blocking material 622 might include one or more dielectric materials, such as described with reference to the dielectric 560, and might include a high-K dielectric material. For embodiments with the charge-blocking material 612, the instances of charge-blocking material 622 might function as an additional charge-blocking material of a charge-blocking node for future memory cells and other transistors of the unit column structure having a same structure. For embodiments without the charge-blocking material 612, the instances of charge-blocking material 622 might function individually as a charge-blocking node for future memory cells and other transistors of the unit column structure having a same structure. For embodiments with the charge-blocking material 612, and without the instances of charge-blocking material 622, the charge-blocking material 612 might function individually as a charge-blocking node for future memory cells and other transistors of the unit column structure having a same structure. Instances of a conductor 624, e.g., instances of a conductor $624_0$ to $624_3$, might be formed to fill the voids 620, e.g., voids $620_0$ to $620_3$, respectively. The instances of the conductor 624 might contain one or more conductive materials, e.g., conductive materials such as described with reference to the conductor 562.

A transistor might be formed at each intersection of an instance of the conductor 624 and the channel material 618, where an instance of the conductor 624 might function as a control gate of the transistor, adjacent channel material 618 might function as a channel of the transistor, and an instance of charge-blocking material 622 and/or charge-blocking material 612, charge-storage material 614, and dielectric 616 between the instance of the conductor 624 and the adjacent channel material 618 might function as a charge-blocking node, charge-storage node and gate dielectric, respectively, of that transistor. Such transistors could include memory cells 208, GIDL generator gates 220, upper select gates 212, lower select gates 210, and/or capacitances 226 for a future unit column structure, for example. The channel material 618 adjacent the dielectric 590 might function as the first control gate 240 of a pass gate 238 having the semiconductor 589 as its channel and the dielectric 590 as its gate dielectric, for example.

Figure 6F:
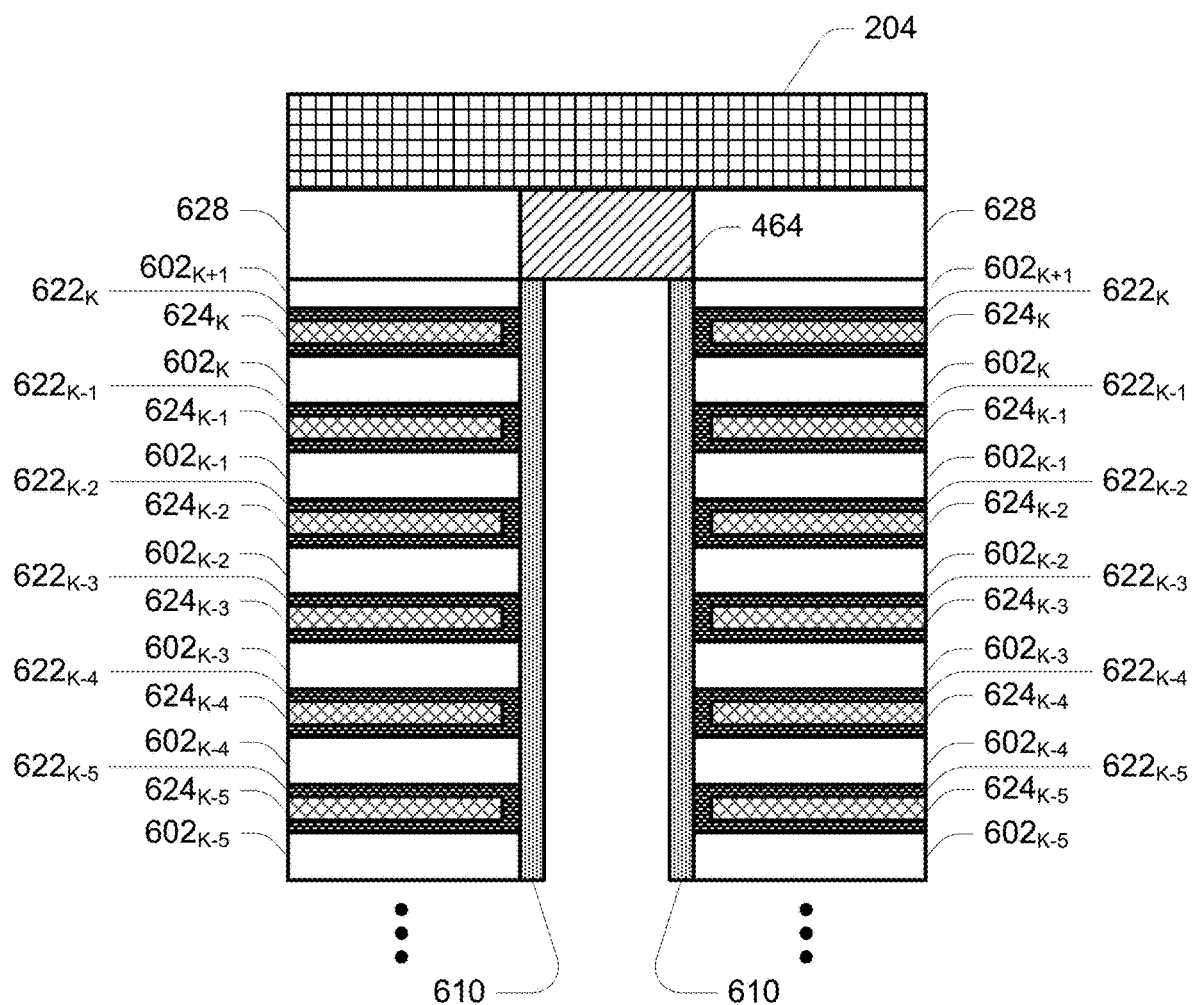

FIG. 6F might depict an opposing end of the portion of a unit column structure depicted in FIG. 6E. For example, while FIG. 6E might depict an end of a unit column structure nearest an associated pass gate 238, FIG. 6F might depict an end of that unit column structure nearest an associated upper data line 204. FIG. 6F might depict further alternating instances of the dielectric 602, e.g., instances of dielectric $602_{K-5}$ to $602_{K+1}$, instances of charge-blocking material 622, e.g., instances of charge-blocking material $622_{K-5}$ to $622_K$, and instances of conductor 624, e.g., instances of conductor $624_{K-5}$ to $624_K$, where K might equal a total number of memory cells 208 (including any dummy memory cells), GIDL generator gates 220, upper select gates 212, lower select gates 210, and capacitances 226 in a unit column structure, minus 1. The channel material structure 610 depicted in FIG. 6F might be contiguous with the channel material structure 610 depicted in FIG. 6E. The upper data line 204 might be connected to the channel material 618 of the channel material structure 610 through a contact 464. The contact 464 might contain one or more conductive materials, e.g., conductive materials such as described with reference to the conductor 562. For some embodiments, the contact 464 might contain an $n^+$-type conductively-doped polysilicon. For other embodiments, the contact 464 might include an $n^+$-type conductively-doped polysilicon formed overlying the channel material structure 610, titanium nitride (TiN) formed overlying the $n^+$-type conductively-doped polysilicon, and tungsten (W) formed overlying the titanium nitride. For further embodiments, the upper portion of the channel material 618 of the channel material structure 610 might be doped to an $n^+$-type conductivity, and the contact 464 might include titanium nitride (TiN) formed overlying the channel material structure 610, and tungsten (W) formed overlying the titanium nitride. While FIGS. 6A-6F depicted an example method of forming a plurality of series-connected and stacked transistors, each corresponding to a respective conductor $624_0$ to $624_K$, other methods of forming such transistors, as well as other transistor structures whose channel material could function as an electrode of a capacitor, could be used with various embodiments.

It is noted that the channel material 618 of a unit column structure, such as depicted in FIGS. 6A-6F, is dead-headed at the bottom of the void 607. As such, the channels of the various transistors of the unit column structure might be selectively connected to only one voltage node, e.g., an upper data line 204, for sourcing or sinking a current to those channels, and would be electrically floating (e.g., permanently electrically floating) but for its connection (e.g., selective connection) to an upper data line 204. This is in stark contrast to a traditional NAND structure where the channel of the memory cells could be selectively connected to voltage nodes at both ends of the string of series-connected memory cells, e.g., selectively connected to a data line at one end and selectively connected to a source at the other end.

Figure 7A:
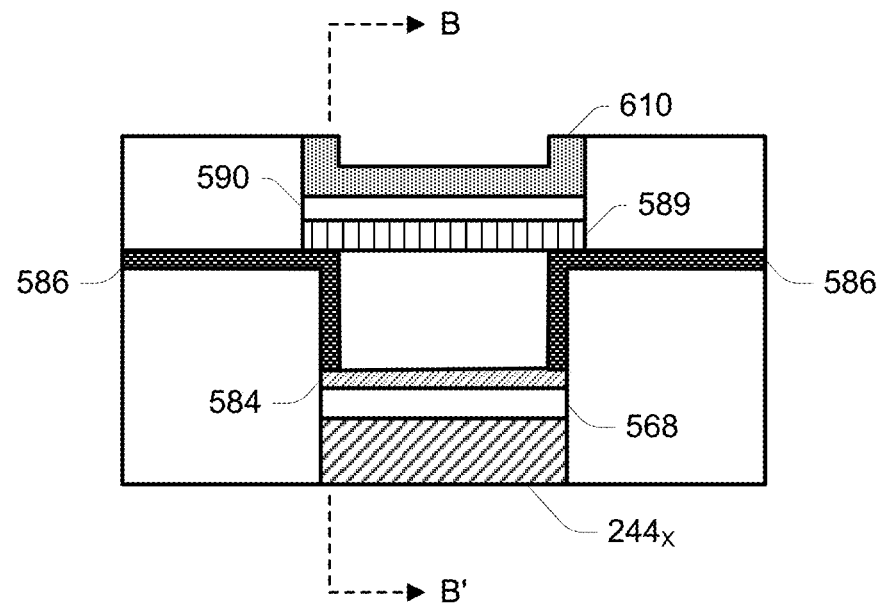
FIGS. 7A-7J depict orthogonal views of various structures for sense lines in accordance with embodiments.
Figure 7B:
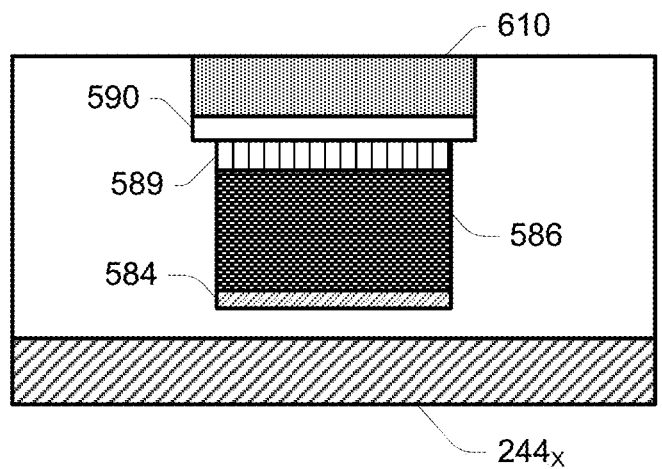
Figure 7C:
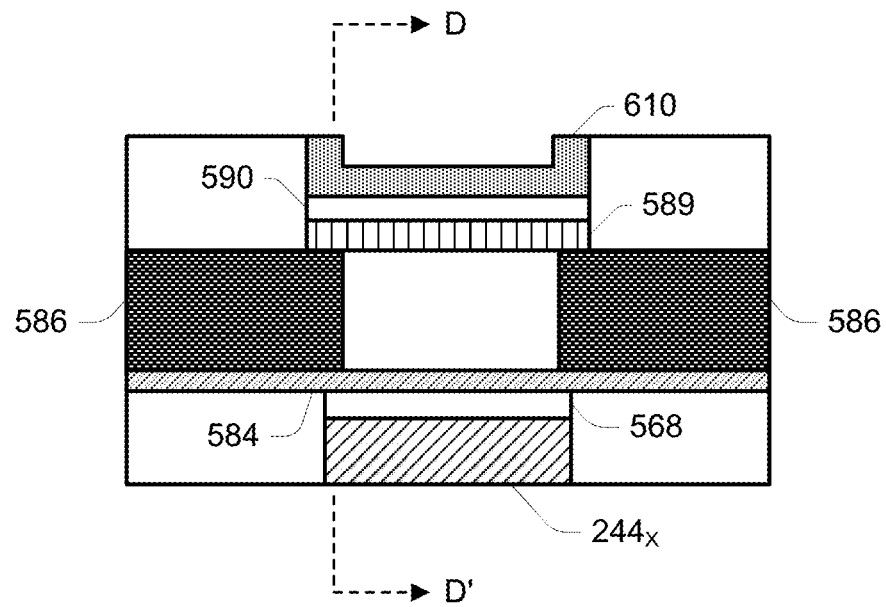
Figure 7D:
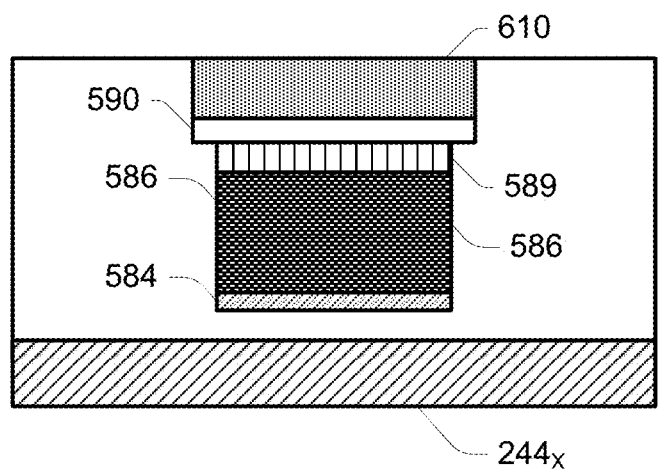
Figure 7E:
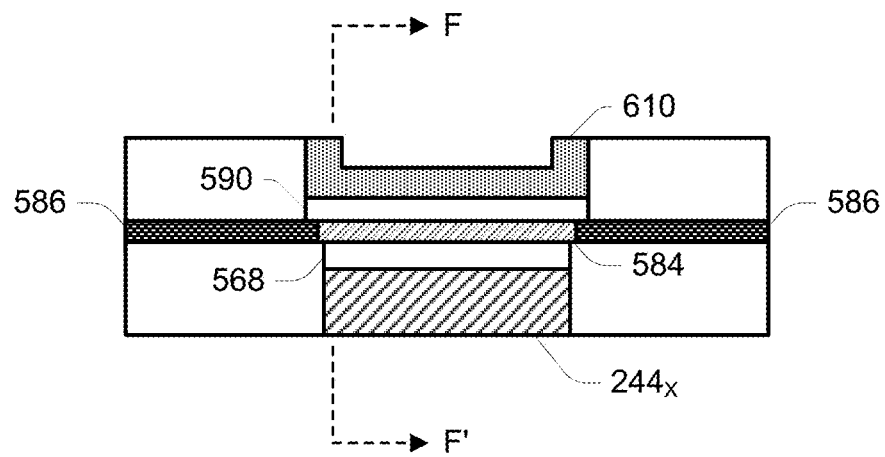
Figure 7F:
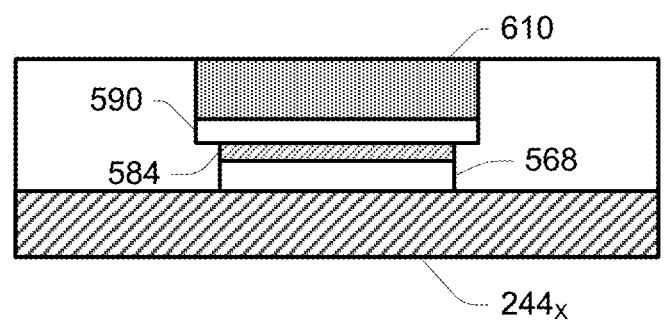
Figure 7G:
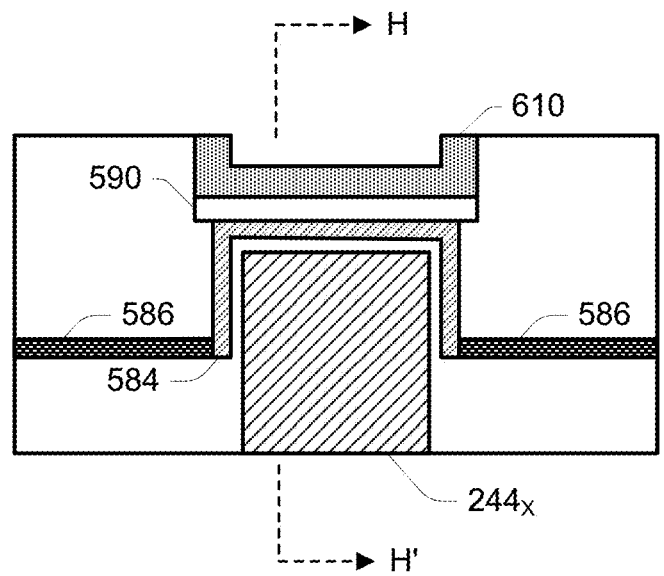
Figure 7H:
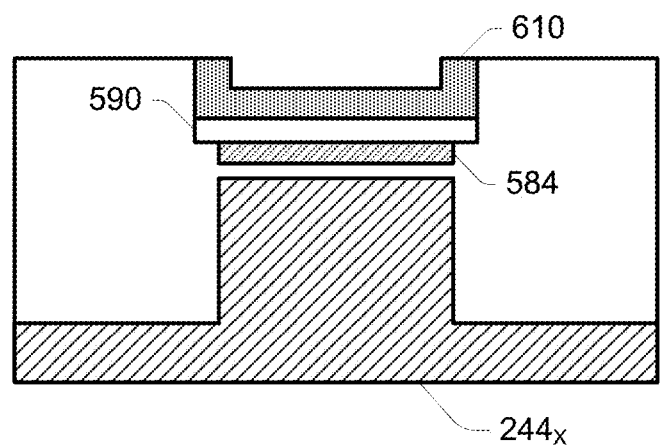
Figure 7I:
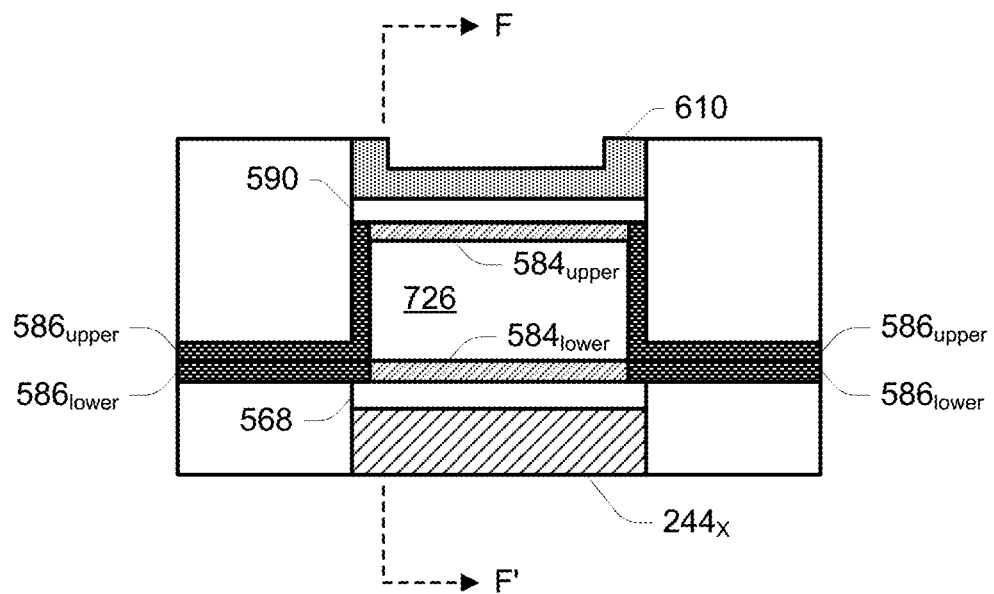
Figure 7J:
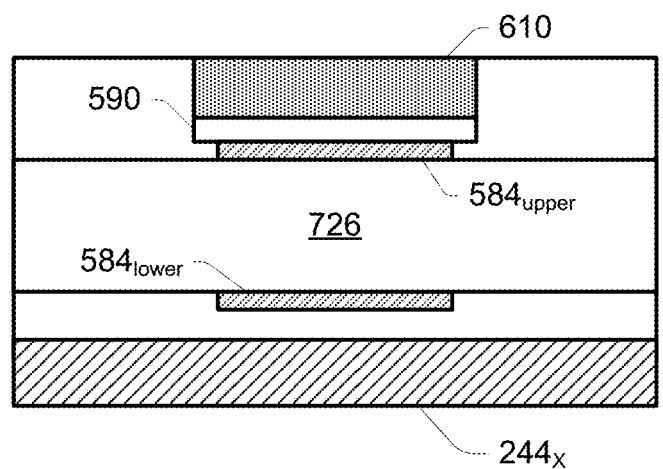

FIGS. 7A-7J depict orthogonal views of various structures for sense lines in accordance with embodiments. FIG. 7B depicts a view of the structure of FIG. 7A taken along line B-B'. FIG. 7D depicts a view of the structure of FIG. 7C taken along line D-D'. FIG. 7F depicts a view of the structure of FIG. 7E taken along line F-F'. FIG. 7H depicts a view of the structure of FIG. 7G taken along line H-H'. FIG. 7J depicts a view of the structure of FIG. 7I taken along line J-J'.

While the semiconductor 588 was patterned concurrently with the dielectric 590 and sacrificial material 592 to define an instance of semiconductor 589 to have the same footprint as a corresponding future channel material structure 610, FIGS. 7A and 7B depict an example where the semiconductor 588 first might be patterned concurrently with the semiconductor 578, and then patterned again concurrently with the dielectric 590 and sacrificial material 592. In this manner, the physical width of the semiconductor 589 (e.g., a distance left to right in FIG. 7B) might be the same as the semiconductor 584 and conductively-doped semiconductor 586 for a given pass gate 238. The physical length of the semiconductor 589 (e.g., a distance left to right in FIG. 7A) might be different than the physical length of the semiconductor 584, but may provide a similar electrical channel length as the semiconductor 584 due to the conductivity level of the conductively-doped semiconductor 586.

In FIGS. 7C and 7D, the semiconductor 578 might be formed as a flat layer instead of a serpentine layer as depicted in FIG. 5G. The conductively-doped semiconductor 586 could be formed overlying the semiconductor 578 as an additional layer of semiconductor material, e.g., conductively-doped polysilicon, and subsequently patterned to define blocks of conductively-doped semiconductor 586 as depicted in FIGS. 7C and 7D. These blocks of conductively-doped semiconductor 586 might act as source/drain regions of a pass gate 238, and may extend to a next pass gate 238 or to a first sense select gate 246 or a second sense select gate 250. Patterning of a semiconductor 588 to define an instance of semiconductor 589 might be performed as described with reference to FIGS. 7A and 7B to produce the structure depicted in FIGS. 7C and 7D. The added bulk of the conductively-doped semiconductor 586 in FIGS. 7C-7D might mitigate the risk of damage to the conductively-doped semiconductor 586 during patterning of the semiconductor 588 to form the semiconductor 589 relative to the embodiment of FIGS. 7A-7B.

In FIGS. 7E and 7F, the semiconductor 578 might be formed as a flat layer instead of a serpentine layer as depicted in FIG. 5G, and selectively conductively doped to define the instances of the semiconductor 584 and conductively-doped semiconductor 586. An instance of the semiconductor 584 might serve as a channel for both control gates of a resulting pass gate 238, e.g., without formation of a semiconductor 589.

In FIGS. 7G and 7H, the semiconductor 578 might be formed around raised portions of the backside gate line 244X, and selectively conductively doped to define the instances of the semiconductor 584 and conductively-doped semiconductor 586. An instance of the semiconductor 584 might serve as a channel for both control gates of a resulting pass gate 238, e.g., without formation of a semiconductor 589.

In FIGS. 7I and 7J, the two channels of a pass gate 238 might be formed of separate contiguous semiconductor materials. For example, the processing of FIGS. 5C and 5D might proceed without forming the sacrificial material 570, and an instance of semiconductor 578 might be formed after patterning the conductor 566 and the dielectric 568, and forming the dielectric 572, to be overlying the instances of the dielectric 568 and the dielectric 572. This instance of semiconductor 578 might be selectively conductively doped to define the instances of the semiconductor $584_{lower}$ and conductively-doped semiconductor $586_{lower}$. A dielectric might then be formed overlying the instances of the semiconductor $584_{lower}$ and conductively-doped semiconductor $586_{lower}$, and patterned to define an instance of dielectric 726 for each pass gate 238. Another instance of semiconductor 578 might then be formed overlying the dielectric 726 and the exposed instances of conductively-doped semiconductor 586. This instance of semiconductor 578 might be selectively conductively doped to define the instances of the semiconductor $584_{upper}$ and conductively-doped semiconductor $586_{upper}$.

Figures 8A, 8B:
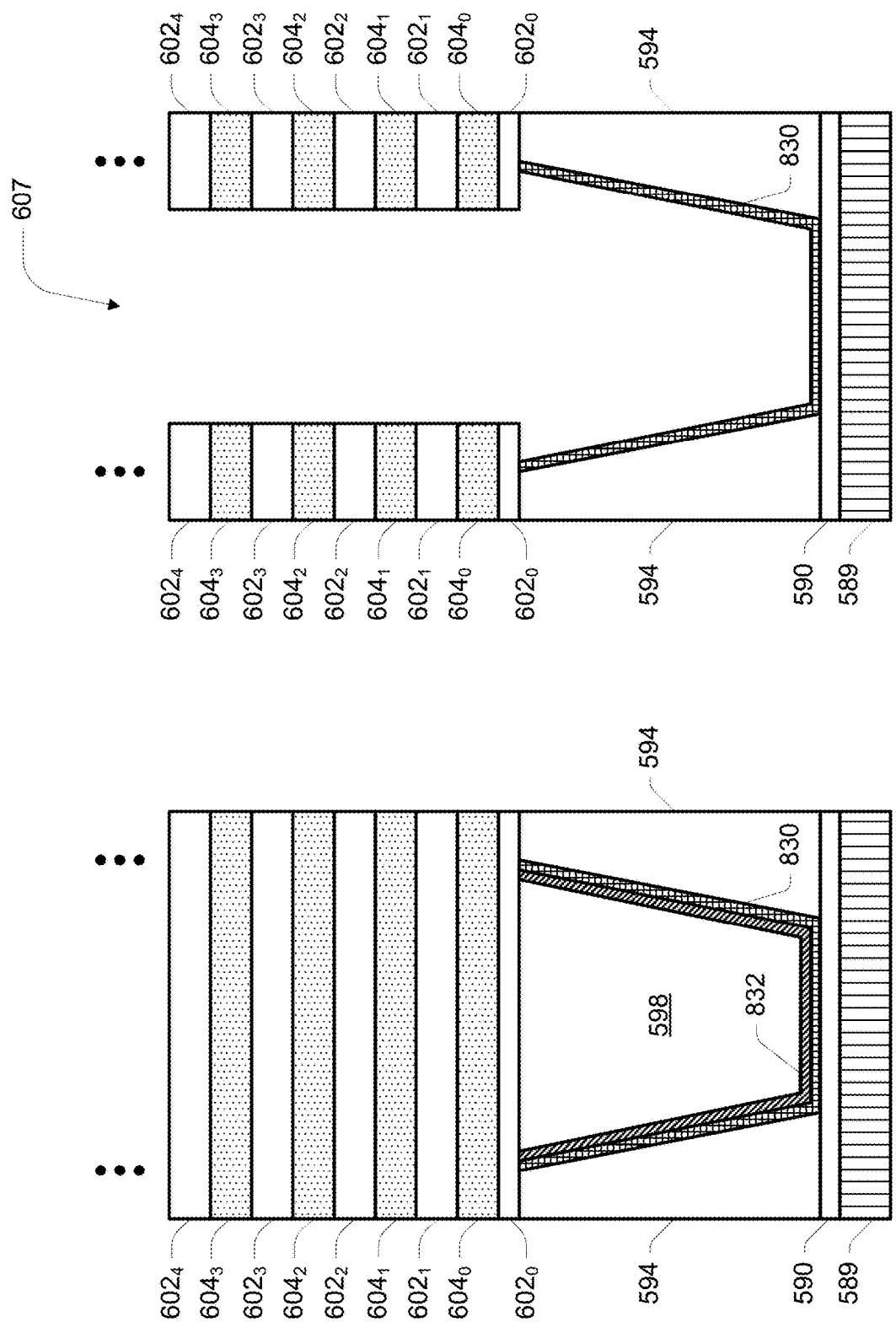
FIGS. 8A-8C depict an integrated circuit structure during various stages of fabrication in accordance with an embodiment.
Figure 8C:
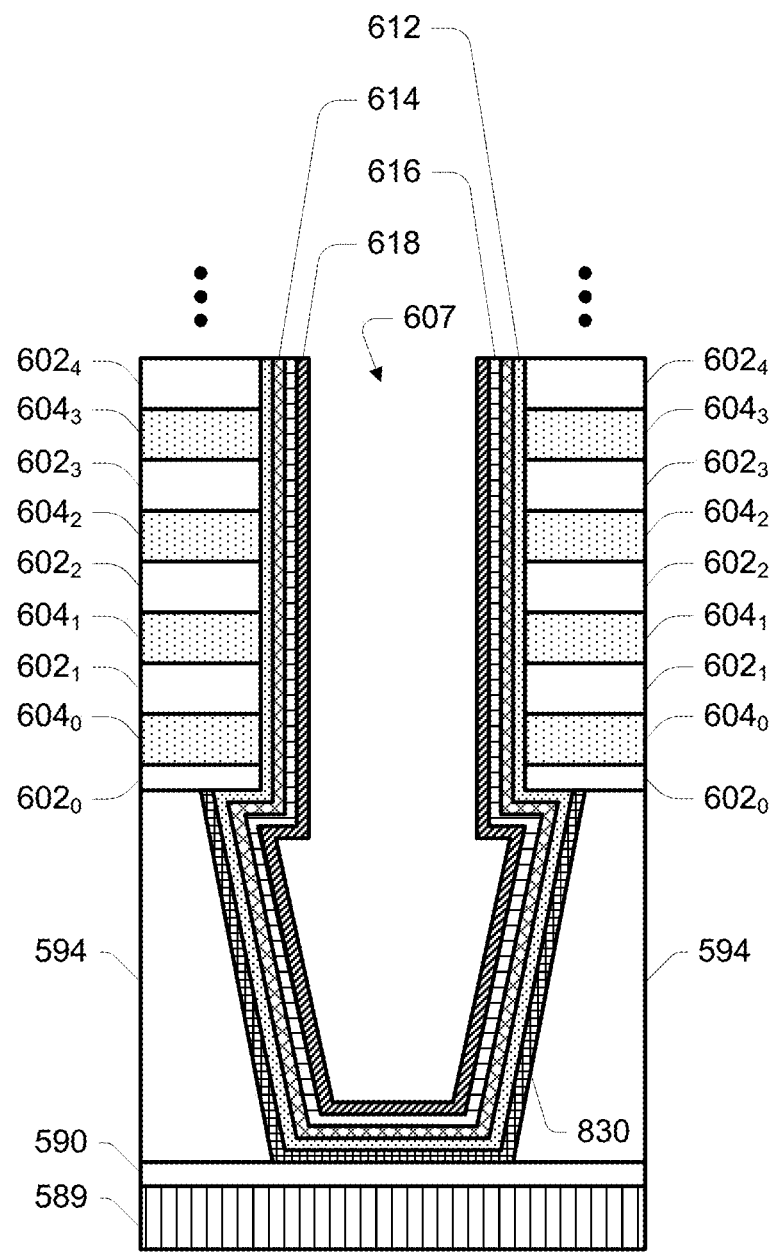

FIGS. 8A-8C depict an integrated circuit structure during various stages of fabrication in accordance with an embodiment. FIG. 8A might depict a structure similar to that shown in FIG. 6A, and might be formed in a similar manner. However, a conductively-doped polysilicon 830, and an optional barrier layer 832 might be formed between the dielectric 590 and the plug 598. For example, the conductively-doped polysilicon 830 might be formed to line the voids 596 in FIG. 5L, and then the plug 598 might be formed to fill a remaining portion of a void 596. Optionally, the barrier layer 832 might be formed between the conductively-doped polysilicon and the plug 598. In FIG. 8B, the void 607 might be formed in a manner similar to that described with reference to FIGS. 6B and 6C, including removal of the plug 598 and the barrier layer 832. The channel material structure might then be formed as described with reference to FIG. 6C, including the charge-blocking material 612, charge-storage material 614, dielectric 616, and channel material 618. In this embodiment, the first control gate 240 of a pass gate 238 might be a discrete conductive element (e.g., conductively-doped polysilicon 830) between the electrode of a capacitance 226 (e.g., a channel of a field-effect transistor or channel material 618) and a channel (e.g., semiconductor 589) of that pass gate 238.

Although the example of FIGS. 8A-8C utilizes conductively-doped polysilicon, other conductive materials could also be utilized, such as conductive materials described with reference to the conductor 562. In addition, although the example of FIGS. 8A-8C depicts an embodiment utilizing two discrete channels of a pass gate 238, e.g., forming a separate semiconductor 589, such structures could also be used in embodiments utilizing a single channel. Furthermore, although the conductively-doped polysilicon 830 was formed to be below, and adjacent sidewalls of, the channel material 618, it might be formed without extending to a point adjacent the sidewalls of the channel material 618.

Figures 9A, 9B:
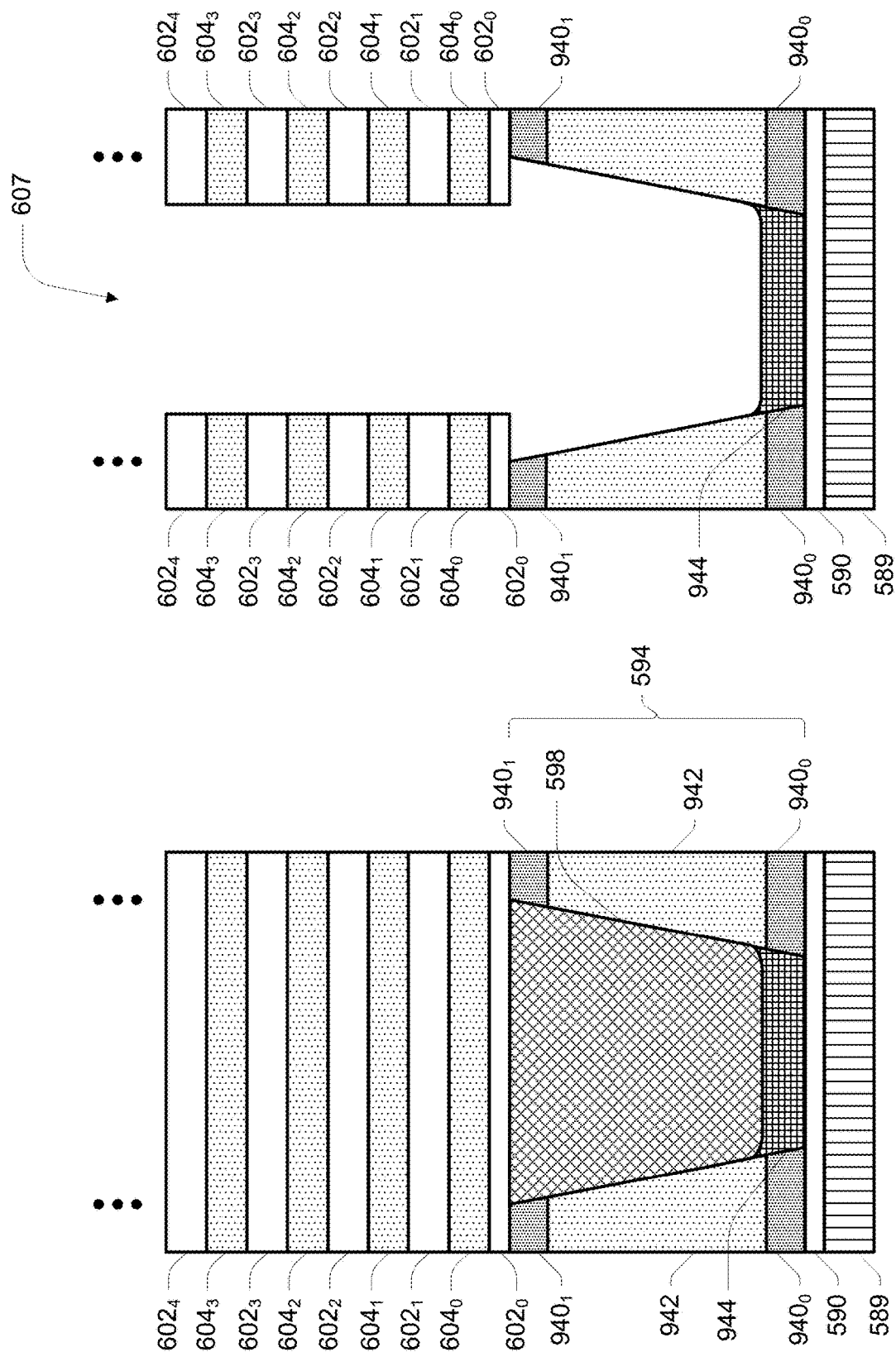

FIGS. 9A-9E depict an integrated circuit structure during various stages of fabrication in accordance with another embodiment. FIG. 9A might depict a structure similar to that shown in FIG. 6A, and might be formed in a similar manner. However, the dielectric 594 might be formed as a first dielectric $940_0$, a second dielectric 942, and a third dielectric $940_1$. The dielectrics $940_0$ and $940_1$ might be a same dielectric material, while the dielectric 942 might be a different dielectric material. For example, the dielectrics $940_0$ and $940_1$ might contain silicon carbon nitride (SiCN), while the dielectric 942 might contain silicon dioxide. In addition, a conductively-doped polysilicon 944 might be formed between the dielectric 590 and the plug 598. For example, the conductively-doped polysilicon 944 might be formed to fill a bottom of a void 596 in FIG. 5L, and then the plug 598 might be formed to fill a remaining portion of the void 596. Optionally, a barrier layer (not shown) might be formed between the conductively-doped polysilicon 944 and the plug 598. In FIG. 9B, the void 607 might be formed in a manner similar to that described with reference to FIGS. 6B and 6C, including removal of the plug 598 and any barrier layer.

Figure 9E:
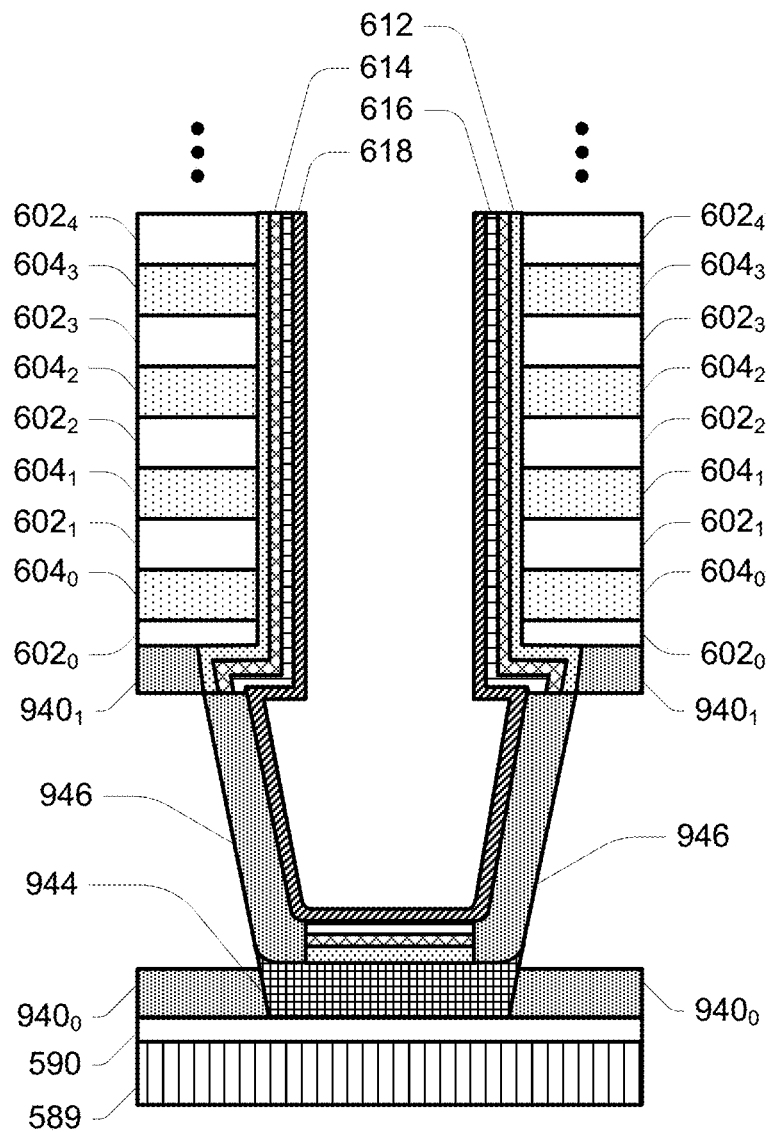

In FIG. 9C, the channel material structure might then be formed as described with reference to FIG. 6C, including the charge-blocking material 612, charge-storage material 614, dielectric 616, and channel material 618. In FIG. 9D, the dielectric 942 might be removed, along with exposed portions of the charge-blocking material 612, charge-storage material 614, and dielectric 616 sufficient to remove the thickness of these materials, e.g., which might leave a recessed portion between the channel material 618 and the conductively-doped polysilicon 944. For example, an isotropic etch process could be used with a chemistry selective to the materials for removal over materials of the channel material 618, conductively-doped polysilicon 944 and the dielectrics $940_0$ and $940_1$. In FIG. 9E, a conductively-doped polysilicon 946 might be selectively grown on exposed surfaces of the channel material 618 and the conductively-doped polysilicon 944 to bridge the gap, and form an electrical connection, between the channel material 618 and the conductively-doped polysilicon 944. In this embodiment, the first control gate 240 of a pass gate 238 might be a discrete conductive element (e.g., conductively-doped polysilicon 944 and 946) between the electrode of a capacitance 226 (e.g., a channel of a field-effect transistor or channel material 618) and a channel (e.g., semiconductor 589) of that pass gate 238. In this manner, the channel material 618 might be electrically connected to the first gate 240 of a pass gate 238 rather than be capacitively coupled to the first gate 240.

Although the example of FIGS. 9A-9E depicts an embodiment utilizing two discrete channels of a pass gate 238, e.g., forming a separate semiconductor 589, such structures could also be used in embodiments utilizing a single channel. In addition, although the conductively-doped polysilicon 946 was formed to be below, and adjacent sidewalls of, the channel material 618, it might be formed without extending to a point adjacent the sidewalls of the channel material 618. For example, forming the dielectric $940_1$ to be thicker could restrict formation of the conductively-doped polysilicon 946 to be solely below the channel material 618.

Figure 10A:
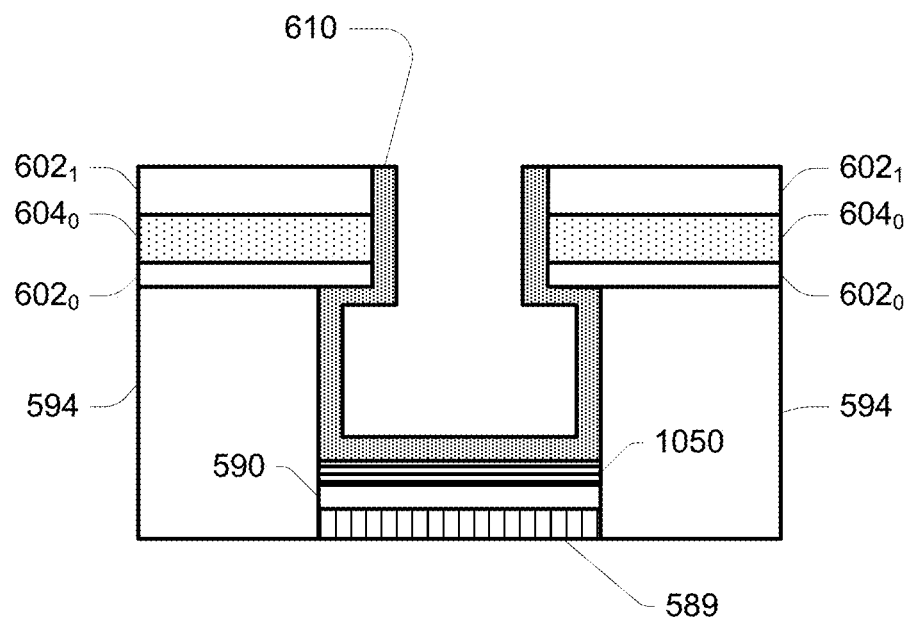
FIGS. 10A-10B depict integrated circuit structures in accordance with further embodiments.
Figure 10B:
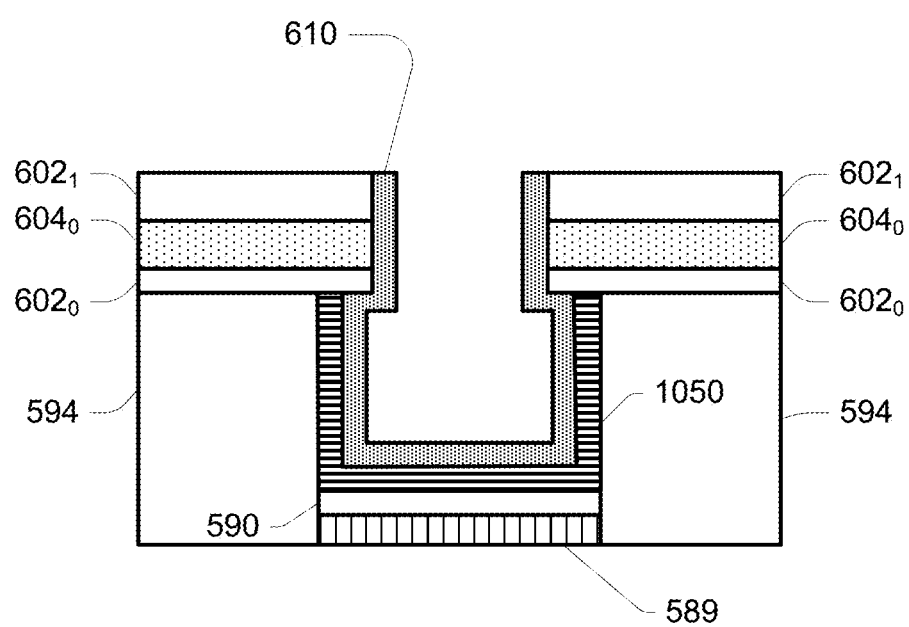

FIGS. 10A and 10B depict an integrated circuit structures at a particular stage of fabrication in accordance with further embodiments. The embodiment of FIG. 10A might depict a structure similar to that shown in FIG. 6C, and might be formed in a similar manner. However, a high-K dielectric 1050 might be formed between the semiconductor 589 and the plug 598. For example, the high-K dielectric 1050 might be formed to line a lower portion (e.g., a bottom) of a void 596 in FIG. 5L, and then the plug 598 might be formed to fill a remaining portion of that void 596. For some embodiments, the dielectric 590 might be omitted, with the high-K dielectric 1050 serving as the gate dielectric of the first control gate 240 of a pass gate 238. The void 607 might be formed in a manner similar to that described with reference to FIGS. 6B and 6C, including removal of the plug 598. And the channel material structure 610 might then be formed as described with reference to FIG. 6C.

The embodiment of FIG. 10B might also depict a structure similar to that shown in FIG. 6C, and might be formed in a similar manner. However, a high-K dielectric 1050 might be formed between the semiconductor 589 and the plug 598. For example, the high-K dielectric 1050 might be formed to line a void 596 in FIG. 5L e.g., the bottom and sidewalls of the void 596, and then the plug 598 might be formed to fill a remaining portion of that void 596. For some embodiments, the dielectric 590 might be omitted, with the high-K dielectric 1050 serving as the gate dielectric of the first control gate 240 of a pass gate 238. For other embodiments, the dielectric 590 might be de minimis, e.g., on the order of 1 nm in thickness. The void 607 might be formed in a manner similar to that described with reference to FIGS. 6B and 6C, including removal of the plug 598. And the channel material structure 610 might then be formed as described with reference to FIG. 6C. Use of a high-K dielectric in the embodiments of FIGS. 10A and 10B might facilitate suppression of electron back-tunneling from the sense line 258. Although the examples of FIGS. 10A-10B depict embodiments utilizing two discrete channels of a pass gate 238, e.g., forming a separate semiconductor 589, such structures could also be used in embodiments utilizing a single channel.

Erasing memory cells in the unit column structures of embodiments might proceed similar to a typical string of series-connected memory cells. In a typical erase operation, an erase voltage level might be applied to both ends of the string while the select gates and GG gates are operated to induce GIDL current into the string. However, as one end of a unit column structure is floating, inducing GIDL current from both ends is not practicable. As such, in accordance with embodiments, an erase voltage level might be applied to the upper data line 204, while the GG gates 220 and upper select gates 212 are operated to induce GIDL current into the unit column structures. For example, the GG gates 220 might receive a voltage level on control line 224, e.g., 11V less than the erase voltage level, while the upper select gates 212 might receive a voltage level on select line 215, e.g., 4V less than the erase voltage level. The access lines 202 might receive a nominal voltage level configured to remove charge from the charge storage nodes, e.g., 0.5V. For some embodiments, the lower select gates 210 and the capacitances 226 might receive a control gate voltage level configured to inhibit erasure, e.g., 4V less than the erase voltage level.

Figure 11:
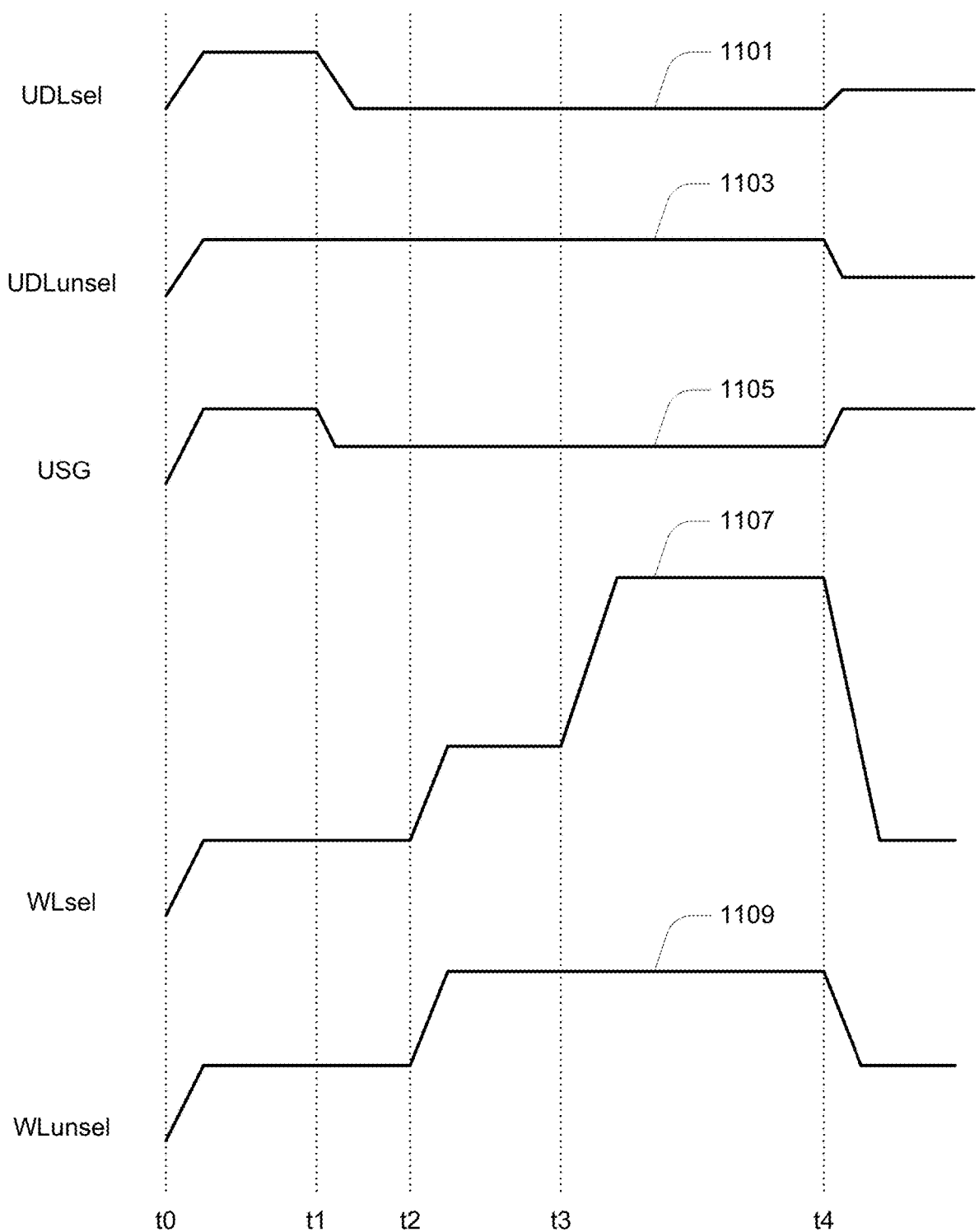
FIG. 11 is a timing diagram of a method of operating a memory in accordance with an embodiment.

FIG. 11 is a timing diagram of a method of operating a memory in accordance with an embodiment. For example, FIG. 11 might represent a method of programming one or more memory cells, e.g., a logical page of memory cells. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

The trace 1101 might depict voltage levels of an upper data line 204, e.g., a selected upper data line 204, selectively connected to a memory cell selected for programming during the programming operation, e.g., a selected memory cell to be enabled for programming. The trace 1103 might depict voltage levels of an upper data line 204, e.g., an unselected upper data line 204, selectively connected to a memory cell not selected for programming during the programming operation, e.g., an unselected memory cell to be inhibited from programming. The trace 1105 might depict voltage levels of a select line 215. The trace 1107 might depict voltage levels of an access line 202 connected to a selected memory cell, and the trace 1109 might depict voltage levels of an access line 202 connected to an unselected memory cell.

At time t0, in an optional seeding phase of the programming operation, traces 1101, e.g., selected upper data lines, and 1103, e.g., unselected upper data lines, might be increased from an initial voltage level, e.g., a ground potential or 0V, to an inhibit voltage level, e.g., 2.3V. Trace 1105 might be increased from an initial voltage level, e.g., a ground potential or 0V, to a voltage level sufficient to activate the upper select gates, e.g., 4V. Although not depicted, control line 224 might also receive a voltage level sufficient to activate the GG gates. Trace 1107, e.g., the selected access line, and trace 1109, e.g., unselected access lines, might be increased from an initial voltage level, e.g., a ground potential or 0V, to an intermediate voltage level between a pass voltage level of the programming operation and the initial voltage level. For example, traces 1107 and 1109 might be increased to 4V.

At time t1, in an optional setup phase of the programming operation, trace 1101 might be returned to its initial voltage level. For some embodiments, trace 1101 might be decreased to some intermediate voltage level between the inhibit voltage level and its initial voltage level. The use of different voltages levels on upper data lines to be enabled for programming might occur in programming schemes known as selective slow programming convergence (SSPC), where memory cells nearer to their respective intended data states are programmed more slowly (e.g., partially enabled for programming) compared to memory cells farther from their respective intended data states (e.g., fully enabled for programming) while receiving a same voltage level at their respective control gates. Different target data states might utilize different intermediate voltage levels. Trace 1105 might be decreased to some voltage level configured to activate upper select gates selectively connected to selected upper data lines, and configured to deactivate upper select gates selectively connected to unselected upper data lines. Remaining traces 1103, 1107 and 1109 might remain at their present voltage levels.

At time t2, traces 1107 and 1109 might be increased to the pass voltage level of the programming operation. The pass voltage level is some voltage level higher than the expected threshold voltage level of each memory cell connected to the selected and unselected access lines, e.g., configured to activate each memory cell regardless of its data state. For example, traces 1107 and 1109 might be increased to 9V. At time t3, trace 1107 might be increased to a programming voltage level, e.g., 15V or higher. The application of the programming voltage level from time t3 to time t4 might be referred to as a programming pulse.

At time t4, the programming operation might be complete, and voltage levels might be brought to respective recovery levels. For example, traces 1101 and 1103 might each be transitioned to 0.5V, and traces 1105, 1107 and 1109 might each be transitioned to 4V. During the programming operation, control gate voltage levels to compensation gates, lower select gates and capacitances might remain at an initial voltage level, e.g., a ground potential or 0V.

A verify operation might be performed after each programming pulse to determine whether any memory cells have reached their respective intended data states, and/or their respective intermediate data states in the case of SSPC programming. Any memory cells failing to reach their respective intended data states might be enabled for a subsequent programming pulse of a higher programming voltage level. In the case of SSPC programming, memory cells not reaching their respective intermediate data states might be fully enabled for programming during the subsequent memory pulse, and memory cells reaching their respective intermediate data states, but not reaching their respective intended data states, might be partially enabled for programming during the subsequent memory pulse.

Figure 12:
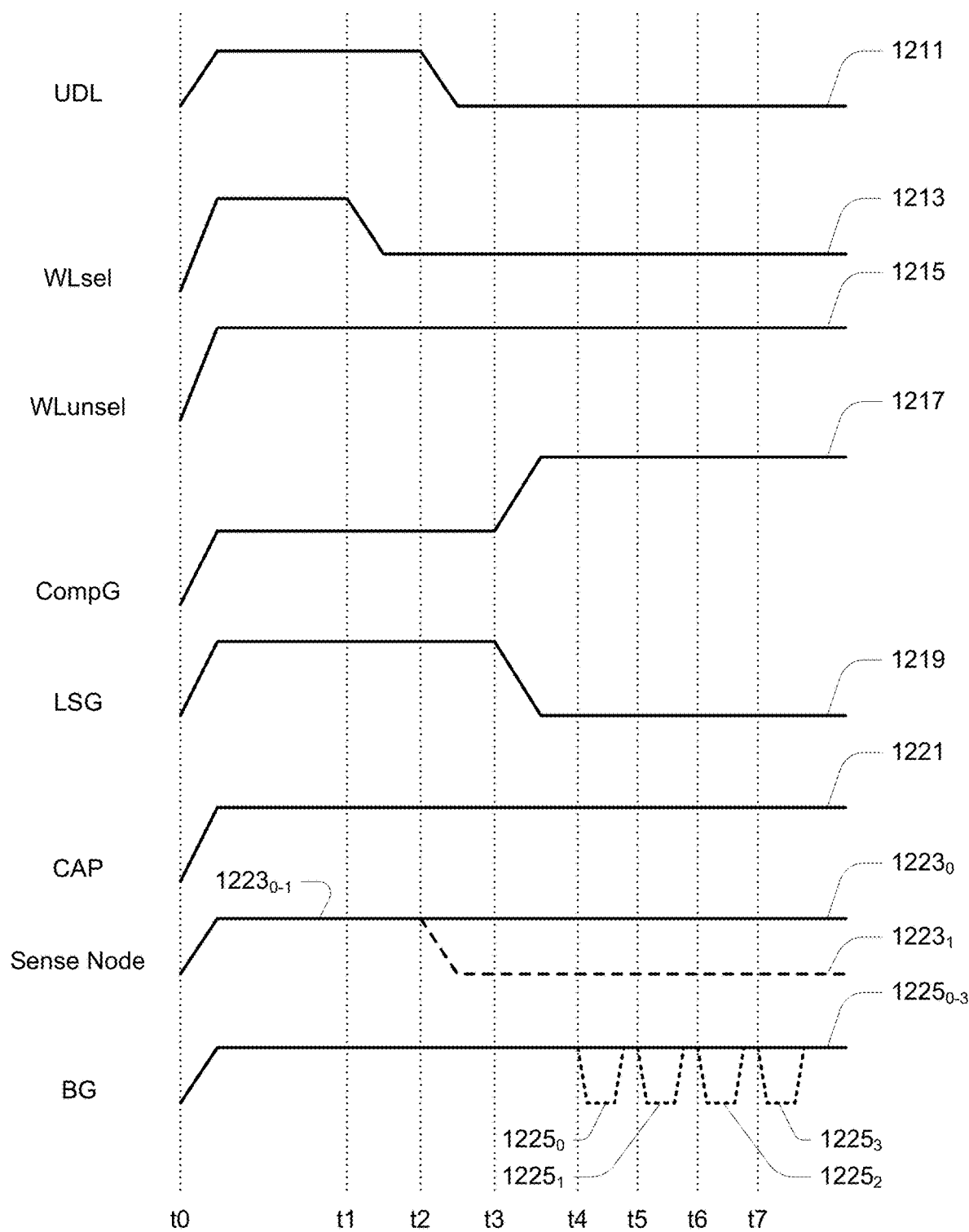
FIG. 12 is a timing diagram of a method of operating a memory in accordance with a different embodiment.

FIG. 12 is a timing diagram of a method of operating a memory in accordance with an embodiment. For example, FIG. 12 might represent a method of sensing, e.g., reading or verifying, one or more memory cells, e.g., a logical page of memory cells. The method might be in the form of computer-readable instructions, e.g., stored to the instruction registers 128. Such computer-readable instructions might be executed by a controller, e.g., the control logic 116, to cause the memory (e.g., relevant components of the memory) to perform the method. FIG. 12 will refer specifically to elements of FIG. 2B, but it is to be understood that this description can be used with other memory array structures disclosed herein.

The trace 1211 might depict voltage levels of an upper data line 204, e.g., an upper data line 204 selectively connected to a memory cell selected for sensing during a sense operation, e.g., a selected memory cell. For example, the trace 1211 might correspond to upper data lines $204_0$-$204_3$. The trace 1213 might depict voltage levels of an access line 202, e.g., a selected access line 202, connected to a selected memory cell, and the trace 1215 might depict voltage levels of an access line 202, e.g., an unselected access line 202, not connected to a selected memory cell. For example, if the memory cells 208 selected for the sense operation are connected to the access line $202_1$, trace 1213 might correspond to access line $202_1$, and trace 1215 might correspond to access lines $202_0$-$202_N$ other than access line $202_1$. The trace 1217 might depict voltage levels of a control line 213 connected to compensation gates 211. The trace 1219 might depict voltage levels of lower select lines 214 connected to lower select gates 210. The trace 1221 might depict voltage levels on control lines 228 connected to capacitances 226.

The traces $1223_0$ and $1223_1$ might depict voltage levels of the channels of the capacitances 226, e.g., a sense node, capacitively coupled to, or connected to, a first control gate 240 of a pass gate 238 for a unit column structure 256 whose selected memory cell is deactivated in response to a read voltage level, and for a unit column structure 256 whose selected memory cell is activated in response to a read voltage level, respectively. The traces $1225_0$ to $1225_3$ might depict voltage levels of backside gate lines 244, e.g., backside gate lines $244_0$ to $244_3$ of the sub-block of memory cells $262_0$ when the selected memory cells are contained in the unit column structures $256_0$ to $256_3$.

At time t0, trace 1211 might be increased from an initial voltage level, e.g., a ground potential or 0V, to a precharge voltage level. The precharge voltage level might be some voltage level configured to activate a first control gate 240 of a pass gate 238, e.g., for an enhancement type device, or deactivate a first control gate 240 of a pass gate 238, e.g., for a depletion type device. For example, the precharge voltage level might be 4V. The traces 1213 and 1215 might be increased from an initial voltage level, e.g., a ground potential or 0V, to a pass voltage level of the sense operation. The pass voltage level is some voltage level higher than the expected threshold voltage level of each memory cell connected to the selected and unselected access lines, e.g., configured to activate each memory cell regardless of its data state. For example, traces 1213 and 1215 might be increased to 9V.

At time t0, traces 1217, 1219 and 1221 might be increased from an initial voltage level, e.g., a ground potential or 0V, to some voltage levels configured to activate their corresponding compensation gates 211, lower select gates 210, and capacitances 226, respectively. Although not depicted, upper select lines 215 and control line 224 might also receive voltage levels configured to activate their upper select gates 212 and GG gates 220, respectively. Because these transistors are generally not programmed to the same threshold voltage levels as the memory cells, this voltage level might be lower, e.g., 2-3V.

With each transistor of a unit column structure 256 activated from capacitances 226 to GG gates 220, traces $1223_0$ and $1223_1$ might increase toward a voltage level of trace 1211 at time t0. At time t0, the traces $1225_0$ to $1225_3$ might be increased to a voltage level configured to activate a second select gate 242 of each corresponding pass gate 238. Although not depicted, voltage levels applied to the backside gate lines $244_4$ to $244_7$, and the dummy backside gate line 260, might also be configured to activate their corresponding pass gates 238.

At time t1, the trace 1213 might be decreased to a read voltage level for the sense operation. The read voltage level might be some voltage level configured to distinguish between adjacent data states. As such, depending upon the data state programmed to memory cells receiving the read voltage at its control gate, that memory cells may or may not remain activated.

At time t2, trace 1211 might be decreased from the precharge voltage level to some lower voltage level. The lower voltage level might be some voltage level configured to deactivate a first control gate 240 of a pass gate 238, e.g., for an enhancement type device, or activate a first control gate 240 of a pass gate 238, e.g., for a depletion type device. For example, the lower voltage level might be its initial voltage level. If the selected memory cell of a unit column structure 256 is deactivated at time t2, its sense node might be represented by the trace $1223_0$. If the selected memory cell of a unit column structure 256 is activated at time t2, its sense node might be represented by the trace $1223_1$.

At time t3, trace 1219 might be decreased to some voltage level configured to deactivate its corresponding lower select gates 210, e.g., its initial voltage level. This might serve to isolate, e.g., trap, the charge of its corresponding sense node from its corresponding upper data line. At this time, the trace 1217 might be increased such that the compensation gates 211 might absorb displacement charge from the lower select gates 210. Note that this discussion of trace 1217 might be moot for embodiments not utilizing compensation gates 211.

With the sense nodes trapping charge configured to either activate or deactivate the first control gates 240 of their respective pass gates 238, selective activation of the second control gates 242 of their respective pass gates 238 can be used to determine whether their respective selected memory cells were activated or deactivated at time t2, such that the respective data states of those memory cells might be determined. In particular, the second control gates 242 for each of the pass gates 238 could be deactivated sequentially while the second control gates 242 for remaining pass gates 238 remain activated. While the second control gate 242 for a particular pass gate 238 is deactivated and the second control gates 242 for remaining pass gates 238 are activated, an electrical connection of the lower data line 254 to the source 216 might be dependent only upon whether the first control gate 240 of the particular pass gate 238 is activated or not.

As such, at time t4, the trace $1225_0$ might be transitioned to a voltage level configured to deactivate the second control gate 242 of its corresponding pass gate 238 while traces $1225_1$ to $1225_3$ (and backside gate lines $244_4$ to $244_7$ and dummy backside gate line 260) might be maintained at a voltage level configured to activate the second control gates 242 of their respective pass gates 238. The presence or absence of an electrical path between the lower data line 254 and the common source 216 might then be detected in manners well understood, such as sensing a current flow through, or a voltage change of, the lower data line 254. This in turn can indicate whether the corresponding selected memory cell was activated or deactivated in response to the read voltage, which can thus indicate its data state in a manner similar to typical NAND memory. The trace $1225_0$ might then be returned to a voltage level configured to activate the second control gate 242 of is corresponding pass gate 238, and this process might be repeated for each remaining trace $1225_1$ to $1225_3$.

For example, the trace $1225_1$ might be transitioned to a voltage level configured to deactivate the second control gate 242 of its corresponding pass gate 238 at time t5, the trace $1225_2$ might be transitioned to a voltage level configured to deactivate the second control gate 242 of its corresponding pass gate 238 at time t6, and the trace $1225_3$ might be transitioned to a voltage level configured to deactivate the second control gate 242 of its corresponding pass gate 238 at time t7, while the remaining traces 1225 (and backside gate lines $244_4$ to $244_7$ and dummy backside gate line 260) might be maintained at a voltage level configured to activate the second control gates 242 of their respective pass gates 238 at times when they are not transitioned low.

Figure 13:
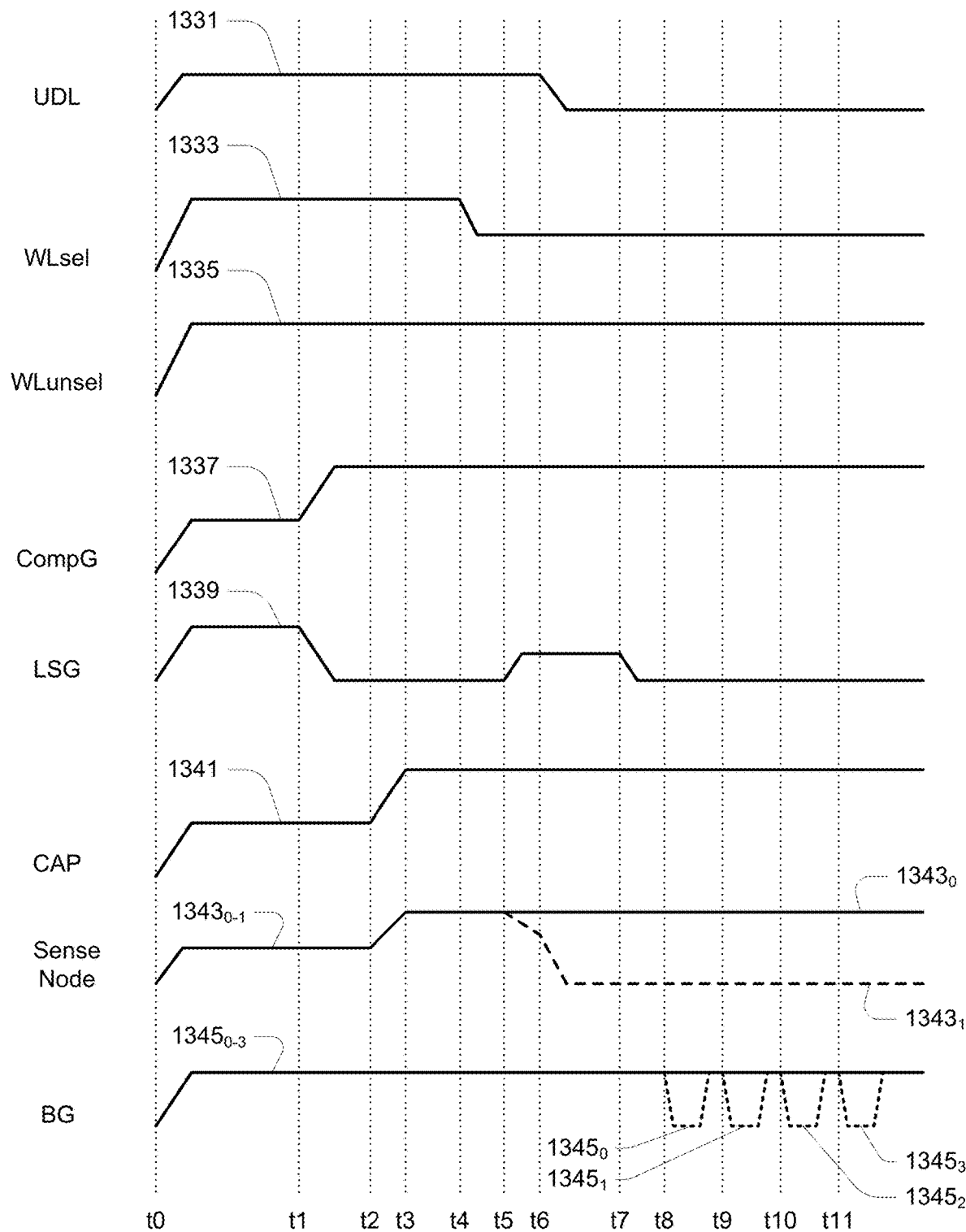
FIG. 13 is a timing diagram of a method of operating a memory in accordance with another embodiment.

FIG. 13 is a timing diagram of a method of operating a memory in accordance with another embodiment. For example, FIG. 13 might represent a method of sensing, e.g., reading or verifying, one or more memory cells, e.g., a logical page of memory cells. The method might be in the form of computer-readable instructions, e.g., stored to the instruction registers 128. Such computer-readable instructions might be executed by a controller, e.g., the control logic 116, to cause the memory (e.g., relevant components of the memory) to perform the method. FIG. 13 will refer specifically to elements of FIG. 2B, but it is to be understood that this description can be used with other memory array structures disclosed herein.

The trace 1331 might depict voltage levels of an upper data line 204, e.g., an upper data line 204 selectively connected to a memory cell selected for sensing during a sense operation, e.g., a selected memory cell. For example, the trace 1331 might correspond to upper data lines $204_0$-$204_3$. The trace 1333 might depict voltage levels of an access line 202, e.g., a selected access line 202, connected to a selected memory cell, and the trace 1335 might depict voltage levels of an access line 202, e.g., an unselected access line 202, not connected to a selected memory cell. For example, if the memory cells 208 selected for the sense operation are connected to the access line $202_1$, trace 1333 might correspond to access line $202_1$, and trace 1335 might correspond to access lines $202_0$-$202_N$ other than access line $202_1$. The trace 1337 might depict voltage levels of a control line 213 connected to compensation gates 211. The trace 1339 might depict voltage levels of lower select lines 214 connected to lower select gates 210. The trace 1341 might depict voltage levels on control lines 228 connected to capacitances 226.

The traces $1343_0$ and $1343_1$ might depict voltage levels of the channels of the capacitances 226, e.g., a sense node, capacitively coupled to, or connected to, a first control gate 240 of a pass gate 238 for a unit column structure 256 whose selected memory cell is deactivated in response to a read voltage level, and for a unit column structure 256 whose selected memory cell is activated in response to a read voltage level, respectively. The traces $1345_0$ to $1345_3$ might depict voltage levels of backside gate lines 244, e.g., backside gate lines $244_0$ to $244_3$ of the sub-block of memory cells $262_0$ when the selected memory cells are contained in the unit column structures $256_0$ to $256_3$.

At time t0, trace 1331 might be increased from an initial voltage level, e.g., a ground potential or 0V to some voltage level that might be selected to mitigate drain induced barrier lowering (DIBL) and to mitigate read disturb. For example, the trace 1331 might be increased to 1V. The traces $1343_0$ and $1343_1$ might increase due to the increase of the trace 1331. The traces 1333 and 1335 might be increased from an initial voltage level, e.g., 1V, to a pass voltage level of the sense operation. The pass voltage level is some voltage level higher than the expected threshold voltage level of each memory cell connected to the selected and unselected access lines, e.g., configured to activate each memory cell regardless of its data state. For example, traces 1333 and 1335 might be increased to 9V.

At time t0, traces 1337, 1339 and 1341 might be increased from an initial voltage level, e.g., a ground potential or 0V, to some voltage levels configured to activate their corresponding compensation gates 211, lower select gates 210, and capacitances 226, respectively. Although not depicted, upper select lines 215 and control line 224 might also receive voltage levels configured to activate their upper select gates 212 and GG gates 220, respectively. Because these transistors are generally not programmed to the same threshold voltage levels as the memory cells, this voltage level might be lower, e.g., 2-3V.

At time t1, the trace 1339 might be decreased to some voltage level configured to deactivate its corresponding lower select gates 210, e.g., its initial voltage level. This might serve to isolate the capacitances 226 from their corresponding upper data line 204. At this time, the trace 1337 might be increased. Note that this discussion of trace 1337 might be moot for embodiments not utilizing compensation gates 211.

At time t2, the control lines 228 might be biased to boost the channels of the capacitances 226 such the traces $1343_0$ and $1343_1$ might further increase. The increase in voltage level of trace 1341 might be sufficient to boost the traces $1343_0$ and $1343_1$ to some precharge voltage level configured to activate a first control gate 240 of a pass gate 238, e.g., for an enhancement type device, or deactivate a first control gate 240 of a pass gate 238, e.g., for a depletion type device. For example, the precharge voltage level might be 4V.

At time t4, the trace 1333 might be decreased to a read voltage level for the sense operation. The read voltage level might be some voltage level configured to distinguish between adjacent data states. As such, depending upon the data state programmed to memory cells receiving the read voltage at its control gate, that memory cells may or may not remain activated.

At time t5, the trace 1339 might be increased to a voltage level sufficient to activate the corresponding lower select gates 210. The voltage level of trace 1339 between times t5 and t6 might be selected to limit a voltage level of the channel of a selected memory cell to a value near the voltage level of the trace 1331 at time t5. If the selected memory cell of a unit column structure 256 is deactivated at time t5, its sense node might be represented by the trace $1343_0$. If the selected memory cell of a unit column structure 256 is activated at time t5, its sense node might be represented by the trace $1343_1$.

At time t6, the trace 1331 might be decreased to some lower voltage level. The lower voltage level might be some voltage level configured to deactivate a first control gate 240 of a pass gate 238, e.g., for an enhancement type device, or activate a first control gate 240 of a pass gate 238, e.g., for a depletion type device. For example, the lower voltage level might be its initial voltage level. This might result in a further decrease in the voltage level of the trace $1343_1$.

At time t7, the trace 1339 might be decreased to some voltage level configured to deactivate its corresponding lower select gates 210, e.g., its initial voltage level. This might serve to isolate, e.g., trap, the charge of its corresponding sense node from its corresponding upper data line.

With the sense nodes trapping charge configured to either activate or deactivate the first control gates 240 of their respective pass gates 238, selective activation of the second control gates 242 of their respective pass gates 238 can be used to determine whether their respective selected memory cells were activated or deactivated at time t6, such that the respective data states of those memory cells might be determined.

As such, at time t8, the trace $1345_0$ might be transitioned to a voltage level configured to deactivate the second control gate 242 of its corresponding pass gate 238 while traces $1345_1$ to $1345_3$ (and backside gate lines $244_4$ to $244_7$ and dummy backside gate line 260) might be maintained at a voltage level configured to activate the second control gates 242 of their respective pass gates 238. The presence or absence of an electrical path between the lower data line 254 and the common source 216 might then be detected in manners well understood, such as sensing a current flow through, or a voltage change of, the lower data line 254. This in turn can indicate whether the corresponding selected memory cell was activated or deactivated in response to the read voltage, which can thus indicate its data state in a manner similar to typical NAND memory. The trace $1345_0$ might then be returned to a voltage level configured to activate the second control gate 242 of is corresponding pass gate 238, and this process might be repeated for each remaining trace $1345_1$ to $1345_3$.

For example, the trace $1345_1$ might be transitioned to a voltage level configured to deactivate the second control gate 242 of its corresponding pass gate 238 at time t9, the trace $1345_2$ might be transitioned to a voltage level configured to deactivate the second control gate 242 of its corresponding pass gate 238 at time t10, and the trace $1345_3$ might be transitioned to a voltage level configured to deactivate the second control gate 242 of its corresponding pass gate 238 at time t11, while the remaining traces 1345 (and backside gate lines $244_4$ to $244_7$ and dummy backside gate line 260) might be maintained at a voltage level configured to activate the second control gates 242 of their respective pass gates 238 at times when they are not transitioned low.

Figure 14:
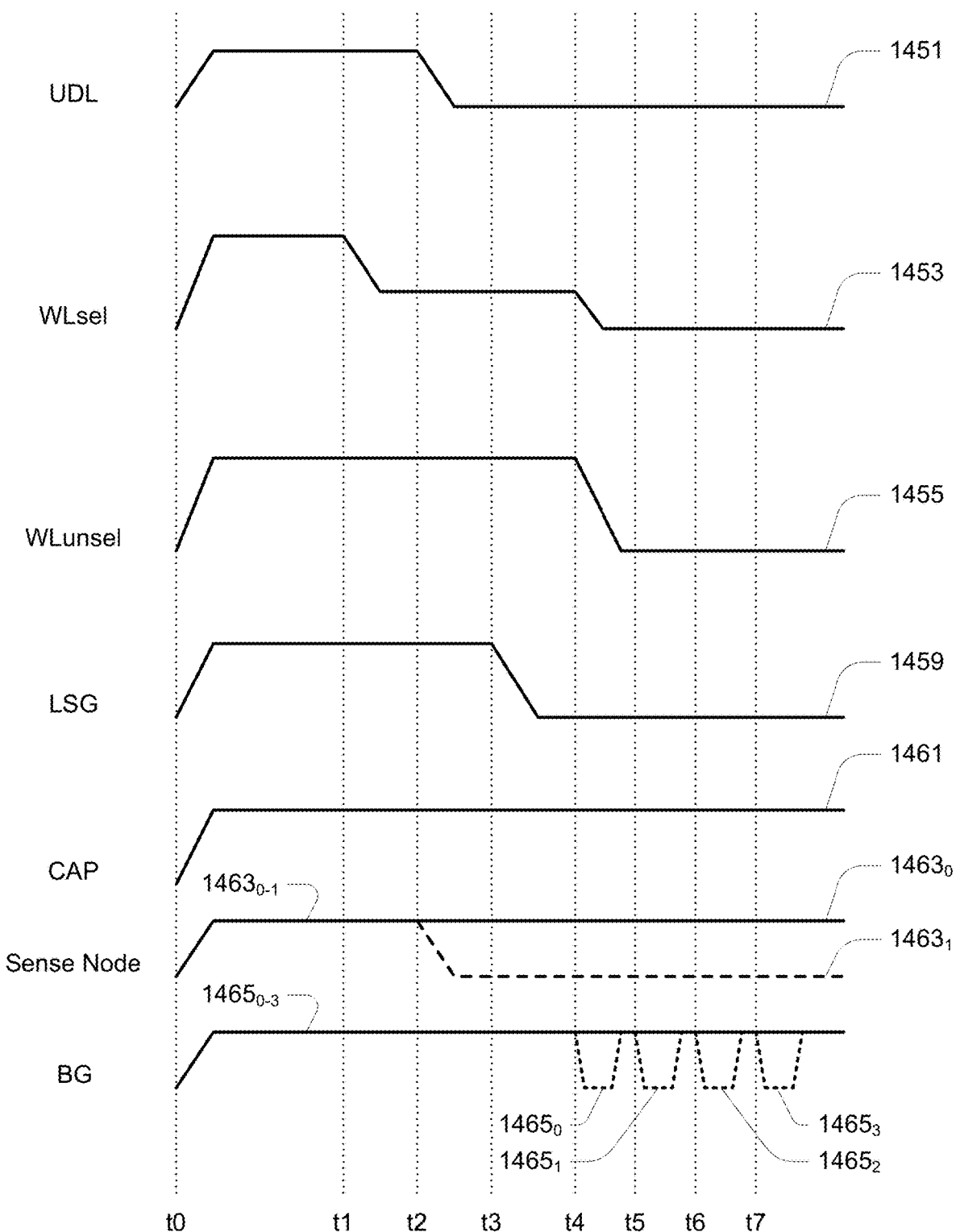
FIG. 14 is a timing diagram of a method of operating a memory in accordance with a further embodiment.

FIG. 14 is a timing diagram of a method of operating a memory in accordance with a further embodiment. For example, FIG. 14 might represent a method of sensing, e.g., reading or verifying, one or more memory cells, e.g., a logical page of memory cells. The method might be in the form of computer-readable instructions, e.g., stored to the instruction registers 128. Such computer-readable instructions might be executed by a controller, e.g., the control logic 116, to cause the memory (e.g., relevant components of the memory) to perform the method. FIG. 14 will refer specifically to elements of FIG. 2B, but it is to be understood that this description can be used with other memory array structures disclosed herein.

The trace 1451 might depict voltage levels of an upper data line 204, e.g., an upper data line 204 selectively connected to a memory cell selected for sensing during a sense operation, e.g., a selected memory cell. For example, the trace 1451 might correspond to upper data lines $204_0$-$204_3$. The trace 1453 might depict voltage levels of an access line 202, e.g., a selected access line 202, connected to a selected memory cell, and the trace 1455 might depict voltage levels of an access line 202, e.g., an unselected access line 202, not connected to a selected memory cell. For example, if the memory cells 208 selected for the sense operation are connected to the access line $202_1$, trace 1453 might correspond to access line $202_1$, and trace 1455 might correspond to access lines $202_0$-$202_N$ other than access line $202_1$. The trace 1459 might depict voltage levels of lower select lines 214 connected to lower select gates 210. The trace 1461 might depict voltage levels on control lines 228 connected to capacitances 226.

The traces $1463_0$ and $1463_1$ might depict voltage levels of the channels of the capacitances 226, e.g., a sense node, capacitively coupled to, or connected to, a first control gate 240 of a pass gate 238 for a unit column structure 256 whose selected memory cell is deactivated in response to a read voltage level, and for a unit column structure 256 whose selected memory cell is activated in response to a read voltage level, respectively. The traces $1465_0$ to $1465_3$ might depict voltage levels of backside gate lines 244, e.g., backside gate lines $244_0$ to $244_3$ of the sub-block of memory cells $262_0$ when the selected memory cells are contained in the unit column structures $256_0$ to $256_3$.

At time t0, trace 1451 might be increased from an initial voltage level, e.g., a ground potential or 0V, to a precharge voltage level. The precharge voltage level might be some voltage level configured to activate a first control gate 240 of a pass gate 238, e.g., for an enhancement type device, or deactivate a first control gate 240 of a pass gate 238, e.g., for a depletion type device. For example, the precharge voltage level might be 4V. The traces 1453 and 1455 might be increased from an initial voltage level, e.g., a ground potential or 0V, to a pass voltage level of the sense operation. The pass voltage level is some voltage level higher than the expected threshold voltage level of each memory cell connected to the selected and unselected access lines, e.g., configured to activate each memory cell regardless of its data state. For example, traces 1453 and 1455 might be increased to 9V.

At time t0, traces 1459 and 1461 might be increased from an initial voltage level, e.g., a ground potential or 0V, to some voltage levels configured to activate their corresponding lower select gates 210 and capacitances 226, respectively. Although not depicted, upper select lines 215 and control line 224 might also receive voltage levels configured to activate their upper select gates 212 and GG gates 220, respectively. Because these transistors are generally not programmed to the same threshold voltage levels as the memory cells, this voltage level might be lower, e.g., 2-3V.

With each transistor of a unit column structure 256 activated from capacitances 226 to GG gates 220, traces $1463_0$ and $1463_1$ might increase toward a voltage level of trace 1451 at time t0. At time t0, the traces $1465_0$ to $1465_3$ might be increased to a voltage level configured to activate a second select gate 242 of each corresponding pass gate 238. Although not depicted, voltage levels applied to the backside gate lines $244_4$ to $244_7$, and the dummy backside gate line 260, might also be configured to activate their corresponding pass gates 238.

At time t1, the trace 1453 might be decreased to a read voltage level for the sense operation. The read voltage level might be some voltage level configured to distinguish between adjacent data states. As such, depending upon the data state programmed to memory cells receiving the read voltage at its control gate, that memory cells may or may not remain activated.

At time t2, trace 1451 might be decreased from the precharge voltage level to some lower voltage level. The lower voltage level might be some voltage level configured to deactivate a first control gate 240 of a pass gate 238, e.g., for an enhancement type device, or activate a first control gate 240 of a pass gate 238, e.g., for a depletion type device. For example, the lower voltage level might be its initial voltage level. If the selected memory cell of a unit column structure 256 is deactivated at time t2, its sense node might be represented by the trace $1463_0$. If the selected memory cell of a unit column structure 256 is activated at time t2, its sense node might be represented by the trace $1463_1$.

At time t3, trace 1459 might be decreased to some voltage level configured to deactivate its corresponding lower select gates 210, e.g., its initial voltage level. This might serve to isolate, e.g., trap, the charge of its corresponding sense node from its corresponding upper data line. With the sense nodes isolated from their corresponding upper data lines, the traces 1453 and 1455 optionally might be discharged at time t4, e.g., to their initial voltage levels/

With the sense nodes trapping charge configured to either activate or deactivate the first control gates 240 of their respective pass gates 238, selective activation of the second control gates 242 of their respective pass gates 238 can be used to determine whether their respective selected memory cells were activated or deactivated at time t2, such that the respective data states of those memory cells might be determined.

As such, at time t4, the trace $1465_0$ might be transitioned to a voltage level configured to deactivate the second control gate 242 of its corresponding pass gate 238 while traces $1465_1$ to $1465_3$ (and backside gate lines $244_4$ to $244_7$ and dummy backside gate line 260) might be maintained at a voltage level configured to activate the second control gates 242 of their respective pass gates 238. The presence or absence of an electrical path between the lower data line 254 and the common source 216 might then be detected in manners well understood, such as sensing a current flow through, or a voltage change of, the lower data line 254. This in turn can indicate whether the corresponding selected memory cell was activated or deactivated in response to the read voltage, which can thus indicate its data state in a manner similar to typical NAND memory. The trace $1465_0$ might then be returned to a voltage level configured to activate the second control gate 242 of is corresponding pass gate 238, and this process might be repeated for each remaining trace $1465_1$ to $1465_3$.

For example, the trace $1465_1$ might be transitioned to a voltage level configured to deactivate the second control gate 242 of its corresponding pass gate 238 at time t5, the trace $1465_2$ might be transitioned to a voltage level configured to deactivate the second control gate 242 of its corresponding pass gate 238 at time t6, and the trace $1465_3$ might be transitioned to a voltage level configured to deactivate the second control gate 242 of its corresponding pass gate 238 at time t7, while the remaining traces 1465 (and backside gate lines $244_4$ to $244_7$ and dummy backside gate line 260) might be maintained at a voltage level configured to activate the second control gates 242 of their respective pass gates 238 at times when they are not transitioned low.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. An array of memory cells, comprising:
   a first upper data line;
   a second upper data line;
   a lower data line;
   a first pass gate selectively connected to the lower data line;
   a second pass gate connected to the first pass gate and selectively connected to the lower data line;
   a third pass gate selectively connected to the lower data line;
   a fourth pass gate connected to the third pass gate and selectively connected to the lower data line;
   a first unit column structure comprising a respective plurality of series-connected non-volatile memory cells, wherein the first unit column structure is selectively connected to the first upper data line and capacitively coupled to a first channel of the first pass gate;
   a second unit column structure comprising a respective plurality of series-connected non-volatile memory cells, wherein the second unit column structure is selectively connected to the second upper data line and capacitively coupled to a first channel of the second pass gate;
   a third unit column structure comprising a respective plurality of series-connected non-volatile memory cells, wherein the third unit column structure is selectively connected to the first upper data line and capacitively coupled to a first channel of the third pass gate;
   a fourth unit column structure comprising a respective plurality of series-connected non-volatile memory cells, wherein the fourth unit column structure is selectively connected to the second upper data line and capacitively coupled to a first channel of the fourth pass gate;
   a first control line capacitively coupled to a second channel of the first pass gate;
   a second control line capacitively coupled to a second channel of the second pass gate;
   a third control line capacitively coupled to a second channel of the third pass gate; and
   a fourth control line capacitively coupled to a second channel of the fourth pass gate.

2. The array of memory cells of claim 1, wherein the lower data line is orthogonal to each of the first control line, the second control line, the third control line and the fourth control line.

3. The array of memory cells of claim 2, wherein a line connecting the first pass gate to the second pass gate is non-orthogonal to each of the first control line, the second control line, the third control line and the fourth control line, and wherein a line connecting the third pass gate to the fourth pass gate is non-orthogonal to each of the first control line, the second control line, the third control line and the fourth control line.

4. The array of memory cells of claim 1, wherein the second pass gate is connected to the fourth pass gate.

5. The array of memory cells of claim 1, wherein the second pass gate is selectively connected to the fourth pass gate.

6. The array of memory cells of claim 1, further comprising:
   a fifth pass gate;
   wherein the fifth pass gate is selectively connected to the lower data line, connected to the second pass gate, and connected to the fourth pass gate.

7. The array of memory cells of claim 6, further comprising:
   a fifth unit column structure comprising a respective plurality of series-connected non-volatile memory cells, wherein the fifth unit column structure is capacitively coupled to a first channel of the fifth pass gate, and electrically floating.

8. An array of memory cells, comprising:
   a first upper data line;
   a second upper data line;
   a third upper data line;
   a fourth upper data line;
   a first lower data line;
   a second lower data line;
   a first pass gate selectively connected to the first lower data line;
   a second pass gate connected to the first pass gate and selectively connected to the first lower data line;
   a third pass gate selectively connected to the second lower data line;
   a fourth pass gate connected to the third pass gate and selectively connected to the second lower data line;
   a first unit column structure comprising a respective plurality of series-connected non-volatile memory cells, wherein the first unit column structure is selectively connected to the first upper data line and capacitively coupled to a first channel of the first pass gate;
   a second unit column structure comprising a respective plurality of series-connected non-volatile memory cells, wherein the second unit column structure is selectively connected to the second upper data line and capacitively coupled to a first channel of the second pass gate;
   a third unit column structure comprising a respective plurality of series-connected non-volatile memory cells, wherein the third unit column structure is selectively connected to the third upper data line and capacitively coupled to a first channel of the third pass gate;
   a fourth unit column structure comprising a respective plurality of series-connected non-volatile memory cells, wherein the fourth unit column structure is selectively connected to the fourth upper data line and capacitively coupled to a first channel of the fourth pass gate;
   a first control line capacitively coupled to a second channel of the first pass gate and capacitively coupled to a second channel of the third pass gate; and
   a second control line capacitively coupled to a second channel of the second pass gate and capacitively coupled to a second channel of the fourth pass gate.

9. The array of memory cells of claim 8, wherein the first pass gate and the second pass gate form a portion of a first sense line, wherein the third pass gate and the fourth pass gate form a portion of a second sense line, and wherein the first sense line is parallel to the second sense line.

10. The array of memory cells of claim 9, wherein the first sense line is non-orthogonal to each of the first control line and the second control line.

11. The array of memory cells of claim 9, wherein a first end of the first sense line is selectively connected to the first lower data line and a second end of the first sense line is selectively connected to a source, wherein a first end of the second sense line is selectively connected to the second lower data line and a second end of the second sense line is selectively connected to the source.

12. The array of memory cells of claim 11, wherein the source is orthogonal to each of the first upper data line, the second upper data line, the third upper data line and the fourth upper data line.

13. The array of memory cells of claim 8, wherein each of the first lower data line and the second lower data line is orthogonal to each of the first control line and the second control line.

14. An array of memory cells, comprising:
a first upper data line;
a second upper data line;
a third upper data line;
a fourth upper data line;
a first lower data line;
a second lower data line;
a first pass gate selectively connected to the first lower data line;
a second pass gate connected to the first pass gate and selectively connected to the first lower data line;
a third pass gate selectively connected to the second lower data line;
a fourth pass gate connected to the third pass gate and selectively connected to the second lower data line;
a first unit column structure comprising a respective plurality of series-connected non-volatile memory cells, wherein the first unit column structure is selectively connected to the first upper data line and capacitively coupled to a first channel of the first pass gate;
a second unit column structure comprising a respective plurality of series-connected non-volatile memory cells, wherein the second unit column structure is selectively connected to the second upper data line and capacitively coupled to a first channel of the second pass gate;
a third unit column structure comprising a respective plurality of series-connected non-volatile memory cells, wherein the third unit column structure is selectively connected to the third upper data line and capacitively coupled to a first channel of the third pass gate;
a fourth unit column structure comprising a respective plurality of series-connected non-volatile memory cells, wherein the fourth unit column structure is selectively connected to the fourth upper data line and capacitively coupled to a first channel of the fourth pass gate;
a first control line capacitively coupled to a second channel of the first pass gate;
a second control line capacitively coupled to a second channel of the second pass gate;
a third control line capacitively coupled to a second channel of the third pass gate; and
a fourth control line capacitively coupled to a second channel of the fourth pass gate.

15. The array of memory cells of claim 14, wherein the first pass gate and the second pass gate form a portion of a first sense line, wherein the third pass gate and the fourth pass gate form a portion of a second sense line, and wherein the first sense line is parallel to the second sense line.

16. The array of memory cells of claim 15, wherein the first sense line is orthogonal to each of the first control line, the second control line, the third control line, and the fourth control line.

17. The array of memory cells of claim 16, wherein the first sense line is parallel to each of the first upper data line, the second upper data line, the third upper data line, and the fourth upper data line.

18. The array of memory cells of claim 17, wherein a first end of the first sense line is selectively connected to the first lower data line and a second end of the first sense line is selectively connected to a source, wherein a first end of the second sense line is selectively connected to the second lower data line and a second end of the second sense line is selectively connected to the source.

19. The array of memory cells of claim 18, wherein the source is orthogonal to each of the first upper data line, the second upper data line, the third upper data line and the fourth upper data line.

20. The array of memory cells of claim 15, wherein the third pass gate is adjacent a portion of the first sense line between the first pass gate and the second pass gate, and wherein the second pass gate is adjacent a portion of the second sense line between the third pass gate and the fourth pass gate.

* * * * *